US006488771B1

(12) United States Patent
Powell et al.

(10) Patent No.: US 6,488,771 B1
(45) Date of Patent: Dec. 3, 2002

(54) METHOD FOR GROWING LOW-DEFECT SINGLE CRYSTAL HETEROEPITAXIAL FILMS

(75) Inventors: J. Anthony Powell, North Olmsted, OH (US); Philip G. Neudeck, Olmsted Falls, OH (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 0 days.

(21) Appl. No.: 09/965,250

(22) Filed: Sep. 25, 2001

(51) Int. Cl.[7] .............................................. C30B 25/04
(52) U.S. Cl. .............................. 117/89; 117/84; 117/95; 438/478
(58) Field of Search ................................ 117/84, 89, 95; 438/478

(56) References Cited

U.S. PATENT DOCUMENTS

| | | | |
|---|---|---|---|
| 5,363,800 A | 11/1994 | Larkin et al. | 117/95 |
| 5,463,978 A | 11/1995 | Larkin et al. | 117/89 |
| 5,915,194 A | 6/1999 | Powell et al. | 438/478 |
| 6,165,874 A | 12/2000 | Powell et al. | 438/478 |

OTHER PUBLICATIONS

"Process–Induced Morphological Defects in Epitaxial CVD Silicon Carbide" by J.A. Powell and D.J. Larkin, published in Physica Status Solidi (b), vol. 202, No. 1, pp. 529–548 (1997).

"Nucleation and Step–Motion in Chemical Vapor Deposition of SiC on 6H–SiC {0001} Faces" by T. Kimoto and H. Matsunami, published in J. Appl. Phys., vol. 76, pp. 7322–7327 (1994).

"Growth and Characterization of Silicon Carbide Polytypes for Electronic Applications," by J.A. Powell, P. Pirouz, and W.J. Choyke, Chapter 11 in Semiconductor Interfaces, Microstructures and Devices: Properties an Applications, Edited by Z.C. Feng, Institute of Physics Publishing, Bristol, pp. 257–293 (1993).

"Refinement of the Crystal Structure of SiC Type 6H," by A.H. Gomes de Mesquita in Acta Crystallographica, vol. 23, pp. 610–617 (1967).

Primary Examiner—Felisa Hiteshew
(74) Attorney, Agent, or Firm—Kent N. Stone

(57) ABSTRACT

A method is disclosed for growing high-quality low-defect crystal films heteroepitaxially on substrates that are different than the crystal films. The growth of the first two heteroepitaxial bilayers is performed on a first two-dimensional nucleate island before a second growth of two-dimensional nucleation is allowed to start. The method is particularly suited for the growth of 3C-SiC, 2H-AlN, or 2H-GaN on 6H-SiC, 4H-SiC, or silicon substrates.

52 Claims, 38 Drawing Sheets

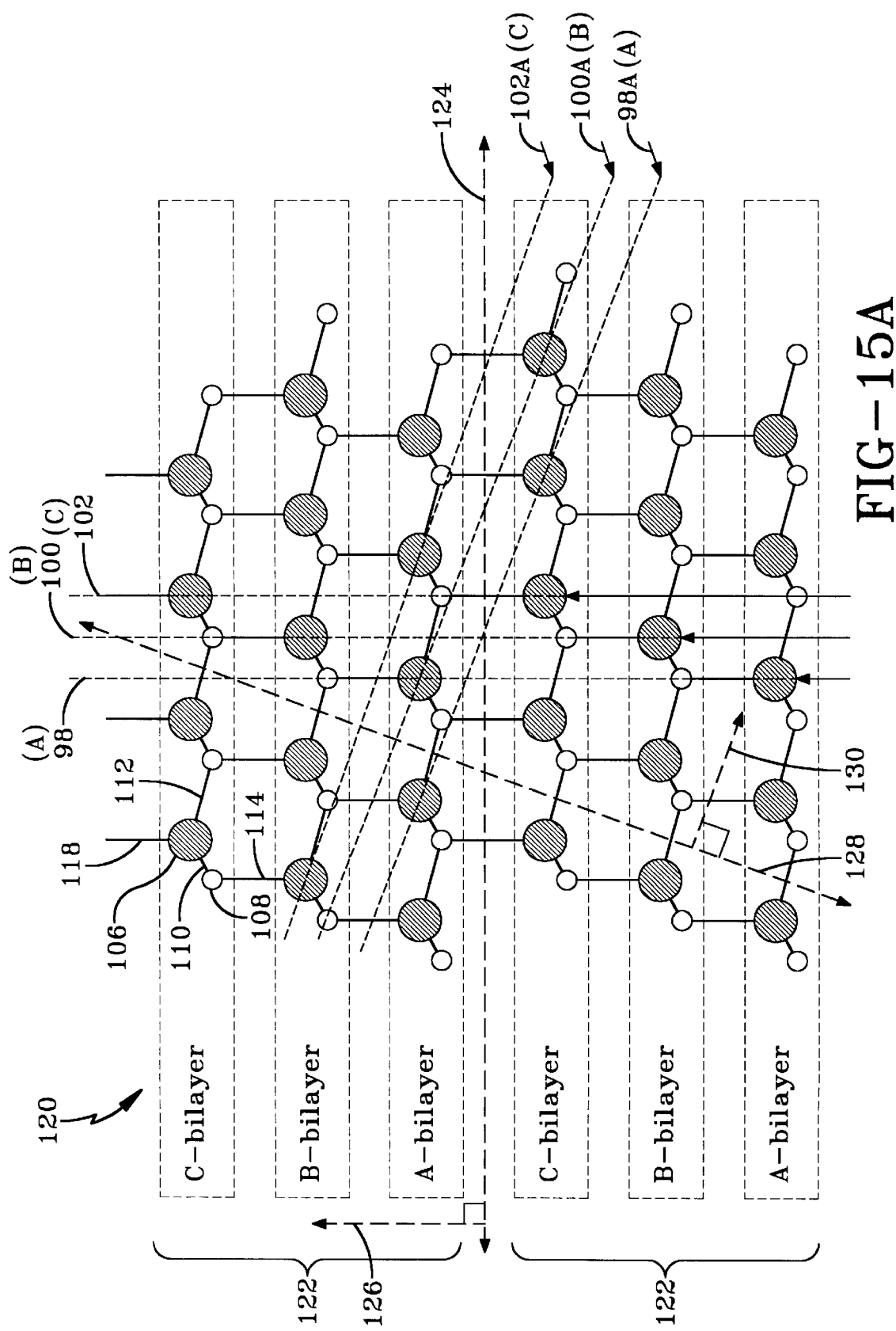

METHOD FOR GROWING LOW-DEFECT SINGLE CRYSTAL HETEROEPITAXIAL FILMS

ORIGIN OF THE INVENTION

The invention described herein was made by employees of the United States Government and may be used by or for the Government for governmental purposes without payment of any royalties thereon or therefor.

FIELD OF THE INVENTION

The invention relates to the growth of semiconductor device crystal films, and more particularly, to a method for producing high quality films of silicon carbide (SiC), aluminum nitride (AlN), gallium nitride (GaN), and other materials or compounds on atomically flat crystalline surfaces. Specifically, the invention enables the growth of low defect heteroepitaxial single crystal films on atomically flat crystal surfaces. The semiconductor devices find application in high power, high frequency, high temperature and high radiation environments, as well as use in optoelectronic devices such as lasers and light-emitting diodes.

BACKGROUND OF THE INVENTION

This invention relates to the controlled growth of crystal films for application to the fabrication of semiconductor devices. The invention is particularly applicable to the production of crystals (herein used to include crystal films) of silicon carbide, aluminum nitride, gallium nitride, diamond, and other materials. A primary aspect of the invention is related to silicon carbide (SiC) and the nitrides (e.g., AlN and GaN) of the Group III elements; however, the invention has much broader applications and can be used for other elemental crystals and compounds. For example, films of ternary and quaternary compounds (and higher order compounds) of the III-V elements (e.g., GaAlN) could be grown. Also, elemental single crystal films, such as silicon and diamond could also be grown.

The term "atomically-flat" is known in the art and is generally referred to herein as meaning a surface that is totally without any atomic-scale or macro-scale steps over an area defined by selected boundaries that may be created by grooves in a manner to be further described herein with reference to FIG. 4. Many of the methodologies of the present invention are shared with that of U.S. Pat. No. 5,915,194, as well as U.S. Pat. No. 6,165,874, both of which are herein incorporated by reference.

Semiconductor devices, including MISFETs and other device structures all related to the present invention, are used in a wide variety of electronic applications. Semiconductor devices include diodes, transistors, integrated circuits, sensors, and opto-electronic devices, such as light-emitting diodes and diode lasers. Various semiconductor devices using silicon or compound semiconductors, such as gallium arsenide (GaAs) and gallium phosphide (GaP) are commonly used. In order to fabricate semiconductor devices, it is necessary to be able to grow high-quality, low-defect-density single-crystal films with controlled impurity incorporation while possessing good surface morphology. The substrate upon which the film is grown should also be a high-quality, low-defect-density single crystal. In recent years, there has been an increasing interest in research on wide-bandgap semiconductors for use in high temperature, high power, high frequency, and/or high radiation operating conditions under which silicon and conventional III-V semiconductors cannot adequately function. Particular research emphasis has been placed on SiC, and III-nitride alloys, including AlN, GaN, InGaN, AlGaN, and others.

Conventional semiconductors are unable to meet some of the increasing demands of the automobile and aerospace industries as they move to smarter and more electronic systems. New wide bandgap materials are being developed to meet the diverse demands for more power at higher operating temperatures. Two of the most promising emerging wide bandgap semiconductors are silicon carbide (SiC) and gallium nitride (GaN). At over three electron volts, the bandgap of these materials is nearly three times as large as that of silicon. This advantage theoretically translates into very large improvements in power handling capabilities and higher operating temperatures that will enable revolutionary product improvements. Once material-related technology obstacles are overcome, SiC's properties are expected to dominate high power switching and harsh-environment electronics for manufacturing and engine control applications, while GaN will enable high power high frequency microwave systems at frequencies beyond 10 GHz. To date the best SiC devices to our knowledge are homojunction (i.e., wafer and device layers are all hexagonal SiC), while GaN devices are heterojunction (i.e., SiC or sapphire wafers with device layers of GaN, AlGaN, AlN, etc.) because production of bulk GaN wafers is not practical at the present time.

Silicon carbide crystals exist in hexagonal, rhombohedral and cubic crystal structures. Generally, the cubic structure, in particular, the zincblende structure is referred to as β-SiC or 3C-SiC, whereas numerous polytypes of the hexagonal and rhombohedral structures are collectively referred to as α-SiC. To our knowledge, only bulk (i.e., large) crystals of the a polytypes have been grown to date with reasonable quality and size acceptable for device applications. The β (or 3C) polytype can only be obtained as small (less than 1 $cm^2$) blocky crystals or thick epitaxial films on small 3C substrates or crystal films of poor quality grown heteropitaxially on some other substrate. The most commonly available α-SiC polytypes are 4H-SiC and 6H-SiC; these are commercially available as polished wafers, presently up to 75 mm in diameter. Each of the SiC polytypes has its own specific advantages over the others. For example, (1) 4H-SiC has a significantly higher electron mobility compared to 6H-SiC; (2) 6H-SiC is used as a substrate for the commercial fabrication of GaN blue light-emitting diodes (LED's); and (3) 3C-SiC has a high electron mobility similar to that of 4H-SiC and may function over wider temperature ranges, compared to the α polytypes, but crystals of sufficient quality and size have not been readily obtainable.

Silicon carbide polytypes are formed by the stacking of double layers, also referred to as bilayers, of covalently bonded Si and C atoms. As will be more fully described later, each double layer may be situated in one of three atomic stacking positions known as A, B, and C. The sequence of stacking determines the particular polytype; for example, the repeat sequence for 3C-SiC is ABCABC...(or ACBACB ... ) the repeat sequence for 4H-SiC is ABACABAC... and the repeat sequence for 6H is ABCACBAB-CACB ... From this it can be seen that the number in the polytype designation gives the number of double layers in the repeat sequence and the letter denotes the structure type (cubic, hexagonal, or rhombohedral). The stacking direction is designated as the crystal c-axis and is in the crystal <0001> direction; it is perpendicular to the basal plane which is the crystal (0001) plane. The SiC polytypes are polar in the <0001> directions; in one direction, the crystal face is terminated with silicon (Si) atoms; in the other direction, the crystal face is terminated with carbon (C) atoms. These two faces of the (0001) plane are known as the silicon face (Si-face) and carbon face (C-face), respectively. As will be more fully described later with respect to FIG. 15(A), the 3C-SiC (i.e., cubic) polytype has four equivalent stacking directions, and thus there are four equivalent planes, the (111) planes, that are basal planes. As used herein, "basal plane" shall refer to either the (0001) plane for a α-SiC, or the (111) plane of 3C-SiC. The term "vicinal (0001) wafer" shall be used herein for wafers whose polished surface (the growth surface) is misoriented less than 10° from the basal plane. The angle of misorientation shall be referred to herein as the tilt angle. The term "homoepitaxial" shall be referred to herein as epitaxial growth, whereby the film and the substrate (wafer) are of the same polytype and material, and the term "heteroepitaxial" shall be referred to herein as epitaxial growth whereby the film is of a different polytype or material than the substrate. The term "mesa" is meant to represent an isolated growth region to be further described herein. The term "bilayer" shall be referred to herein as a layer along the basal plane consisting of two-tightly bonded monolayers of atoms, such as Si and C atoms tightly bonded in bilayers of SiC to be further described. The term "defect free" shall be referred to herein as a single crystal that is free of extended structural defects, such as dislocations and stacking faults that propagate over numerous atoms in at least one direction. The term "defect free" is not meant to describe isolated point defects that involve at most 1 or 2 atoms at an isolated 3D point in the crystal, such as atomic vacancy point defects, interstitial point defects, and impurity point defects.

Theories explaining epitaxial single-crystal growth are well known. Crystal growth can take place by several mechanisms. Two of these are: (1) growth can take place by the lateral growth of existing atomic-scale steps on the surface of a substrate and (2) growth can take place by the formation of two-dimensional atomic-scale nuclei on the surface followed by lateral growth from the steps formed by the nuclei. The lateral growth from steps is sometimes referred to as "step-flow growth." In the first mechanism, growth proceeds by step-flow from existing steps without the formation of any two-dimensional nuclei (i.e., without 2D nucleation). In the nucleation mechanism, the nucleus must reach a critical size in order to be stable: in other words, a potential energy barrier must be overcome in order for a stable nucleus to be formed. Contamination or defects on the substrate surface can lower the required potential energy barrier at a nucleation site. In the processes described in U.S. Pat. No. 5,915,194, having certain drawbacks related to lattice mismatch giving rise to undesired crystal defects, crystal growth proceeds by (1) step flow without 2D nucleation or by (2) step-flow with 2D nucleation. Step-flow growth with 2D nucleation allows the growth of epitaxial films of any desired thickness. In the processes described in the present invention, optimum growth (i.e., defect free) occurs when a first bilayer and a second bilayer are completed from lateral step-flow expansion of single nucleation islands of heteroepitaxial film on an atomically flat surface.

As discussed above, as well as in U.S. Pat. No. 5,915,194, 3C-SiC, to our knowledge, is not available in high quality single-crystal large wafer form. Hence, 3C-SiC device structures must be grown heteroepitaxially on some other substrate material. The present invention overcomes the problems of prior art, including recently discovered deficiencies of U.S. Pat. No. 5,915,194 to be further described, to realize the growth of high quality low-defect 3C-SiC films on 6H-SiC and 4H-SiC substrates.

In addition to non-availability of high quality 3C-SiC single crystal wafers or epilayers, other wide-bandgap semiconductor compounds that are not available in single-crystal wafer form and which have great commercial potential are the nitrides of aluminum, gallium, and indium. Gallium nitride (GaN) in particular, has great potential as an optoelectronic material. Currently, commercial light-emitting diodes are being fabricated by growing GaN or InGaN films on 6H-SiC or sapphire substrates. Even though these films have extremely high defect densities (typically around $10^8$ $cm^{-2}$), very bright and efficient LED's can be fabricated. Pulsed blue lasers have been fabricated from III-N, as well as continuous blue lasers that operate for a period of time before failure related to crystal defects. The present invention provides a means for reducing defects in the GaN and InGaN films and hence makes a more durable continuous duty III-N laser possible.

Although U.S. Pat. No. 5,915,194, as well as U.S. Pat. No. 6,165,874, provides many benefits, it has certain limitations. In our practice of the teachings of U.S. Pat. No. 5,915,194, it has been determined that other defects, not related to surface steps, form when practicing heteroepitaxial growth on atomically flat surfaces as taught by U.S. Pat. No. 5,915,194. As pointed out in U.S. Pat. No. 5,915,194, heteroepitaxial growth on an atomically flat basal plane starts by the nucleation of a growth island that consists of a bilayer of tightly bonded Si and C atoms. In U.S. Pat. No. 5,915,194, as illustrated in FIGS. 7 and 8 thereof, it is described that multiple growth islands (Reference #46 in FIG. 7 thereof) nucleated on the flat surfaces would coalesce without defects because the atoms of the expanding islands would remain coherent with the substrate crystal lattice. However, recent experimental observations in growing heteroepitaxial 3C-SiC films on atomically flat 6H and 4H-SiC substrates indicate this is not the case. In reality, numerous stacking faults are experimentally observed when nucleation of multiple islands takes place within a given atomically flat mesa surface.

The present invention prevents the occurrence of these stacking faults while enabling the growth of low-defect heteroepitaxial single crystal films on atomically flat single crystal surfaces. The present invention overcomes deficiencies in prior art, including those of U.S. Pat. Nos. 5,915,194 and 5,363,800 (herein incorporated by reference), as well as those of U.S. Pat. No. 6,165,874, while initiating growth of heteroepitaxial single crystal films on device-size regions of atomically flat substrate surfaces.

OBJECTS OF THE INVENTION

It is a primary object of the present invention to provide a method of growing high quality low-defect crystal films of semiconductors on substrates that are different than the crystal film. The method is particularly suited for the growth of 3C-SiC, 2H-AlN, and 2H-GaN or InGaN on 6H/4H-SiC substrates.

It is another object of the present invention to provide a method of growing III-N heteroepitaxial films on atomically flat surfaces of 6H/4H-SiC substrates.

It is still a further object of the present invention to provide high quality heteroepitaxial growth of materials with relatively large lattice mismatch to the substrate, yielding heterojunctions.

It is still another object of the present invention to eliminate the need for buffer layers that are required by prior art to overcome lattice mismatch in single-crystal heteroepitaxial films.

Moreover, it is an object of the present invention to provide a method that produces devices that are comprised of reduced defect material having an extended operational life, reduced power consumption, and reduced size thereby decreasing production costs.

SUMMARY OF THE INVENTION

The practice of the present invention particularly related to atomically-flat crystalline surfaces and crystal films is partially based on our discovery of that by selecting a particular set of growth conditions intended to greatly reduce the rate of two-dimensional (2D) nucleation, we reproducibly achieve the growth of 3C-SiC heterofilms entirely free of stacking faults. We also discovered that after initial 3C-SiC nucleation was carried out on a step-free surface at a low nucleation rate, that we could then change the growth conditions to greatly increase the nucleation rate without any detriment to the quality of the heteroepitaxial film. These discoveries strongly indicate that optimum growth (i.e., defect-free) occurs when a first bilayer and a subsequent second layer is completed from the lateral step-flow expansion of single nucleation islands (one island for each bilayer) of the heteroepitaxial film on the atomically-flat surface.

In general, the invention is a method of producing low-defect crystal film structures of materials that are not presently available in the form of large area single-crystal substrates. This method is accomplished by utilizing particular heteroepitaxial growth processes on an atomically-flat basal plane surface of a substrate of different material and/or structure other than the desired crystal film.

The method is primarily concerned with depositing a heteroepitaxial single-crystal film on a plurality of step-free surfaces of a basal plane surface orientation of a selected single-crystal substrate material serving as a wafer. The method comprises the steps of:

(a) preparing more than one step-free planar surface on the selected substrate, wherein each of the plurality of step-free surfaces has a boundary of selected size and shape;

(b) selecting a heteroepitaxial film material whose chemical bonding structure is tetrahedral and exhibits a property that under predetermined growth conditions that growth of the heteroepitaxial film material grows in bilayers on the selected step-free planar surface;

(c) carrying out a selected deposition process under selected growth conditions that produce (1) a single nucleus of the heteroepitaxial film material at least one bilayer thick on the step-free surface with the selected boundary, followed by (2) lateral expansion of the single nucleus over an entire surface defined by the selected boundary of the plurality of step-free basal plane surfaces before a second nucleus can form elsewhere on the selected step-free planar surface, and (3) a single nucleus of the second bilayer of heteroepitaxial film, followed by (4) lateral expansion of the single nucleus over the entire surface defined by the selected boundary before a second nucleus can form elsewhere on the first bilayer of heteroepitaxial film on the selected step-free planar surface, and (d) providing growth of subsequent additional bilayers of the said heteroepitaxial film by providing a suitable set of growth conditions until a desired thickness of said heteroepitaxial film is achieved.

Further, the present invention relates to a method of growing high-quality low-defect single crystal films of silicon and diamond materials on substrates that are different than the film. As an example, the growth of 3C-SiC, 2H-AlN, and/or 2H-GaN on 6H-SiC substrates is related to the present invention.

A specific application of this invention is the growth of 3C-SiC on a 6H-SiC substrate. Another application is the growth of 2H-GaN on a 6H-SiC substrate. Other SiC polytypes, such as 4H-SiC could also be used as substrates in the practice of this invention.

In the practice of our invention, important considerations to achieve growth with little or no two-dimensional nucleation are the following: contamination and surface defects must be minimized because the contamination's can reduce the energy barrier that hinders two-dimensional nucleation. Also line defects (dislocations) that intersect the growth surface must be minimized because some dislocations act as localized step sources that can dominate growth on the substrate mesas preventing the achievement of atomically-flat or nearly atomically-flat mesas necessary for the practice of the present invention.

A further consideration related to the invention is that multiple rotational orientations of the polytypic stacking sequence can occur on surfaces with steps when a 3C sequence is grown on a higher order polytypic substrate, such as a 4H or a 6H polytypic sequence. When crystal film islands, that have different rotational orientations, coalesce, then defects such as double positioning boundaries (DPB's) form at a boundary between the two domains. It is expected that this same behavior holds for the 2H sequence grown on the 4H or 6H sequence.

BRIEF DESCRIPTION OF THE DRAWINGS

FIG. 13 is composed of FIGS. 13(A) and 13(B), wherein

FIG. 15 is composed of FIGS. 15(A), 15(B), and 15(C), wherein FIG. 15(A) illustrates the cross-sectional crystal structure and associated parameters of 3C-SiC polytype.

FIG. 17 is composed of FIGS. 17(A), 17(B), 17(C), and 17(D), wherein

DETAILED DESCRIPTION OF THE PREFERRED EMBODIMENTS

Figure 1:
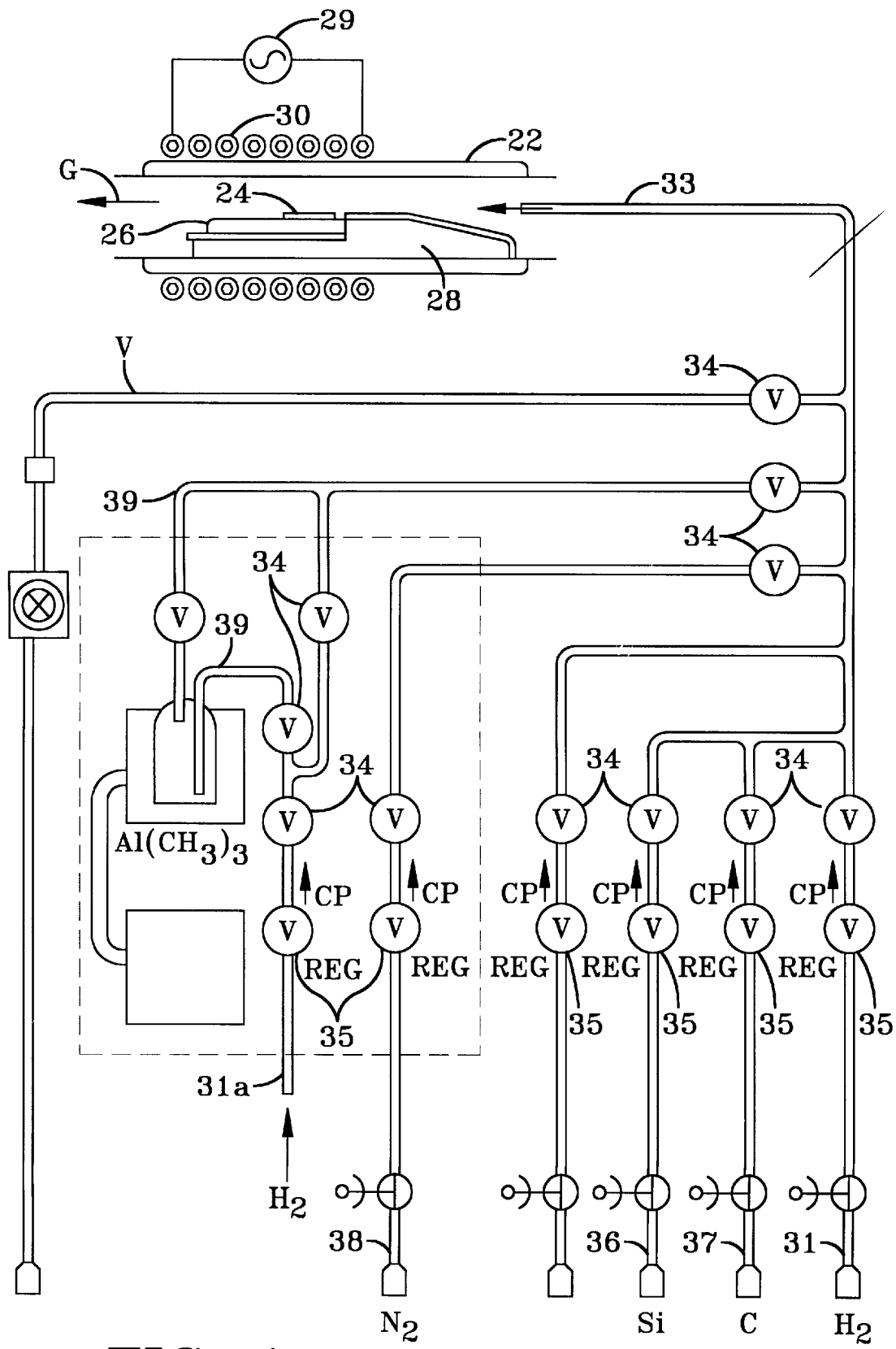
FIG. 1 is a schematic drawing of a CVD system employed for the growing crystal films in accordance with the present invention.

Referring now to the drawings, wherein the showings are for the purpose of illustrating preferred embodiments of the invention only and not for the purpose of limiting the same, the invention describes an improved chemical vapor deposition (CVD) method for obtaining improved quality of the grown crystal films. Prior art chemical vapor deposition (CVD) processes are disclosed in U.S. Pat. Nos. 5,463,978, 5,915,194, 5,363,800, and 6,165,874, all of which are herein, incorporated by reference. Other growth processes, e.g., sublimation, physical vapor phase epitaxy, molecular beam epitaxy (MBE), and others may be used in the practice of the present invention. While the method may be applied to many different crystals contemplated by the present invention, the method will be primarily described with respect to the growing of silicon carbide (SiC) crystals. The improved CVD method includes pretreating a substrate, heating the substrate in a reaction chamber, introducing a carrier gas, vaporizing the crystal growing compounds, introducing the vaporized compounds in the reaction chamber via the carrier gas and maintaining proper energy levels and material flow rates in the reaction chamber for a sufficient time to grow a crystal film having a desired smooth surface morphology, a desired thickness, a low-defect density and a controlled impurity profile. The crystals may be intentionally doped to form n-type conductivity and/or p-type conductivity crystals. As described in U.S. Pat. No. 5,915,194, the CVD crystal growing method provides for atomically flat basal-plane surfaces grown by step-flow growth over a wide range of conditions provided that the SiC substrate surface is properly prepared.

In general, the method of the present invention is related to depositing a heteroepitaxial single-crystal film on a plurality of step-free surfaces of a basal plane surface orientation of a selected single-crystal substrate material serving as a wafer. The method comprises the steps of:

(a) preparing more than one step-free planar surface on the selected substrate, wherein each of the plurality of step-free surfaces has a boundary of selected size and shape;

(b) selecting a heteroepitaxial film material whose chemical bonding structure is tetrahedral and exhibits a property that under predetermined growth conditions that growth of the heteroepitaxial film material grows in bilayers on the selected step-free planar surface;

(c) carrying out a selected deposition process under selected growth conditions that produce (1) a single nucleus of the heteroepitaxial film material at least one bilayer thick on the step-free surface with the selected boundary, followed by (2) lateral expansion of the single nucleus over entire surface defined by the selected boundary of the plurality of step-free basal plane surfaces before a second nucleus can form elsewhere on the selected step-free planar surface, and (3) a single nucleus of the second bilayer of heteroepitaxial film, followed by (4) lateral expansion of the single nucleus over the entire surface defined by the selected boundary of the step-free basal plane surface before a second nucleus can form elsewhere on the first bilayer of heteroepitaxial film on the selected step-free planar surface, and (d) providing growth of subsequent additional bilayers of the said heteroepitaxial film by providing a suitable set of growth conditions until a desired thickness of said heteroepitaxial film is achieved.

The method of the invention can be carried out with a conventional chemical vapor deposition (CVD) system similar to that used in Si, SiC and GaAs semiconductor technology. The gases used in a SiC CVD system are hydrogen (used as a carrier gas), silane (used as a source of Si), propane (used as a source of C), HCl (used for cleaning and preparing the substrate surface), nitrogen (N2) (used as a n-type dopant), and trimethyl aluminum (TMA) (used as a p-type dopant). Other gases may be used as the Si or C source or used to dope or etch the crystal. Gases other than hydrogen and various gas mixtures can also be used as a carrier gas. If organic compounds are used as the Si and C sources, the process is commonly referred to as metal-organic vapor phase epitaxy (MOVPE). Any CVD system that can deliver these gases to a suitable reaction chamber at the proper flow rates under high purity conditions and at the proper substrate temperatures can be used for the method of the present invention.

Referring now to FIG. 1, there is shown a schematic, partial view of one suitable CVD reaction system for carrying out the process of the invention. The CVD reaction system includes a reaction chamber 22 comprised of a double-walled quartz tube such that the inner quartz tube can be water-cooled. A SiC substrate 24 is supported by a SiC coated graphite susceptor 26, which, in turn, is supported by quartz support 28. To produce the desired temperature of the surface of substrate 24, a radio-frequency (RF) induction coil 30 is disposed around reaction chamber 22. Induction coil 30 is powered by frequency generator 29. The RF field produced by induction coil 30 heats substrate 24 via susceptor 26 to the desired temperature. When SiC film layers are grown, substrate 24 is preferably a SiC substrate. The gaseous crystal compounds are introduced into reaction chamber 22 by primary line 33. Primary line 33 is located at one end of reaction chamber 22 and directs the gases to flow in direction G across substrate 24 and out the opposite end of chamber 22. The various gaseous crystal compounds are connected to primary line 33 and the gas flow is regulated by valves 34 and regulators 35 connected to each gas line. Line 36 is the silicon gas line that controls the silane flow into primary line 33, and line 37 is the carbon gas line that controls the propane flow into primary line 33. The dopants are introduced into primary line 33 by line 38 and line 39. Line 38 is the n-type dopant line and preferably controls the nitrogen gas ($N_2$) flow rate. Line 39 is the p-type dopant line and preferably controls the trimethyl aluminum (TMA) flow rate. Carrier gas line 31 carries all the gaseous crystal compounds and dopants through primary line 33 and into reaction chamber 22. The carrier gas is preferably hydrogen ($H_2$). Carrier gas line 31 is partially diverted into line 31$a$ to supply line 39 so that the carrier gas can be bubbled through the liquid TMA when p-type aluminum doping is desired. A vacuum line (V) connected to a vacuum pump can be connected to primary line 33 to evacuate reaction chamber 22 of gases.

SiC substrate 24 is prepared by slicing a wafer section from a SiC boule. The SiC substrate 24 is chosen to be a single crystal substrate material which exhibits a property that the material contains at least one growth plane orientation whereby under selected growth conditions, to be further described, the growth rate due to step-flow growth is greater than at least one hundred (100) times the growth rate due to growth involving two-dimensional nucleation, also to be further described. Further, the single-crystal substrate 24 may be selected from the group of hexagonal type polytype compositions consisting of 6H-SiC and 4H-SiC. In another embodiment, the single-crystal substrate 24 may be of a material that has a rhombohedral crystal structure and is 15R-SiC. Further, in an additional embodiment, the single-crystal substrate 24 may be of a material that has a cubic crystal structure and is selected from the group consisting of silicon; germanium; SiGe; GaAs; and GaP.

The tilt direction of the substrate 24 is sometimes selected so as to produce the optimum growth rates and quality of the SiC epitaxial films grown on substrate 24. The surface of substrate 24 is polished preferably on one surface with a diamond paste and/or a final polish using a chemical-mechanical polishing technique. As will be further described, the step-free surface may have a (0001) crystallographic orientation for hexagonal or rhombohedral crystal structure materials, or the step-free surface may have a (111) crystallographic orientation for cubic crystal structure materials.

Figure 2:
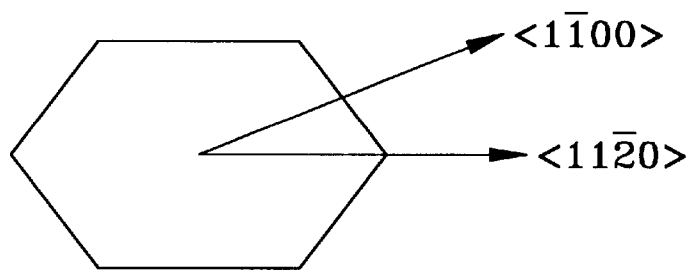
FIG. 2 illustrates a plan view of a hexagonal crystal showing the crystallographic directions of the crystal.
Figure 3:
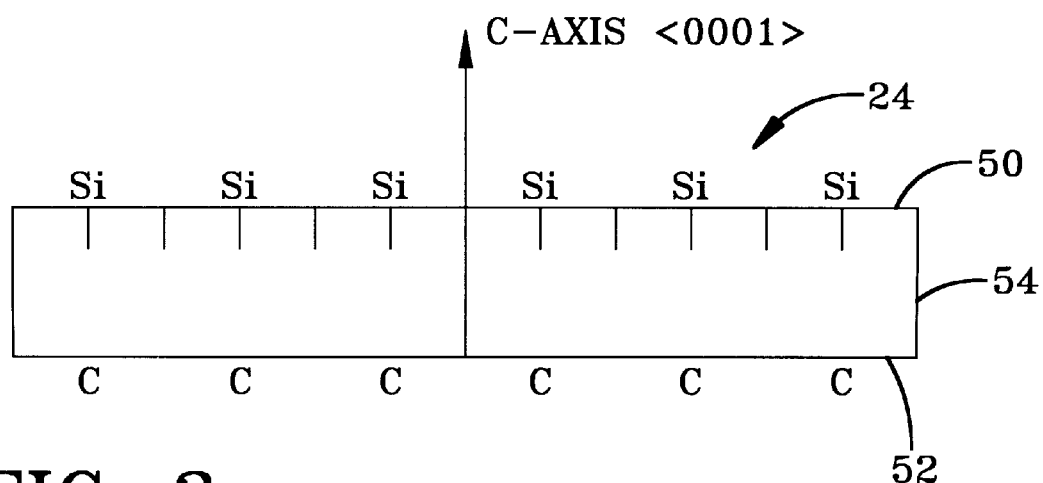
FIG. 3 is a cross-sectional view of an α-SiC substrate showing the Si-face, the C-face and the A-face of the substrate.

Substrate 24 is cut such that the surface is slightly misoriented relative to the basal plane by a tilt angle of less than 1°. Often, the tilt direction is preferably toward the <1120> direction as illustrated in FIG. 2 to produce the optimum growth rates and quality of the SiC epitaxial films grown on substrate 24. SiC substrate 24 has three faces; a Si-face 50, a C-face 52, and the A-face 54, as illustrated in FIG. 3. Preferably Si-face 50 is polished and used for epitaxial growth. It has been found that Si-face 50 produces the highest quality epitaxial layer films which have the best surface morphology.

Figure 4:
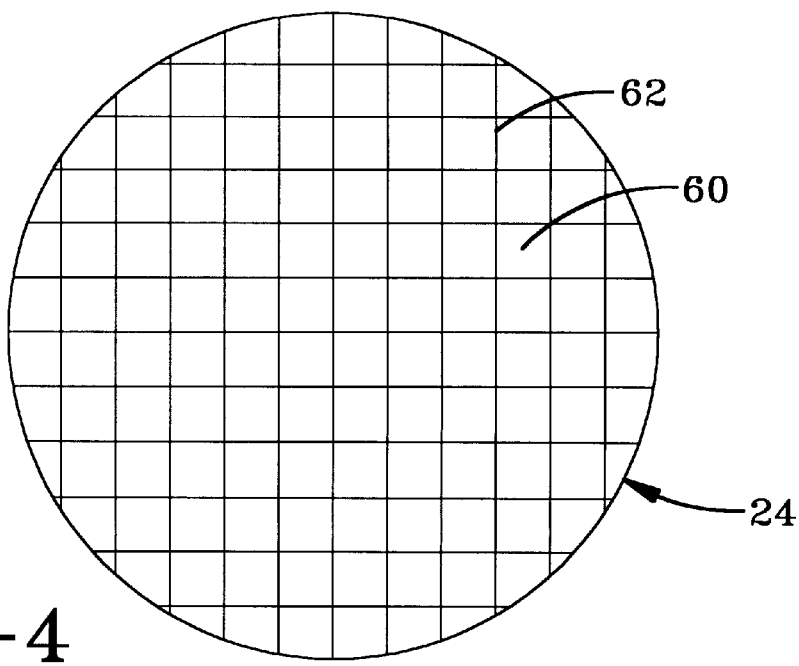
FIG. 4 is a plan view of a substrate that has been divided into isolated growth regions (mesas) by etching trenches or grooves.

Substrate 24 is further prepared by creating boundaries of trenches 62 on the face of substrate 24 which form growth regions 60 (also called mesas), as illustrated in FIG. 4. Further, substrate 24 is further created to define a plurality of mesas 60 to be used as to be further described. Trenches 62 forming growth region boundaries are preferably produced by photolithographically patterned reactive ion etching. However, boundaries 62 may be formed by other physical means, such as, a precision dicing saw with a 25 micrometer thin blade, photolithography, laser etching, photochemical or electrochemical etching processes. The width of trenches 62 need only be 10 micrometers, but larger or smaller widths can also be used. The depth of trenches 62 is preferably about 50 micrometers, but may be deeper or shallower. Typically, an array of device-size regions, 200 micrometers×200 micrometers in size, is produced on the substrate 24. Depending upon the density of substrate defects, other sizes, larger or smaller, can be produced.

Once the substrate surface has been polished and growth regions (i.e., mesas) 60, substrate 24 is pretreated to remove contaminants or impurities on the surface of the substrate so as to facilitate the growing of high quality, low-defect epitaxial films. Various ex-situ pregrowth treatments, such as oxidation, chemical mechanical polishing, or reactive ion etching may be used to remove potential unwanted nucleation sites prior to growing the crystal epilayers. Then substrate 24 is placed in reaction chamber 22. Prior to growing the crystal film layers on substrate 24, the substrate is pretreated with an in-situ pregrowth process to remove removable contaminants and defects on the surface of the substrate 24 that could act as unwanted sites for two-dimensional nucleation of the SiC film layers. These defects on the surface of the substrate can be generated during the cutting and polishing of the substrate. Preferably, the pregrowth process involves subjecting substrate 24 to a high temperature gaseous etch in a hydrogen gas, sometimes mixed with hydrogen chloride gas, within the reaction chamber 22. The pregrowth process is such that the substrate is not altered in a way that unwanted sites for two-dimensional nucleation are produced on the surface of the substrate. Preferably, the etch uniformly removes material from the surface of substrate 24 to ensure a low-defect, highly-pure surface. Further details of the desired etch may be found in U.S. Pat. No. 5,915,194, as well as in a technical article "Process-Induced Morphological Defects in Epitaxial CVD Silicon Carbide" by J. A. Powell and D. J. Larkin, published in Physica Status Solidi (b), vol. 202, no. 1, pp. 529–548 (1997).

Once substrate 24 has been pretreated, reaction chamber 22 is prepared for crystal growth. Reaction chamber 22 is preferably evacuated by vacuum via vacuum line V and subsequently purged with an inert gas to remove impurities. Hydrogen gas may be used to purge the reaction chamber. Once the reaction chamber is purged, the carrier gas flow rates and the temperature within the reaction chamber are brought to equilibrium. Hydrogen gas is preferably used as the carrier gas, but other gases (e.g., inert gases) can be used. Once the temperature and flow within the reaction chamber 22 have reached equilibrium, generally within less than one minute, silane and propane are added to the carrier gas to initiate SiC growth. Preferably, the silane concentration within the carrier gas is approximately 200 ppm resulting in a 200 ppm atomic concentration of Si. Preferably the amount of propane introduced into the carrier gas is approximately 130 ppm to 600 ppm resulting in an atomic concentration of C between 390 ppm to 1800 ppm. The prescribed pretreatment of substrate 24 allows for significantly greater deviations from the optimum Si/C ratio than was previously thought possible for growing high-quality, low-defect SiC crystals. The ratio of the atomic concentrations of Si to C may be varied to create different growth rates and different growth conditions for SiC epilayers. The ratio may range between 0.1 and 0.8.

Figure 5A:
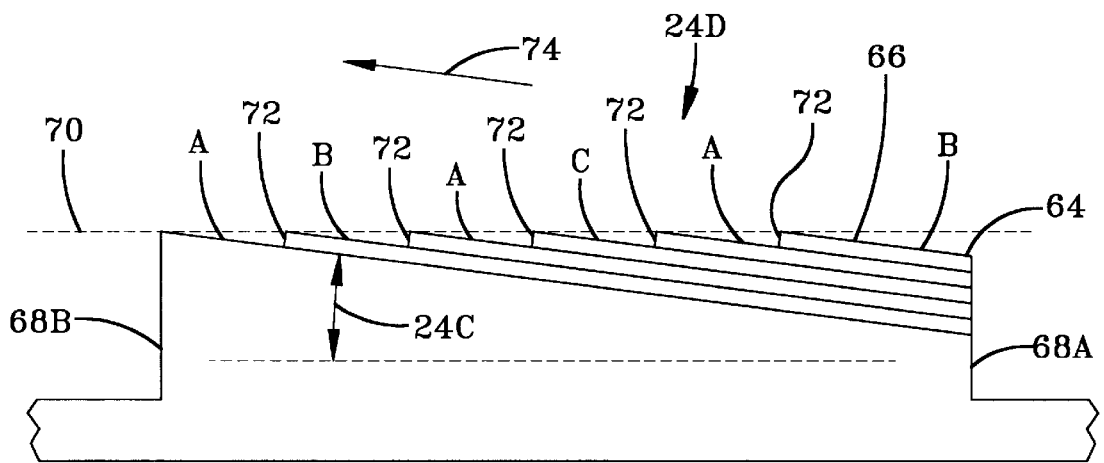
FIG. 5 is composed of FIGS. 5(A) and 5(B) that cumulatively illustrate a polished 4H-SiC wafer mesa having undesired steps in its top surface.

The first phase of crystal growth forms a step-free basal plane surface in a manner consistent with the teaching of U.S. Pat. No. 5,915,194 and can be described by referring now to FIG. 5, which is composed of FIGS. 5(A) and 5(B). FIG. 5(A) shows, in cross-section, a typical mesa etched into "on-axis" SiC wafer 24D that has been polished and is oriented within a small tilt angle 24C relative to the crystal (0001) plane (also called the basal plane) identified by reference number 66 in FIG. 5(A). The surface has been etched to define a mesa with edges 68 comprised of a first or right edge 68A (as viewed in FIG. 5(A) as well as other FIGS herein) and a second or left edge 68B (as viewed in FIG. 5(A) as well as other FIGS herein).

As will be further described, each SiC crystal is formed from the SiC wafer 24D by a specific stacking sequence of bilayers of tightly bonded Si and C atoms. Each of these layers has a basal plane 66. Hereinafter, the top most layer of the SiC crystal surface within an etched mesa having edges 68 is termed the initial plane 64 shown in is FIG. 5(A). The SiC wafer 24D has an initial top surface 70. Because of the unintentional small angle tilt of the top surface 70 with respect to the basal plane 66, surface steps 72 are formed at the surface. The SiC crystal growth direction shown in FIG. 5, is a lateral growth (i.e., stepflow growth) in a direction indicated by directional arrow 74.

Figure 5B:
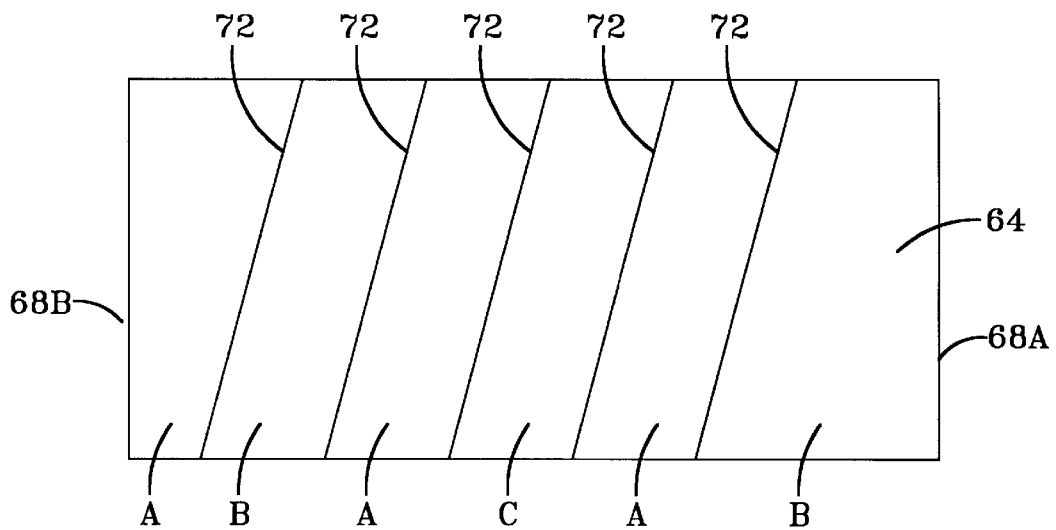

FIG. 5(B) is a top view of FIG. 5(A) and primarily illustrates the initial steps 72 prior to epitaxial growth. More particularly, FIGS. 5(A) and 5(B) primarily show the state of the SiC wafer 24D before it is provided with an atomically flat surface which may be further described with reference to FIGS. 6(A) and 6(B).

Figure 6A:
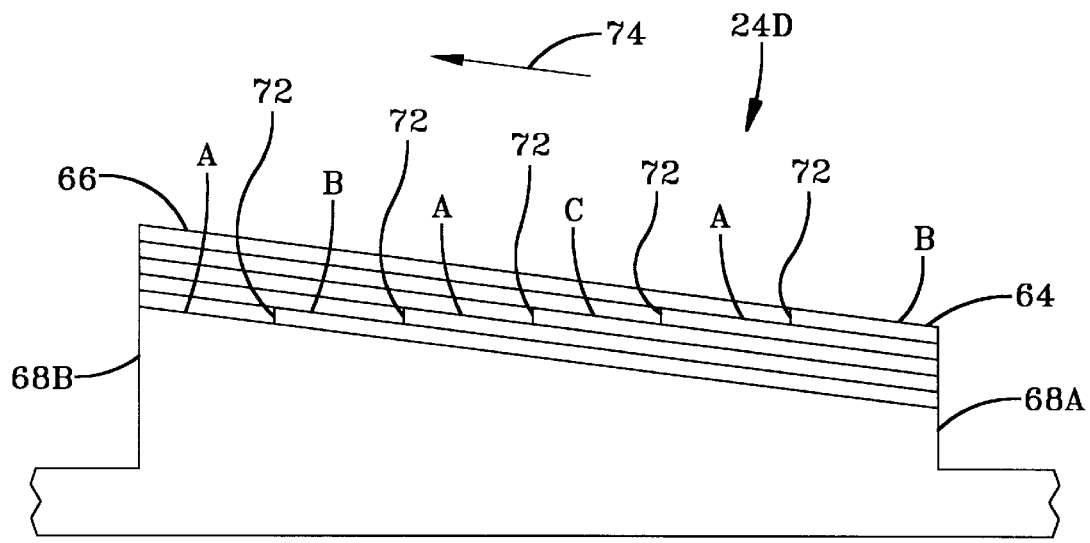
FIG. 6 is composed of FIGS. 6(A) and 6(B) that cumulatively illustrate a SiC wafer mesa having an atomically-flat surface created by a step-flow deposition of a homoepitaxial film.

FIG. 6(A) is quite similar to FIG. 5(A), but illustrates the elimination of the surface steps 72 following sufficient stepflow epitaxial growth without two (2) dimensional nucleation in a manner more fully described in U.S. Pat. No. 5,915,194.

Figure 6B:
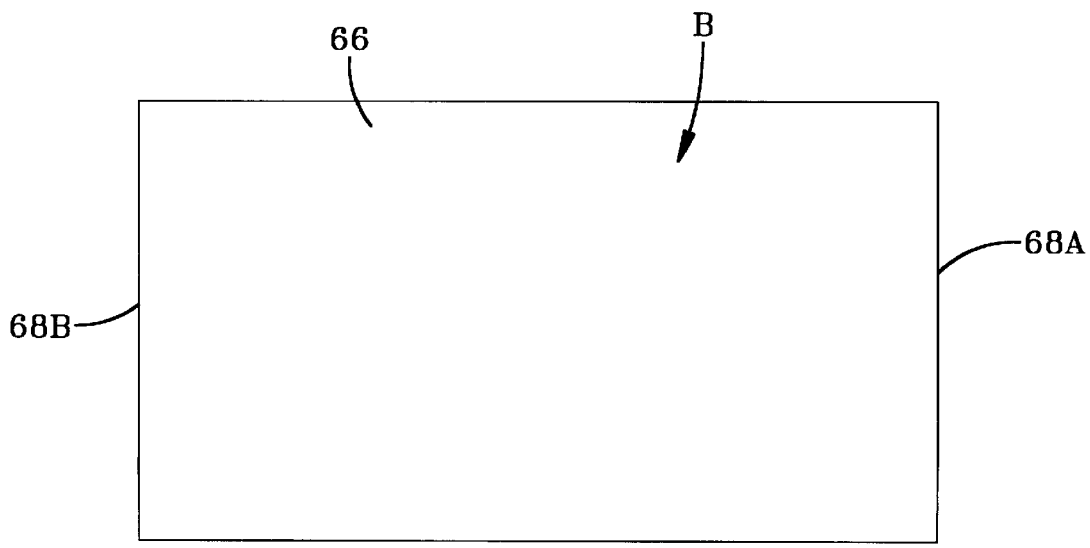

FIG. 6(A), as well as FIG. 5(A), for one embodiment illustrates a 4H-SiC stacking order A, B, A, C, however, both FIGS. 5(A) and 6(A) could have utilized a 6H stacking order A, B, C, A, C, B, or other stacking orders for other SiC polytypes. FIG. 6(B) is a top view of FIG. 6(A) and illustrates that the top surface 66 is smooth and, more particularly, is an atomically flat surface completely free of steps and serves as a starting growth surface for the present invention.

The heteroepitaxial film selected for the practice of the present invention may be of various materials, such as a single-crystal film having a hexagonal crystal structure and, in some embodiments, is selected of a material different from the substrate 24, with the different material being selected from the group consisting of 2H-SiC; 2H-GaN; 2H-AlN; 2H-AlGaN; and 2H-InGaN. The heteroepitaxial single-crystal film may also have a cubic crystal structure and, in some embodiments, is selected of a material different from the substrate 24 material and is further selected from the group consisting of silicon, germanium, SiGe, diamond, 3C-SiC, GaAs, AlAs, AlGaAs, InAs, InP, InGaAs, Inp, InGaAsP, cubic-GaN, cubic-AlN, Cubic-AlGaN, cubic-InGaN. When the selected substrate 24 material is hexagonal-SiC, the heteroepitaxial film material may be 3C-SiC. When the single-crystal substrate 24 material is hexagonal-SiC, the heteroepitaxial film material may be diamond. When the single-crystal substrate 24 material is hexagonal-SiC, the heteroepitaxial film material may be a III-N alloy.

The method of the present invention related to the growth of heteroepitaxial films is different than that of U.S. Pat. No. 5,915,194. More particularly, U.S. Pat. No. 5,915,194 provides for multiple heteroepitaxial growth islands, whereas the present invention provides for optimum growth (i.e., defect-free) by requiring a first bilayer to complete its lateral step-flow growth expansion of a single heteroepitaxial nucleation island of the heteroepitaxial film on the atomically flat surface provided by the homoepitaxial film of FIGS. 6(A) and 6(B) before any growth of any other nucleation island is allowed to begin elsewhere on the atomically-flat homoepitaxial film surface. The present invention also provides for optimum growth (i.e. defect free) by requiring a second bilayer to complete its lateral step-flow growth expansion of a single heteroepitaxial nucleation island of the second heteroepitaxial bilayer on the surface provided by the first bilayer of the heteroepitaxial film. The growth of the nucleation island related to the present invention is herein referred to as a 3C-SiC bilayer island because, as will be further described, 3C-SiC is the SiC polytype that forms when two dimensional (2D) terrace nucleation occurs during SiC epitaxy. The heteroepitaxial film growth of the present invention may be further described with reference to FIG. 7 composed of FIGS. 7(A) and 7(B), wherein in FIG. 7(B) is a top view of FIG. 7(A).

Figure 7A:
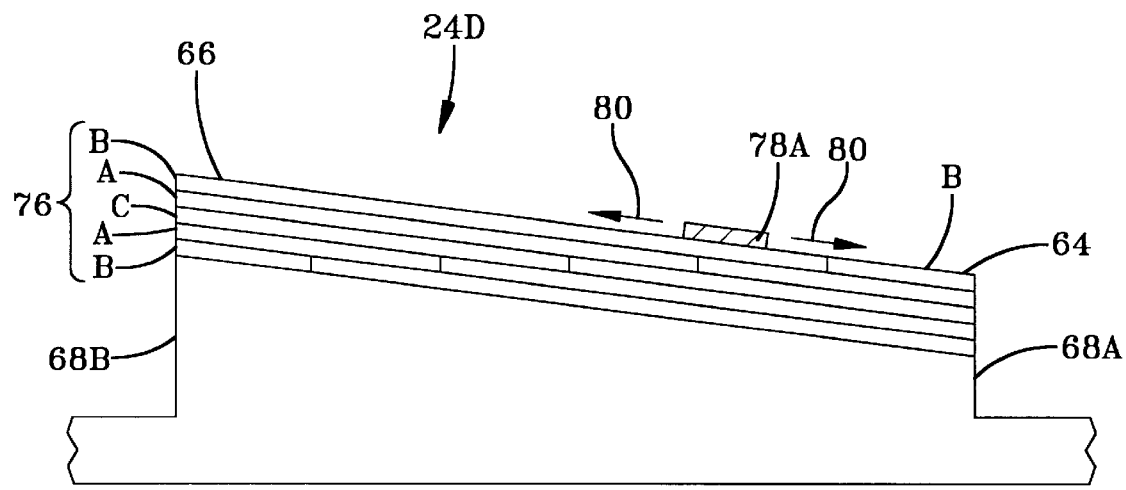
FIG. 7 is comprised of FIGS. 7(A) and 7(B) showing the initial nucleation and growth of a 3C-SiC bilayer island on an SiC mesa in accordance with the practice of the present invention.
Figure 7B:
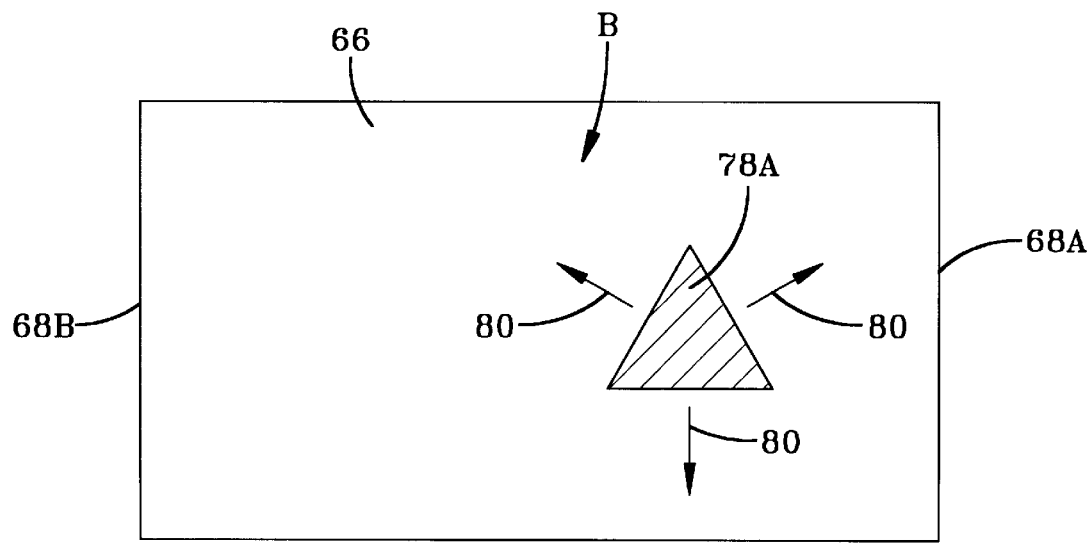

FIG. 7(A), as well as FIGS. 8(A), 9(A), 10(A), 11(A), 27(A), 28(A), and 29(A), is a cross-sectional view of the mesa at various stages, to be described, of heteroepitaxial growth. The stacking arrangement (B, A, C, A, B illustrated for 4H-SiC) 76 of homoepitaxial film is shown. FIGS. 7(B), 8(B), 9(B), 10(B), 11(B), 27(B), 28(B), and 29(B), respectively illustrate top views of FIGS. 7(A), 8(A), 9(A), 10(A), 11(A), 27(A), 28(A), and 29(A).

It is well known to those skilled in the art that when 2D terrace nucleation occurs instead of step-flow during SiC epitaxial growth on a hexagonal SiC substrate, the stacking order becomes 3C-SiC. This is discussed in U.S. Pat. No. 5,915,194 and references therein. Thus, when growth conditions permit 2D nucleation on the step-free surface, which is in effect a large basal plane terrace, the bilayer takes on the 3C-SiC stacking sequence.

FIG. 7(A) illustrates the formation of an initial 3C-SiC island 78A that is laterally expanding in the directions indicated by directional arrows 80. It should be noted that the 3C-SiC bilayer island 78A is a double layer of tightly bonded Si and C atoms. FIG. 7(B) further illustrates the initial 3C-SiC bilayer island 78A. The lateral enlargement of the 3C-SiC bilayer island 78A via step-flow growth may be further described with reference to FIG. 8 which is composed of FIG. 8(A) and 8(B).

The initial 2D nucleation of the 3C-SiC bilayer island 78A is accomplished by conditions that barely promote limited two-dimensional (2D) nucleation, in addition to the conditions that provide step-flow growth on the atomically flat epilayer surface 66. The conditions that begin to increase two-dimensional nucleation include a lower growth temperature and/or higher concentration of silane and propane and/or higher Si/C ratios to be further described. Once the 3C-SiC bilayer island 78A is nucleated, lateral expansion of the 3C-SiC bilayer island 78A takes place via stepflow growth.

Figure 8A:
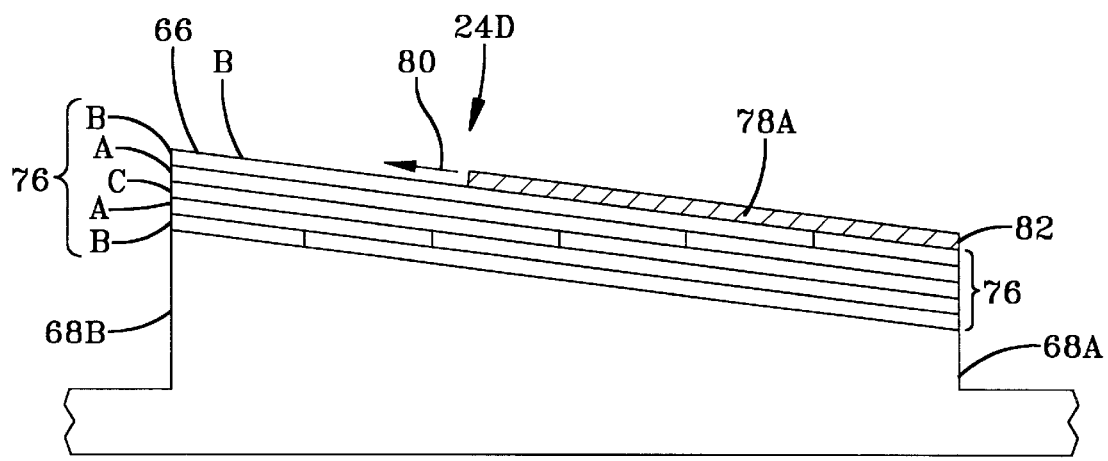
FIGS. 8A and 8B illustrates the further growth of the 3C-SiC bilayer island of FIG. 7.
Figure 8B:
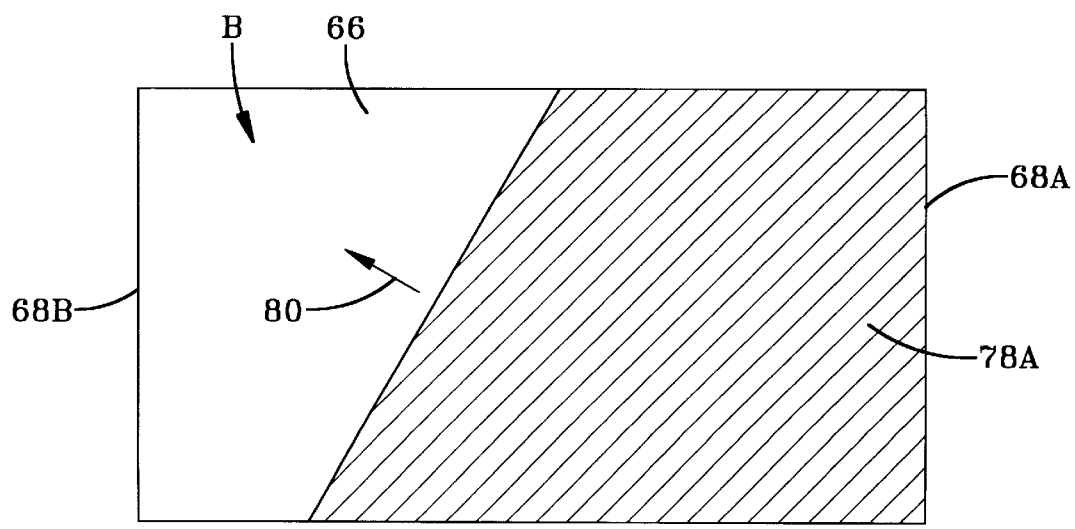

As seen in FIG. 8(B) the first 3C-SiC bilayer island 78A grows laterally to reach the first edge 68A of the mesa located on the right hand side as viewed in FIG. 8(A) and FIG. 8(B) and continues to grow in direction 80 toward the second edge 68B, located on the left hand side as viewed in FIG. 8(A) and FIG. 8(B). The desired growth of the first 3C-SiC bilayer island 78A is best seen on FIG. 8(B). The direction of growth 80 shown in FIG. 8 is also applicable to FIGS. 9, 10, and 11.

As seen in FIG. 8(B), the first and only 3C-SiC bilayer island 78A has completed approximately two-thirds of its growth covering the top surface 66 (which has the B position in the stacking order). The completion of the lateral expansion growth of the first 3C-SiC island 78A may be further described with reference to FIG. 9 composed of FIGS. 9(A) and 9(B).

Figure 9A:
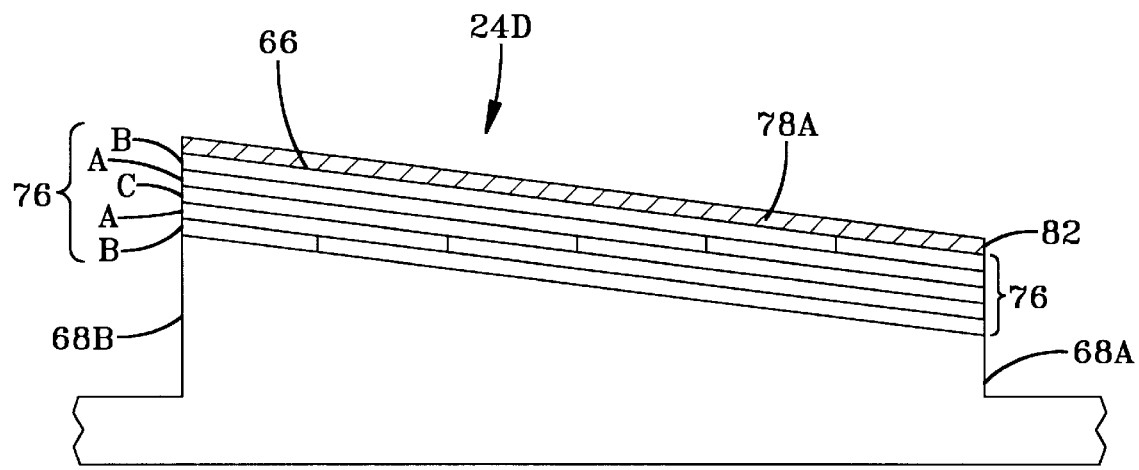
FIG. 9 is composed of FIGS. 9(A) and 9(B) that illustrate the completion of the first 3C-SiC island that is accomplished without the allowance of any stacking faults and, thus, is essentially defect free.
Figure 9B:
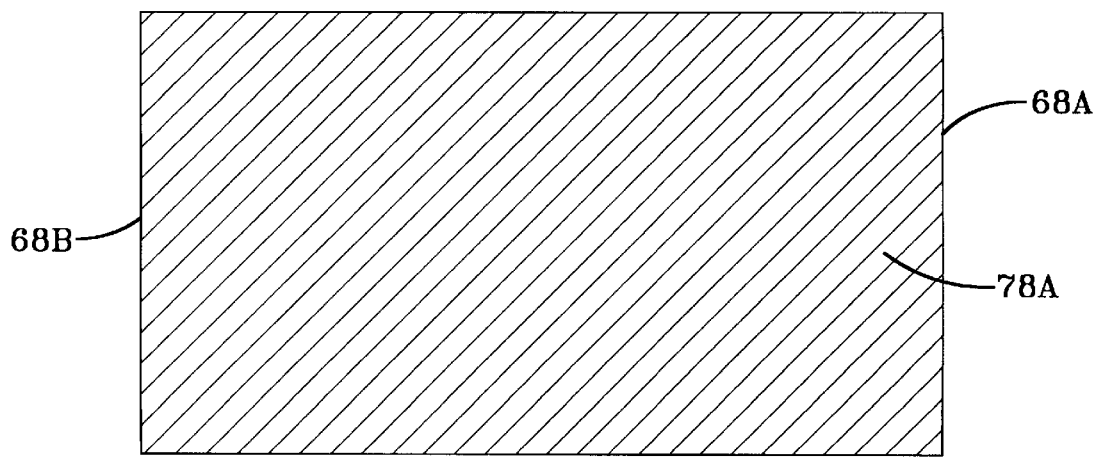

As seen in FIG. 9, the first and only 3C-SiC bilayer island 78A has completed its growth over the entire step-free mesa surface before any additional island is allowed to nucleate on the original step-free surface 66. The state of growth shown in FIG. 9 provides the first bilayer 82 of the 3C-SiC polytype. As seen in FIG. 9(B), the first 3C-SiC bilayer island 78A has grown over the entire atomically flat surface 66 and is defect-free. This can be done, in situ, during the growth that provides the initial heteroepitaxial growth that allows the first 3C-SiC bilayer island 78A to nucleate and grow laterally by step-flow across the entire atomically flat surface before a second 3C-SiC bilayer island can nucleate on the atomically flat surface. Thus, proper control of the initial 3C-SiC bilayer island 78A nucleation rate on the atomically flat surface is necessary for at least the first bilayer in order for this to occur. Proper control of the initial nucleation rate is accomplished by selecting proper growth conditions at the initiation of the heteroepitaxial growth of the 3C-SiC bilayer island 78A. A combination of factors that affect the nucleation rate (and therefore the probability of achieving a single-initial-island nucleation of the 3C-SiC bilayer island 78A) include (but are not necessarily limited to) growth temperature, growth pressure, growth flow, growth precursor concentrations, intentional and unintentional impurities. As will be further described below, the selection of proper nucleation rate is related to the size and shape of individual step-free mesa surfaces. The growth conditions of the present invention comprise a set of growth parameters comprising at least substrate temperature, reactor pressure used for the deposition, concentration of reactor precursors for material being deposited, composition of carrier gas used within the reactor, and flow rate of carrier gas within the reactor. For example, in silicon carbide, it is well known to those skilled in the art, that as the growth temperature is reduced, the probability of 3C-SiC bilayer island nucleation (such as 78A) increases as described in the technical article "Nucleation and Step-Motion in Chemical Vapor Deposition of SiC on 6H-SiC {0001} Faces" by T. Kimoto and H. Matsunami, published in *J. Appl. Phys.*, vol. 76, pp. 7322–7327 (1994). It has also been observed on SiC growth surfaces with steps that increasing the concentration of silicon precursors increases the nucleation of 3C-SiC bilayer island 78A. For any given island nucleation rate (related to the 3C-SiC bilayer island 78A) that results from selected growth conditions, the size and shape of the mesa, such as mesa 68, can be optimized to help maximize the probability of achieving the desired single-initial-island, such as 3C-SiC bilayer island 78A, nucleation and complete lateral expansion via step-flow growth being accomplished without having a second 3C-SiC bilayer island nucleate on the step-free mesa surface 66 prior to the complete coverage of the mesa. In cases where the SiC wafer 24D has diverse lateral sizes and shapes of step-free mesas on its top surface, it has been discovered that it is possible to achieve the desired single-island initiation and bilayer coverage of heteroepitaxial growth by gradually changing the growth conditions starting from low nucleation rates (suitable for the largest step-free mesas), to higher nucleation rates (suitable for the smaller step-free mesas), as a function of time. Experimental evidence indicates that the shape of the mesa also impacts the rate of nucleation. For example, we have observed that the rate of the two dimensional (2D) nucleation related to the 3C-SiC bilayer islands of the present invention is greater for a square mesa shape than for a narrow rectangular mesa shape of equivalent mesa surface area. We believe this is due to depletion-of surface reactants near the mesa edge due to growth on the side of the mesa because growth reactants readily incorporate into A-face (see reference number 54 of FIG. 3) mesa sidewall. Further details of the mesa shapes are to be further described with reference to FIG. 13. The benefits of the present invention may be better appreciated by a general discussion of the disadvantages of the prior art that allowed a second nucleated island (such as, 3C-SiC bilayer island 78B) to begin its growth on the step-free mesa surface 66 before the completion of the first 3C-SiC bilayer island 78A and may be further described with reference to FIG. 10, which is composed of FIGS. 10(A) and 10(B).

Figure 10A:
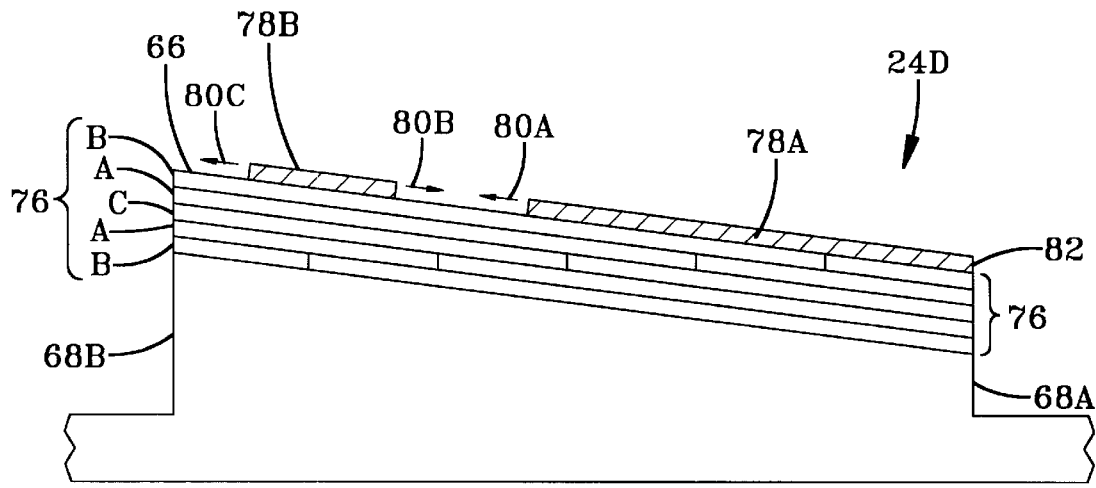
FIG. 10 is composed of FIGS. 10(A) and 10(B) that begins to illustrate the problems associated with the prior art method, wherein nucleation of multiple bilayer islands is permitted, not suffered by the present invention.
Figure 10B:
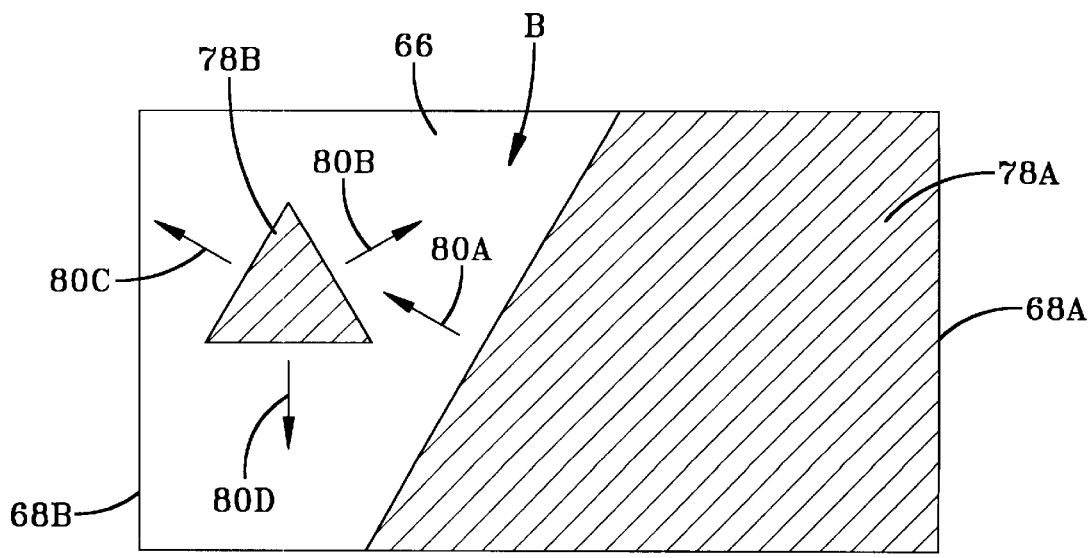

FIG. 10 illustrates that before the first 3C-SiC bilayer island 78A has completed its growth across the entire upper atomically flat surface of the mesa 66, the nucleation and lateral growth of a second 3C-SiC bilayer island 78B has been initiated at another place on the flat surface 66. As seen in FIG. 10(A), the first 3C-SiC bilayer island 78A has grown from the right edge 68A and is pursuing its growth in direction 80A toward the left edge 68B, but has not yet merged with the second growing 3C-SiC bilayer island 78B, which is more clearly shown in FIG. 10(B).

As seen in FIG. 10(B), the first 3C-SiC bilayer island 78A is expanding toward, but has not intercepted the second growing 3C-SiC bilayer island 78B. The further lateral step-flow growth of both first and second 3C-SiC bilayer islands 78A and 78B, respectively may be further described with reference to FIG. 11 which is composed of FIGS. 11(A) and 11(B).

Figure 11A:
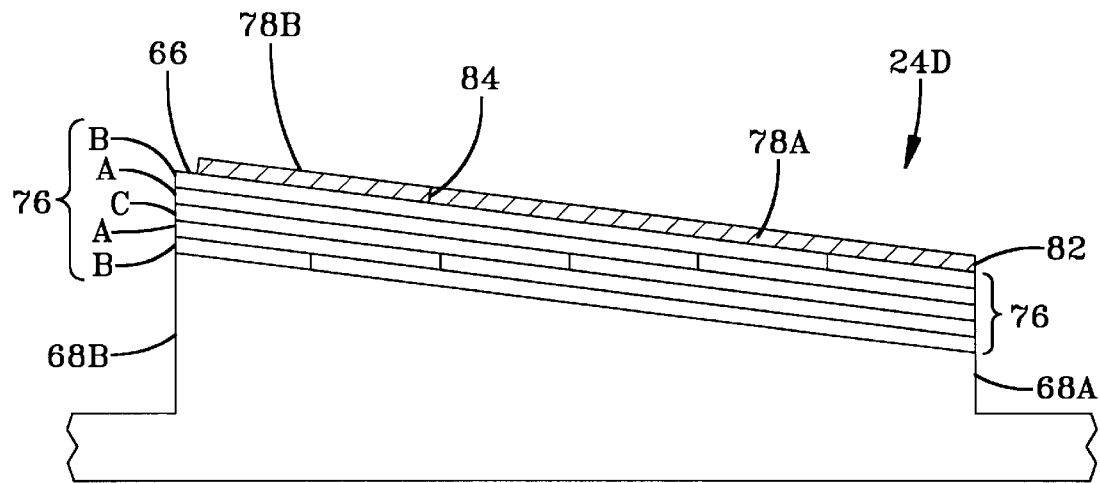
FIG. 11 is composed of FIGS. 11(A) and 11(B) that illustrate the formation of a point of incoherent coalescence that forms a stacking error in the prior art process.
Figure 11B:
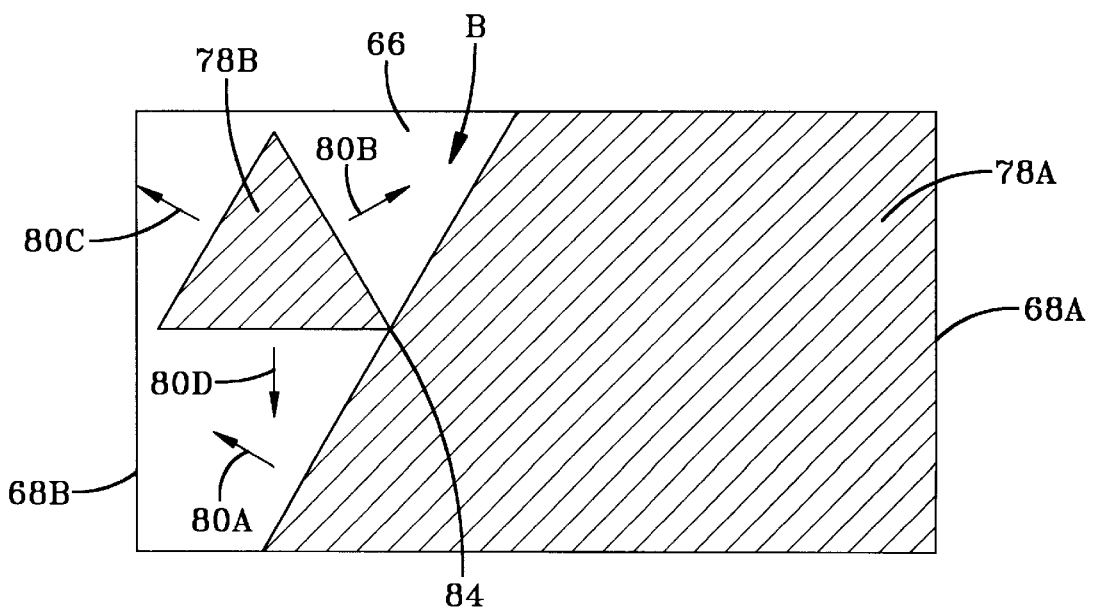

As seen in FIG. 11(A) the first 3C-SiC bilayer island 78A has grown laterally toward and has intercepted a portion of the second 3C-SiC bilayer island 78B (which has also step flow grown laterally) so as to create a point 84 of incoherent coalescence, which may be further described with reference to FIG. 11(B).

Figure 12:
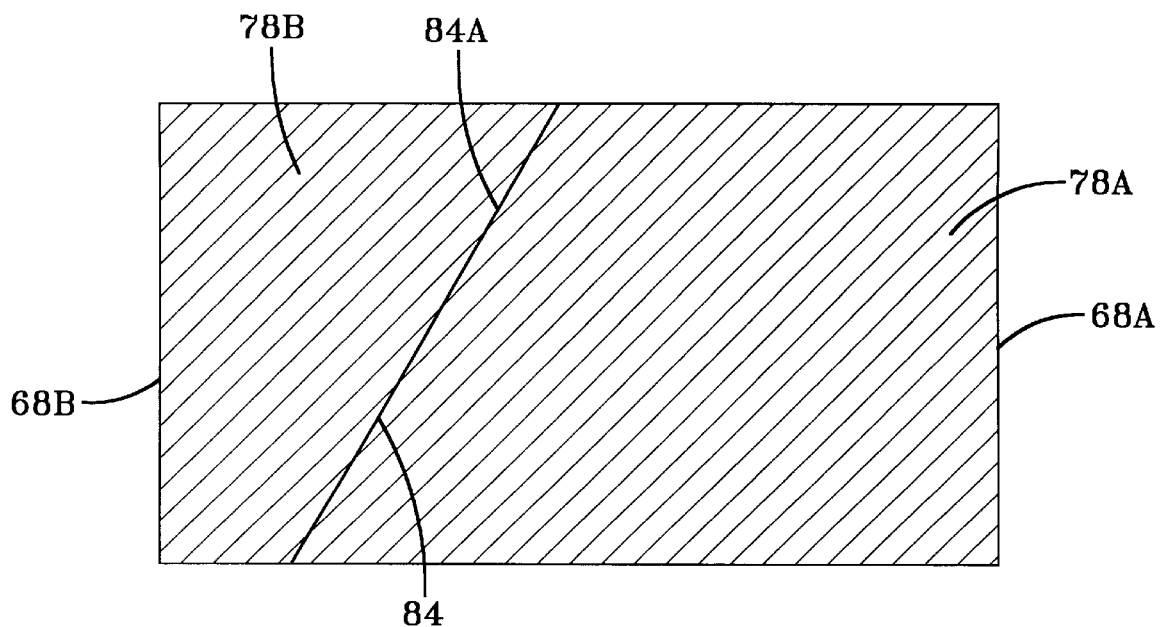
FIG. 12 illustrates a stacking fault that is an extended crystal defect caused by prior art processes.

Unless one is extremely fortunate, as described later with reference to FIGS. 24–27, incoherent lateral coalescence is likely to occur at point 84, shown in FIG. 11(B) resulting in a first stacking fault defect with continued growth forming fault 84A shown in FIG. 12. The physical reasons for incoherent coalescence are to be described later with reference to FIGS. 16, 17, and 20–23. If yet more islands, that is, 3C-SiC bilayer islands, nucleate (i.e., a third or fourth 3C-SiC island) on the flat mesa surface 66, there will be even more incoherent coalescence and, thus, even more stacking fault defects initiated in the heteroepitaxial film.

The selected deposition process of the present invention comprises carrying out deposition under selected growth conditions over a selected period of time to produce an average rate of nucleation (NR1) and an average velocity of lateral island expansion (VLE1) for the growth of the first heteroepitaxial bilayer and an average rate of nucleation (NR2) and an average velocity of lateral expansion (VLE2) for the growth of the second heteroepitaxial bilayer.

Preferably, there are multiple selected growth conditions that are carried out in a sequential manner. More particularly, it is preferred that the growth conditions be selected so as to sequentially increase the average nucleation rate of each growth condition carried out in a sequential manner. Specifically, it is preferred that the sequential increases of the average nucleation rate be accomplished in a staircase or ramp manner.

As is known to those skilled in the art, different growth conditions lead to different amounts (i.e., rates) of two-dimensional (2D) island nucleation during epitaxial growth. For example, it is well known to those skilled in the art that the rate of 2D island nucleation of 3C-SiC can be affected by epitaxial growth temperature. However, until this invention, to our understanding, it has not been appreciated or understood that a very specific of nucleation rate window is necessary for improved heteroepitaxial growth on atomically flat surfaces. The discussion below details the relevant characteristics of one particular "growth condition window" desired to practice the present invention.

Figure 13A:
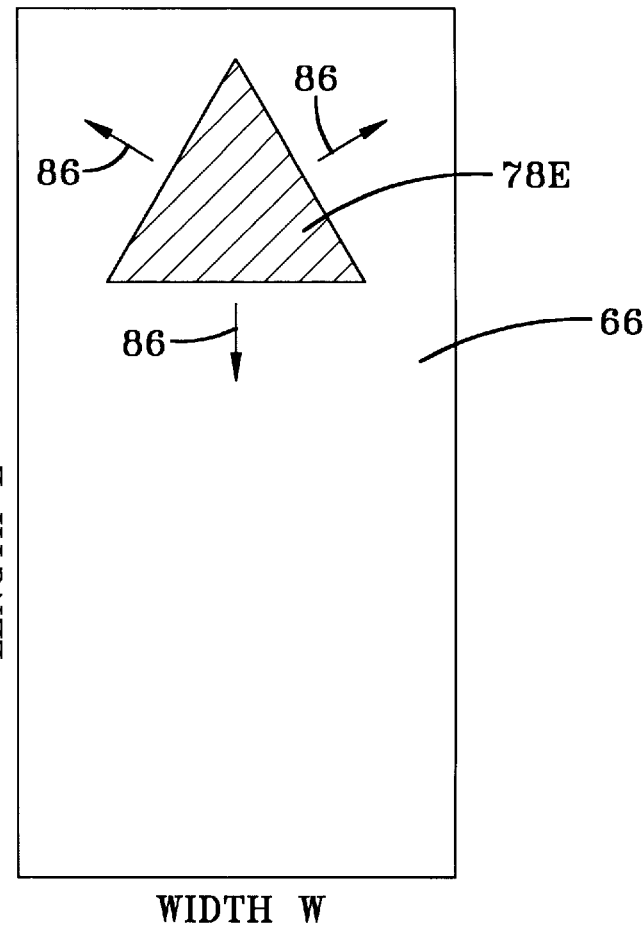
FIG. 13(A) is a top view of the mesa upon which the heteroepitaxial film of the present invention is deposited.

Assume that we have a properly prepared, in a manner as previously described, substrate serving as a wafer in a suitable epitaxial growth reactor with an array of atomically flat surfaces ready for nucleation and growth of a heteroepitaxial film. Next, assume the wafer is patterned with an array of rectangular step-free mesa surfaces, each with the same area A and length dimension L and width dimension W. For this simple case A ($cm^2$)=L (cm)×W (cm). A top view of one such a mesa 66 is shown in FIG. 13A. Next, assume the need to select a time invariant heteroepitaxial growth condition that will give us the desired growth result, namely, single-island nucleation of (1) first heteroepitaxial bilayer followed by expansion to the edge of the mesa 66 prior to a second island nucleating on the step-free surface in a manner as already discussed, and (2) the single-island nucleation followed by expansion of a second heteroepitaxial bilayer on top of the first bilayer prior to the second island nucleating on the first bilayer surface.

For given time-invariant growth conditions, atomically flat substrate material, and heteroepitaxial material, there is a time-invariant average rate of 2D island nucleus formation, hereafter referred to as the nucleation rate (NR), given in units of [# of nucleations]/[unit area ($cm^2$)×unit time (sec.)]. There is also an average velocity of lateral expansion (VLE) of a nucleated island across the step-free mesa 66, given in units of [unit distance (cm)]/[unit time (sec.)]. The average velocity of lateral expansion (VLE) is indicated in FIG. 13A by directional arrows 86 emanating from a nucleated island 78E.

For the given step-free mesa 66 size with a given top surface area A subjected to the above growth conditions, the number of nucleations on average that will occur every second is given by:

$$NS=NR \times A \text{ in units of [\# of nucleations]/[time (sec)].}$$

Thus the average time between 2D island nucleations (T2D) for this mesa 66 size under these growth conditions is:

$$T2D=1/NS \text{ in units of time (sec).}$$

Once an island 2D nucleates on the step-free surface, the present invention teaches that it is desired that the island, such as island 78E of FIG. 13A, grow laterally to cover the farthest edge of the mesa before a second nucleation can take place on the original step-free surface. If an island 2D nucleates at one extreme end of the step-free mesa, and laterally expands at the VLE velocity defined above, the time it would take for the entire mesa to be covered (TC) would be:

$$TC=L/VLE \text{ in units of time (sec).}$$

where L is the length of the mesa 66 and VLE is the island's velocity of lateral expansion (VLE) discussed above. This represents a worst-case coverage time (TC), since the distance of lateral expansion needed to cover the island would be L/2 if the island nucleated in the middle of the mesa.

For the present invention to be preferably practiced in this case (i.e., for single-island nucleation and expansion to be accomplished prior to a second island nucleating on the step-free substrate surface), growth conditions should be selected so that the average time between 2D island nucleations (T2D) is larger than the coverage time (TC) and which may be expressed as follows:

$$T2D>TC$$

which by mathematical substitution from previous equations can be expressed as:

$$\frac{1}{(NR)(A)} > \frac{L}{VLE}$$

which can be algebraically rearranged as:

$$\frac{VLE}{NR} > (L)(A)$$

When the growth conditions and mesa 66 size and shape are in the window that satisfies the above inequality, the present invention will be accomplished on the majority of step-free mesas of top surface area A arrayed on the substrate.

For the practice of the present invention, it is also desired that the majority of step-free mesas undergo 2D nucleation followed by complete mesa coverage needed to accomplish the heteroepitaxy of the present invention. As will be further described, it is desired that single-island nucleation and mesa coverage occur for the first two bilayers of heteroepitaxial film. Therefore, the amount of time that the above growth conditions are maintained (TG) must exceed the sum of the nucleation time (T2D) and the coverage time (TC) for the first two bilayers:

$$TG > T2D + TC$$

Figure 13B:
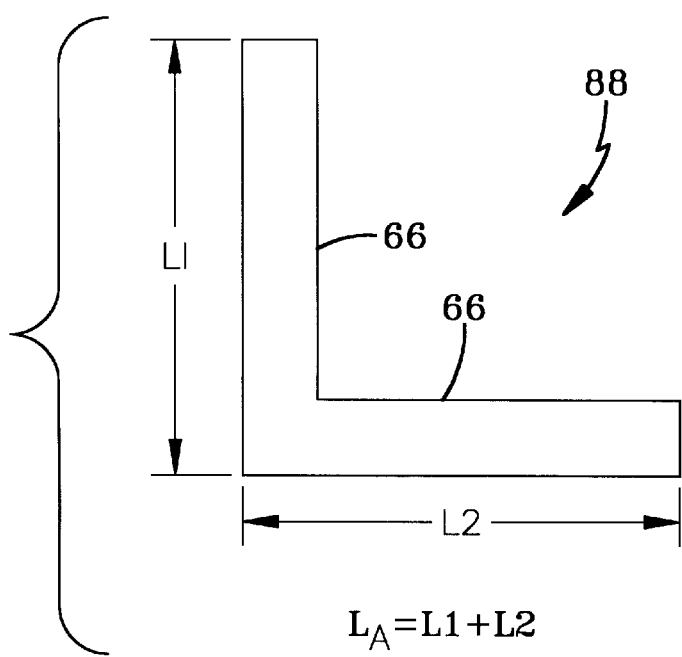
FIG. 13(B) illustrates the accumulated planar length dimension $L_A$ associated with the practice of the present invention.

For a more general mesa shape than a simple rectangle, there is not necessarily a simple straight-line length. We therefore must more accurately define the "L" term in the above inequality as the total distance that a nucleus at one end of the mesa shape would have to traverse to the most distant opposite end of the mesa shape. An example 88 of this accumulated planar length $L_A$ is illustrated for an L-shaped mesa in FIG. 13B showing the quantity $L_A$=L1+L2.

As used herein, the quantities NR, VLE, T2D, and TC for a first heteroepitaxial bilayer are designated as NR1, VLE1, T2D1, and TC1, respectively. Similarly, the quantities NR, VLE, T2D, and TC for a second heteroepitaxial bilayer are designated as NR2, VLE2, T2D2, and TC2, respectively. As will be further described with respect to FIG. 27, the distinction is necessary because NR1 is not necessarily equal to NR2, and likewise VLE1 is not necessarily equal to VLE2. In particular, for cases where the chemical composition of the heteroepitaxial material is different than the chemical composition of the substrate material, it is unlikely that NR1 will equal NR2.

The growth conditions and the planar step-free planar surface size and shape are selected such that the average velocity of lateral island expansion (VLE1) divided by the average rate of nucleation (NR1) for the first bilayer and the average velocity of lateral island expansion (VLE2) divided by the average rate of nucleation (NR2) for the second bilayer are both less than the product of a planar area (A) of the step-free planar surface multiplied by the longest planar accumulated length dimension ($L_A$) of the selected step-free planar surface.

The selected period of time is greater than the sum of the following:
(i) the mathematical inverse of the product of the planar area (A) of the selected step-free planar surface multiplied by the average rate of nucleation (NR1) with the result thereof being termed T2D1;
(ii) the quotient of the longest planar accumulated length dimension ($L_A$) of the selected step-free planar surface divided by the average velocity of lateral island expansion (VLE1) with the result thereof being termed TC1;
(iii) the mathematical inverse of the product of the planar area (A) of the selected step-free planar surface multiplied by the average rate of nucleation (NR2) with the result thereof being termed T2D2;
(iv) the quotient of the longest planar accumulated length dimension $L_A$) of the said selected step-free planar surface divided by said average rate of lateral island expansion (VLE2) with the result thereof being termed TC2.

In order to more fully appreciate that the practice of the present invention provides for the growth of multiple heteroepitaxial films that are free of stacking faults, a more detailed discussion of lateral coalescence of the first two bilayers of the heteroepitaxial film will be described with reference to FIGS. 14–26.

In general, in the practice of the present invention, and in a manner known in the art, the crystallographic plane parallel to the bilayers, such as layer 82, is called the basal plane. It is well known that the SiC polytypes grow by the stacking of SiC bilayers. In accordance with the principles of the present invention, and as known in the art, each silicon and carbon atom within a given bilayer is bonded to three other atoms within the same bilayer, and is only bonded by a single bond to the adjacent bilayer. The bonding is the natural physical force or interactions that cause atoms in a single crystal to be held together in a well-ordered solid crystal structure. Therefore, each atom is much more strongly (or tightly) bonded within its own bilayer than to the adjacent bilayer. For this reason, the basal plane of the SiC is considered the low energy "slip" plane that is most easily deformed and subject to dislocation propagation. The principles of the present invention may be further described with reference to FIGS. 14–26 that illustrate the atomic structure and bonding parameters and defects generated during various cases of 3C-SiC heteroepitaxial growth on a 4H-SiC atomically-flat mesa. These drawings (FIGS. 14–26) and dimensions are not quantitatively accurate, but are intended for purposes of illustrating basic principles of the present invention.

Figure 14:
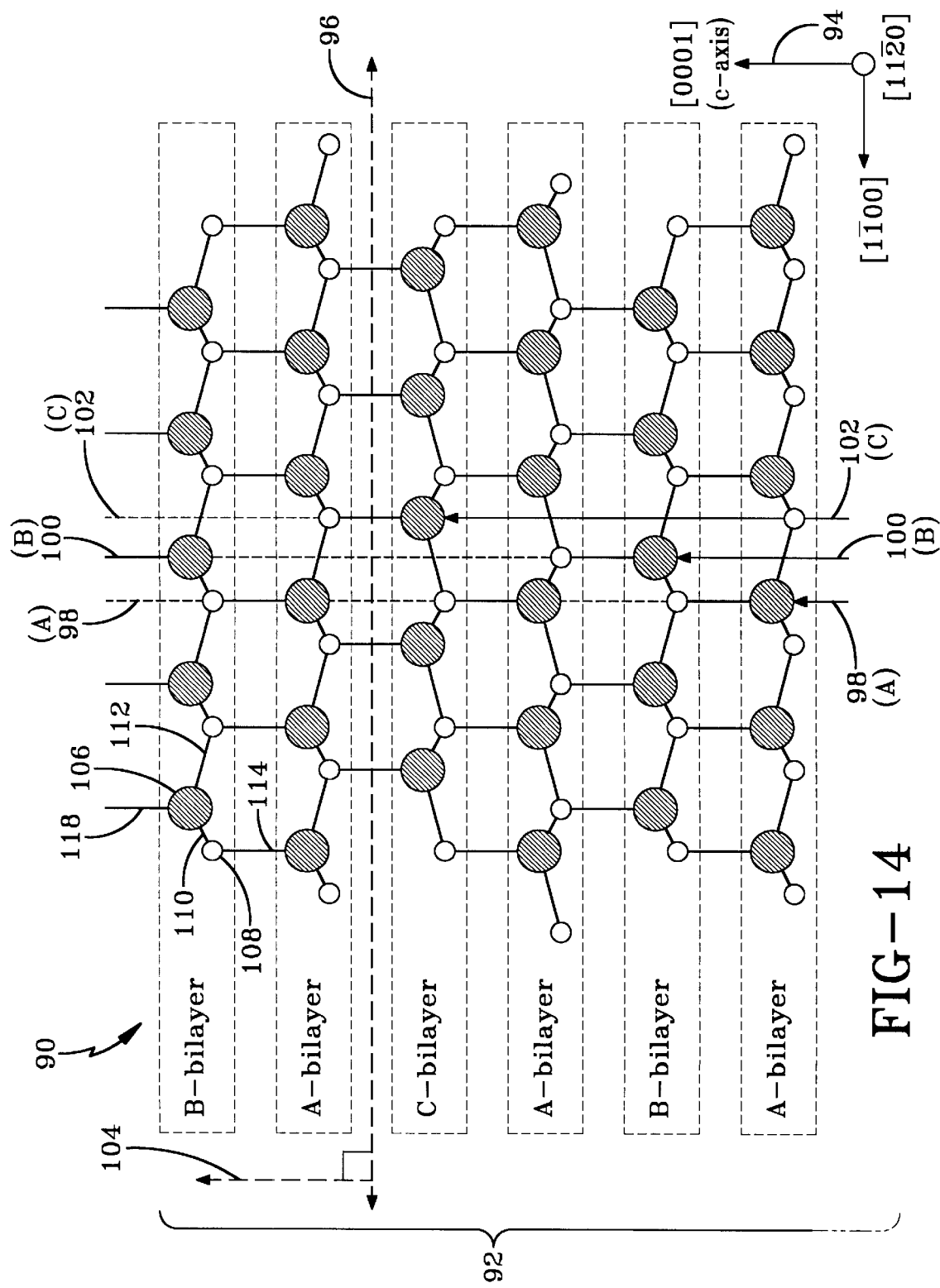
FIG. 14 illustrates the cross-sectional crystal structure and associated parameters of the 4H-SiC polytype.

FIG. 14 illustrates a cross-sectional atomic representation 90 of a 4H-SiC crystal. The ABAC stacking arrangement 92 of the different A B C bilayers is evident. FIG. 14 also illustrates a Miller diagram 94 showing crystallographic orientation related to crystal structure and known to those skilled in the art.

The 4H-SiC structure arrangement 90 has a basal plane (0001) 96. The horizontal position of the silicon atoms in the 4H-SiC structure corresponding to an A, B, or C bilayer is respectively indicated by dimensional lines 98, 100, 102 also respectively identified as (A), (B) and (C) which is representative of the lateral position of the atoms corresponding to the stacking order of the bilayers. This representation (A), (B) and (C) of the lateral position is used throughout the illustrations herein and is to be further described hereinafter with reference to FIG. 20(A). The stacking direction 104 is perpendicular to the (0001) basal plane 96. The silicon atoms are identified in FIG. 14 by reference number 106, whereas the carbon atoms are identified by reference number 108. Each atom has four covalent chemical bonds t o its nearest neighbor atoms, wherein the bonds are shown as 110, 112, and 114. Bonds 112 and 114 are single bonds in the plane of the figure. The third and fourth bonds are represented by 110 and are not in the plane of FIGS. 14, 15(A), 16–26 and 30–35. The bonds between adjacent bilayers of the stacking arrangement 92 is generally identified by reference number 114, whereas a dangling bond (i.e., a bond with no crystal atom on one end) possible at the surface of the crystal is generally identified with the reference number 118.

Figure 15B:
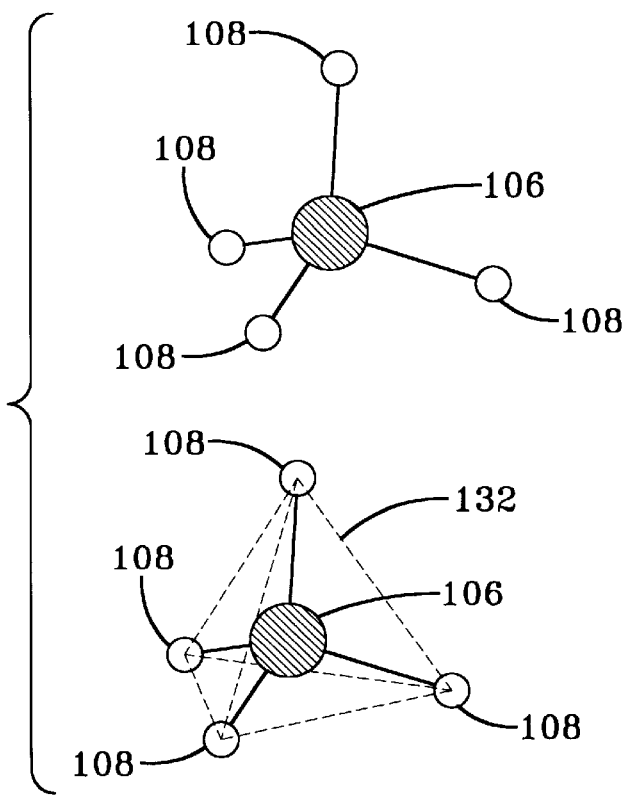
FIG. 15(B) illustrates tetrahedral bonding of a SiC crystal of any polytype.

The cross-sectional atomic representation of 3C-SiC crystal structure 120 may be further described with reference to FIG. 15 composed of FIGS. 15(A), 15(B), and 15(C).

FIG. 15(A) illustrates two of the bilayer stacking directions 126 and 130 of the four equivalent bilayer stacking directions arrangements 122 of the A B C bilayers associated with the 3C-SiC structure arrangement 120. Unlike the single bilayer stacking direction of the 4H-SiC structure of FIG. 14, the cubic symmetry of the 3C-SiC structure 120 has four equivalent basal planes each having associated therewith a perpendicular bilayer stacking direction. It is well known in the art that in 3C-SiC (and other cubic structure semiconductors), the basal plane is associated with (111) Miller indices (also known in the art). However, for the sake of clarity, and the confinement of the Figure to two dimensions, FIG. 15(A) only illustrates a first (111) basal plane 124 having a first stacking direction 126 and a second symmetrically equivalent (111) basal plane 128 having a stacking direction 130. The first and second stacking directions 126 and 130, respectively, are respectively perpendicular to basal planes 124 and 128.

FIG. 15(A) also illustrates dimensional lines 98, 100, and 102 illustrating the lateral positions of the silicon atoms 106 respectively in the A B C bilayers associated with stacking direction 126, similar to that described with reference to FIG. 14, but in addition thereto illustrates dimensional lines 98A, 100A, and 102A illustrating the lateral positions of the silicon atoms 106 associated with the second depicted equivalent stacking direction 130. In order for any volume of 3C-SiC crystal to be free of stacking disorder (i.e. free of stacking faults), the ordered atomic positions of the ABCABC stacking must be maintained in all four (4) equivalent stacking directions.

The bonding related to all SiC polytypes including 4H illustrated in FIG. 14, as well as in 3C illustrated in FIG. 15(A) may be further described with reference to FIG. 15(B). The bonding, known as tetrahedral, of SiC is generally illustrated in FIG. 15(B). As seen in FIG. 15(B), each silicon atom 106 is bonded to four (4) nearest neighbor atoms (carbon atoms 108 in the case of SiC). The nearest four (4) neighbor carbon atoms 108 in the crystal lattice form the points of a tetrahedron configuration, identified in phantom by reference number 132, that encloses the silicon atom 106. The configuration 132 is also referred to herein as a tetrahedral cell 132.

Figure 15C:
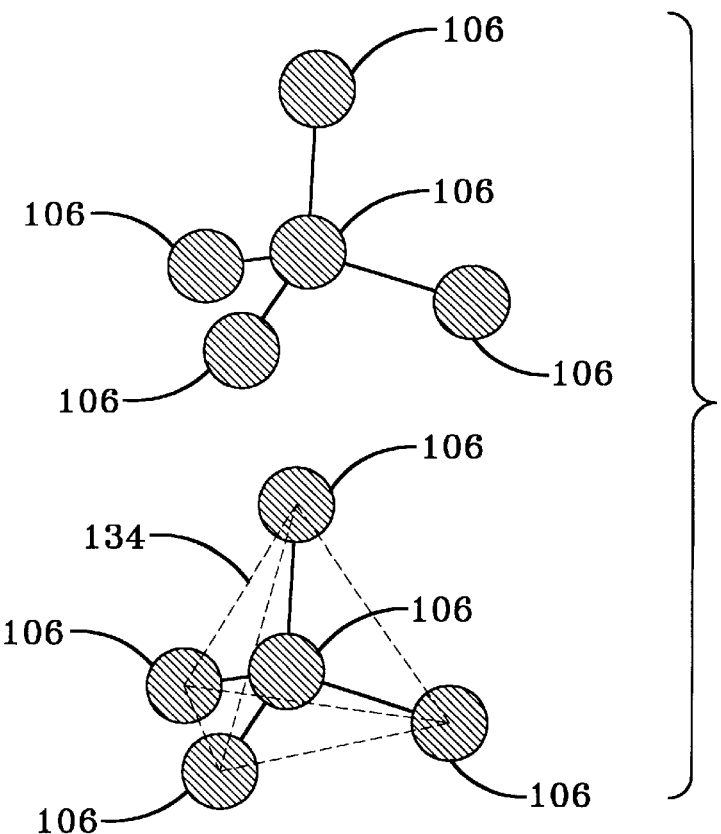
FIG. 15(C) illustrates the tetrahedral bonding of a silicon crystal.
Figure 31:
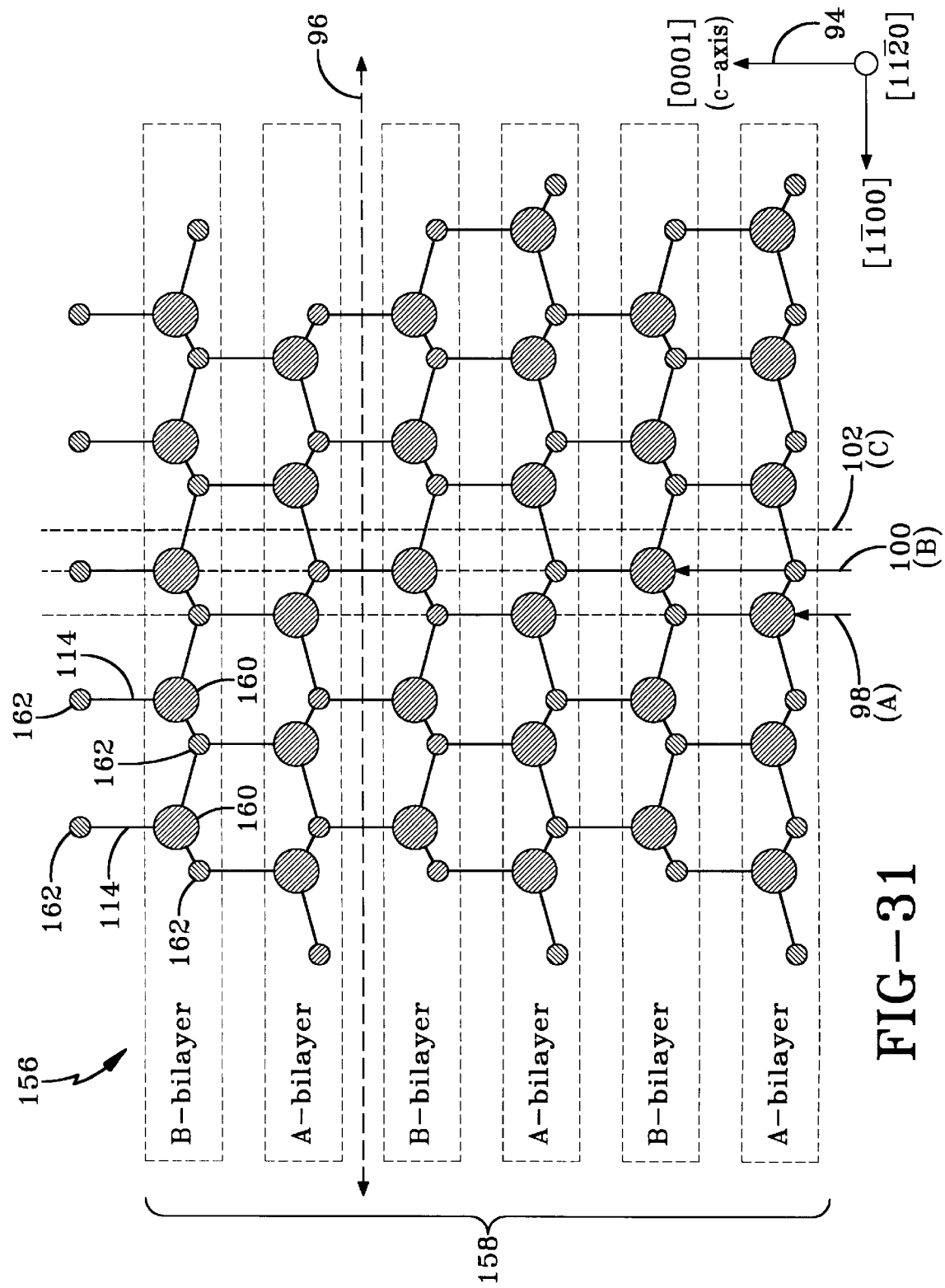
FIG. 31 illustrates a 2H-AlN structure having many similar structural features of the 4H-SiC structure of FIG. 14, including stacking of tightly bonded bilayers and tetrahedral bonding of nearest-neighbor atoms.

The bonding, also known as tetrahedral, of a silicon crystal, to be further described with reference to FIG. 31, is generally illustrated in FIG. 15(C). As seen in FIG. 15(C), each silicon atom 106 is bonded to four (4) nearest neighbor silicon atoms 106. The nearest four (4) atoms form the points of a tetrahedron configuration, identified in phantom by reference number 134, that encloses the selected silicon atom.

As discussed in "Growth and Characterization of Silicon Carbide Polytypes for Electronic Applications," by J. A. Powell, P. Pirouz, and W. J. Choyke, Chapter 11 in *Semiconductor Interfaces, Microstructures and Devices: Properties and Applications*, Edited by Z. C. Feng, Institute of Physics Publishing, Bristol, pp. 257–293 (1993), all SiC polytypes have tetrahedral bonding configuration, as do most semiconductor crystals. As shown in FIG. 15(B), 3 of the 4 of the nearest-neighbor carbon atoms of a silicon atom in a tetrahedral cell can be used to define a plane that is a monolayer (i.e., a carbon monolayer for FIG. 15(B)) of crystal atoms. For 3C-SiC, the four possible monolayer planes of the tetrahedral cell are parallel to the four possible basal planes described with reference to FIG. 15(A). For the remaining SiC polytypes (such as 4H-SiC) with only one basal plane, one of the carbon monolayer planes is parallel to that basal plane. For tetrahedral bonding arrangement, growth parallel to the monolayer plane takes place in a bilayer fashion largely because atoms within the one (e.g., carbon for SiC) monolayer plane cannot bond directly with each other, but instead require simultaneous bonding and propagation of a companion second (e.g., silicon for SiC) monolayer. Thus, growth along the basal plane of tetrahedrally bonded crystals takes place in bilayers even for the case of elemental semiconductor such as silicon. The tetrahedral bonding arrangement also leads to the necessary tight bonding within bilayers, as 3 of the 4 nearest neighbor bonds will be with atoms within a given bilayer, leaving the fourth bond of the tetrahedral cell for bonding to an adjacent bilayer.

The formation of stacking faults related to the present invention and the stressed and unstressed conditions of the heteroepitaxial layer used in the practice of the present invention, may be further described with reference to FIG. 16.

Figure 16:
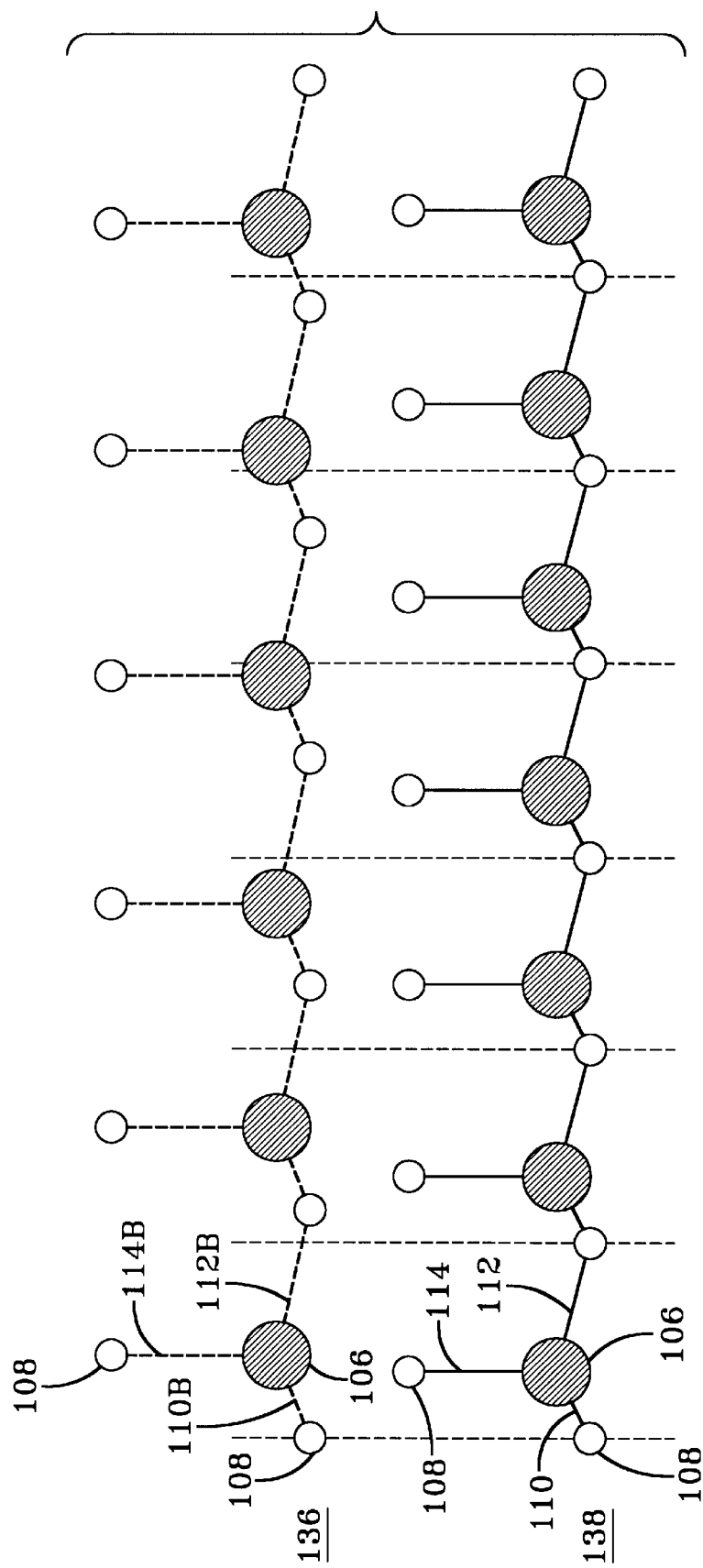
FIG. 16 illustrates the unstressed conditions of individual bilayers of the 4H-SiC structure and the 3C-SiC structure of FIGS. 14 and 15(A) respectively.

FIG. 16 illustrates the natural unstressed condition of a 3C-SiC bilayer 136 and the unstressed condition of a 4H-SiC bilayer 138. From FIG. 16, it is seen that the lateral positions of the silicon 106 and carbon 108 atoms between bilayers 136 and 138 are offset from each other for the vast majority of atoms. The different lattice spacing of the two materials (3C-SiC and 4H-SiC) in an unstressed state means that the atoms thereof will not line up laterally when vertically joined in heteroepitaxy. Different lateral spacing between the 3C and 4H bilayers arises due to the different complete stacking sequences, even though the atomic species are the same in both cases. The phenomena of different lattice spacing in SiC due to changes in the stacking sequence is discussed in the technical article "Refinement of the Crystal Structure of SiC Type 6H," by A. H. Gomes de Mesquita in Acta Crystallographica, volume 23, pp. 610–617 (1967).

For purposes of illustration, the difference in lateral spacing is greatly exaggerated in FIG. 16 and subsequent figures. In FIG. 16, the lateral spacing of six (6) C-atoms in unstressed 3C-SiC bilayer 136 is depicted to be the same as seven C-atoms in unstressed 4H-SiC bilayer 138. Thus, lateral lattice mismatch illustrated in FIG. 16 is about equal to the quantity of $(1-(6/7))(100)=15.3$ percent. The actual lattice mismatch of 3C-SiC to 4H-SiC has been measured to be around a few tenths of a percent. The exaggerated lattice mismatch is necessary to illustrate important principles of heteroepitaxy in the figures that are small enough to be drawn and understood for the practice of the present invention. Otherwise, exceedingly complex figures with thousands of atoms would have to be presented. For this case 3C has lateral spacing larger than 4H, but the process works even if the opposite relationship is true, as will be described later with reference to FIGS. 33–35.

Figure 17A:
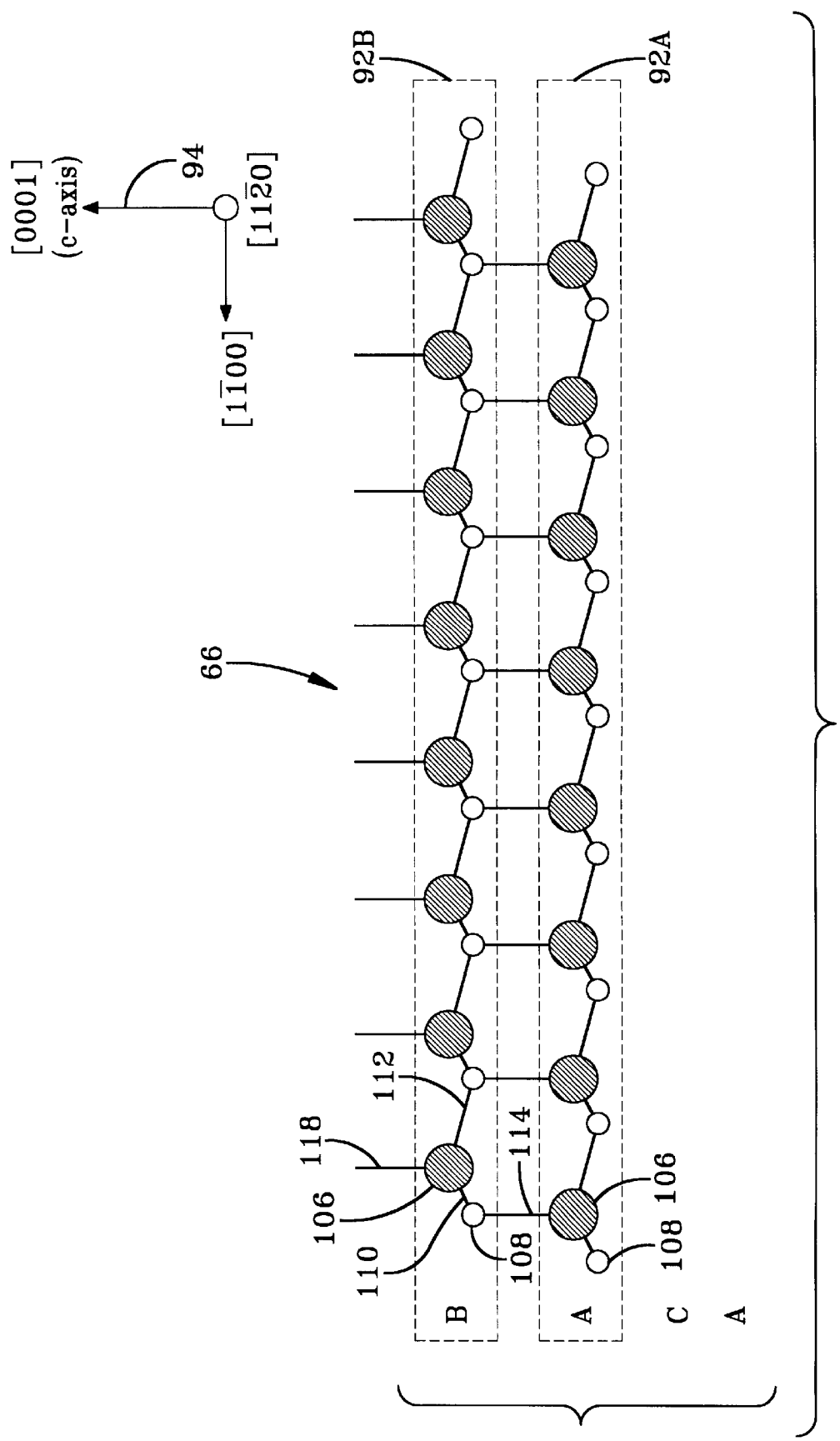
FIG. 17(A) illustrates the state of a step-free 4H-SiC surface prior to heteroepitaxial deposition.

The 4H-SiC stacking arrangement 92 illustrating the top two bilayers 92A and 92B of an atomically-flat surface 66 prior to heteroepitaxy is shown in FIG. 17(A). As seen in FIG. 17(A), the bonds 114, between adjacent bilayers illustrate vertical alignment between the silicon atoms 106 in bilayer 92A and the carbon atoms 108 in bilayer 92B.

Before reviewing the desired bonding as achieved by the present invention starting with reference to FIG. 18, a brief review of the principles of bonding of a small (2D) nucleation may be further described with reference to FIGS. 17(B), 17(C), and 17(D), wherein each show the first atoms forming a small island nucleus of a first 3C-SiC bilayer 122A of the stacking arrangement 122.

Figure 17B:
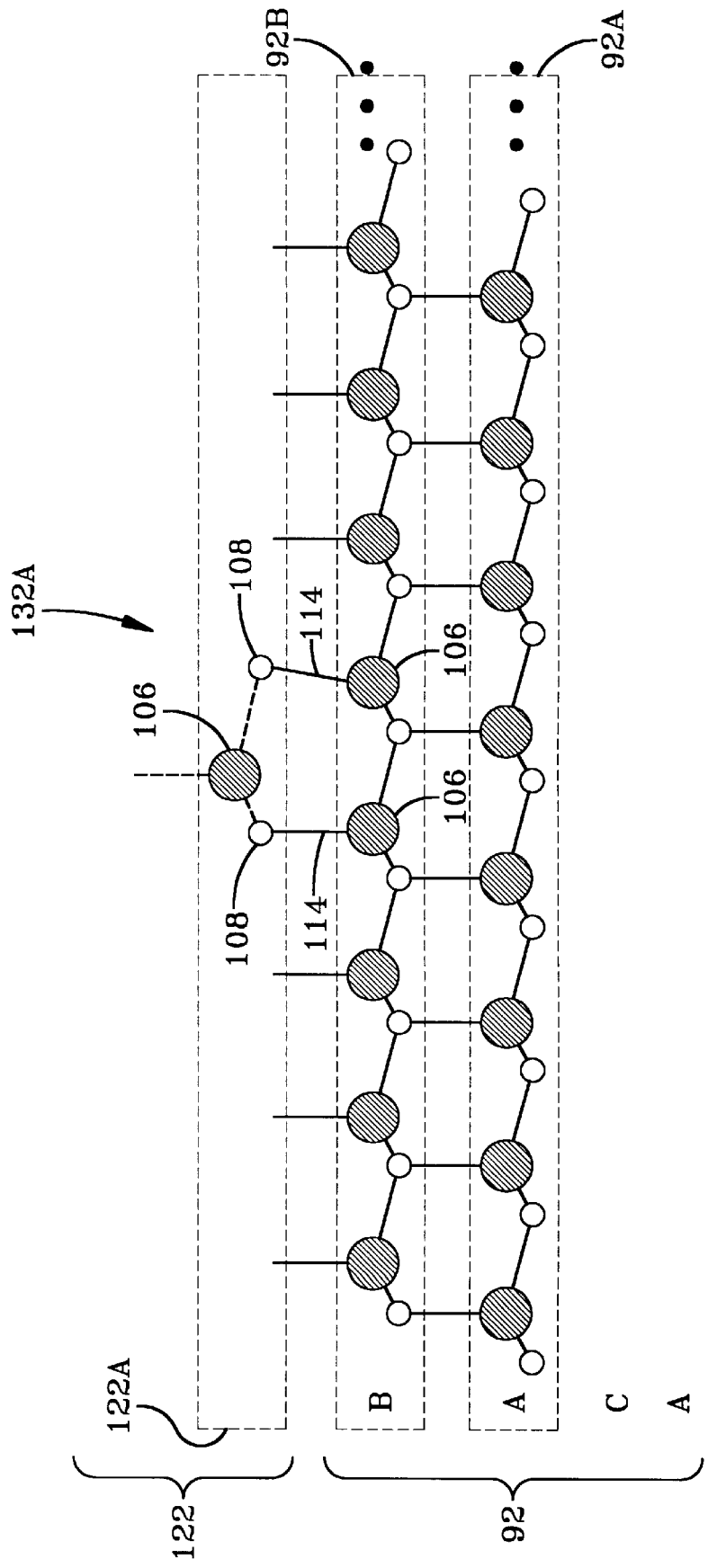
FIG. 17(B) illustrates a small initial two-dimensional (2D) nucleus, i.e., bilayer comprised of one tetrahedral cell.

FIG. 17(B) illustrates a very small initial two dimensional (2D) nucleus comprised of one (1) tetrahedral cell 132A that has bonded to the step-free substrate surface 66. This initial 2D nucleus does not have enough vertical bonds 114 to have its position laterally fixed with respect to a step-free substrate surface 66 on which the first 3C-SiC bilayer is being placed.

Figure 17C:
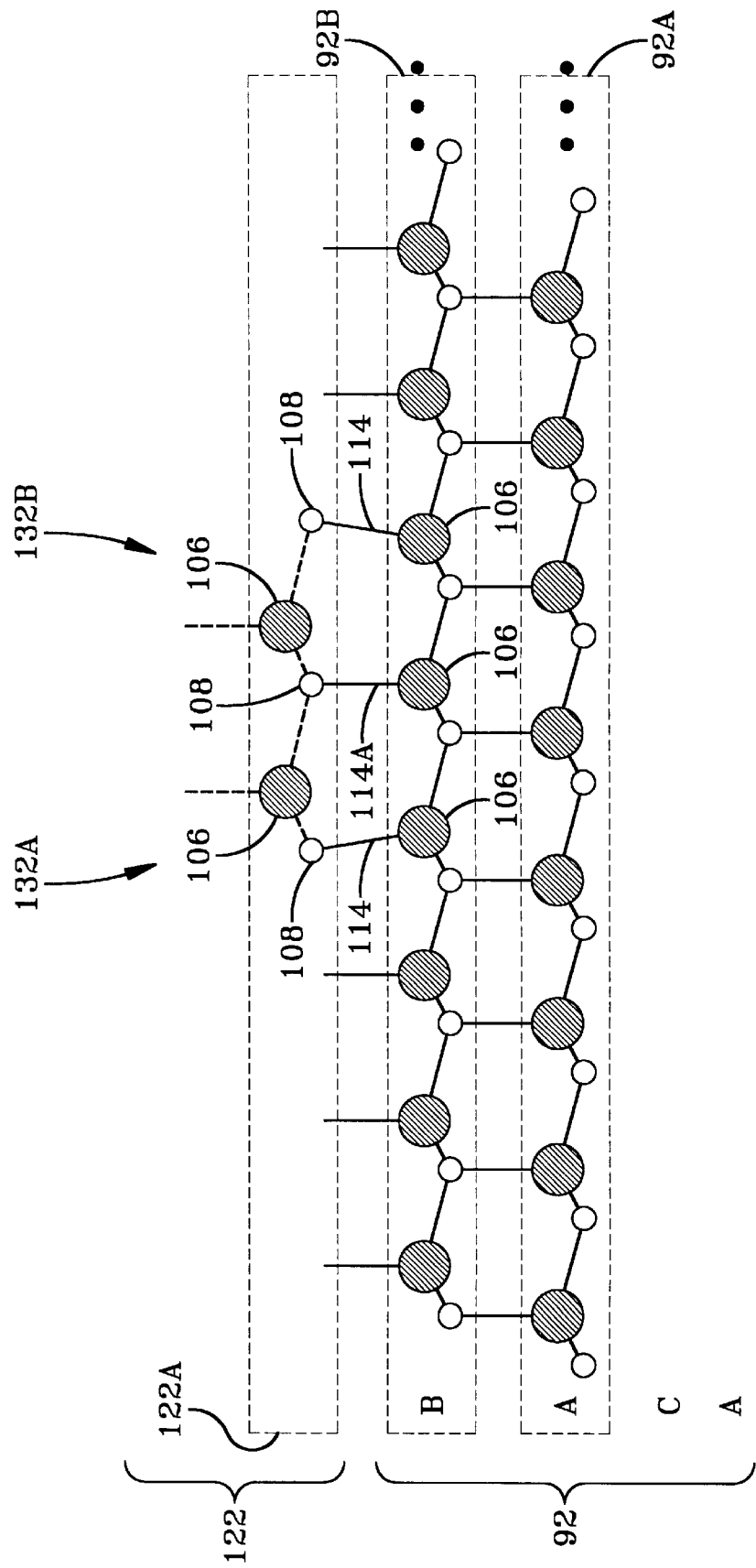
FIG. 17(C) illustrates that the lateral position of the first tetrahedral cell of FIG. 17(B) has shifted, after further deposition to incorporate a second tetrahedral into the bilayer island, laterally slightly to the left as compared to that of FIG. 17(B)

FIG. 17(C) illustrates that the lateral position of the first tetrahedral cell 132A of FIG. 17(B) shifts laterally slightly to the left compared to that of FIG. 17(B) when a second tetrahedral cell 132B is added by the step-flow expansion of the nucleus. The nucleus, with only a few vertical bonds, (i.e., only a few tetrahedral cells 132A and 132B) still has some lateral mobility.

Figure 17D:
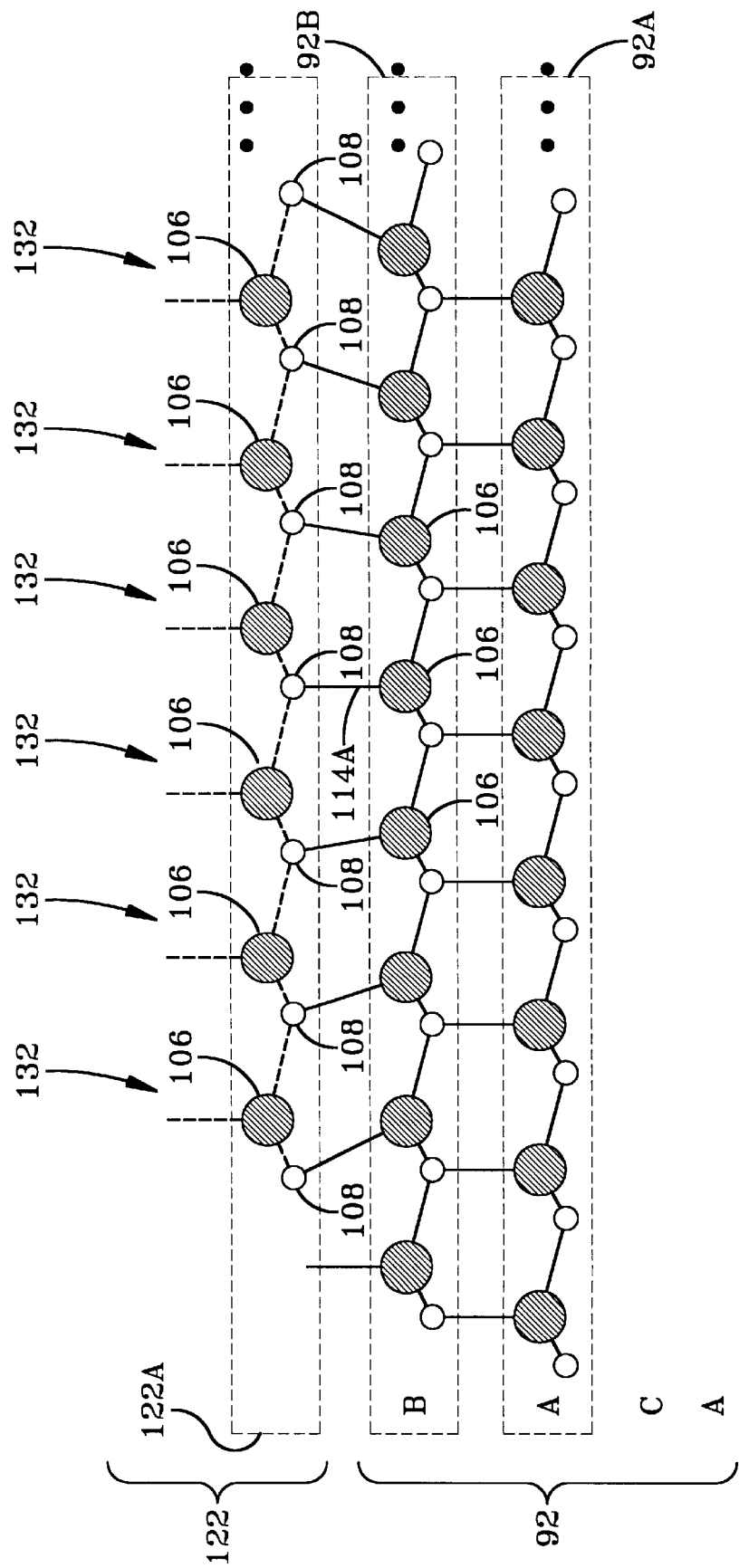
FIG. 17(D) illustrates the lateral position of the first tetrahedral cell, as well as other tetrahedral cells of the bilayer island, becomes anchored after sufficient number of tetrahedral cells have obtained their desired bonding.

FIG. 17(D) illustrates that once 2D nucleus has a sufficient number of tetrahedral cells 132 (i.e., sufficient number of vertical bonds), the lateral position of the nucleus becomes anchored with respect to the substrate, so that an existing nucleation island of sufficient size, such as bilayer 78A illustrated in FIGS. 7–12, does not move laterally when new atoms (tetrahedral cells) are incorporated into the bilayer 78A. The details of the desired bonding related to the present invention, may now be further described with reference to FIG. 18.

Once heteroepitaxial growth of 3C-SiC is initiated by 2D nucleation followed by step-flow lateral expansion described previously with reference to FIG. 7, the evolution of the bonding of the adjacent layers begins along the flat 4H-SiC/3C-SiC interface, which may be further described with reference to FIG. 18.

Figure 18:
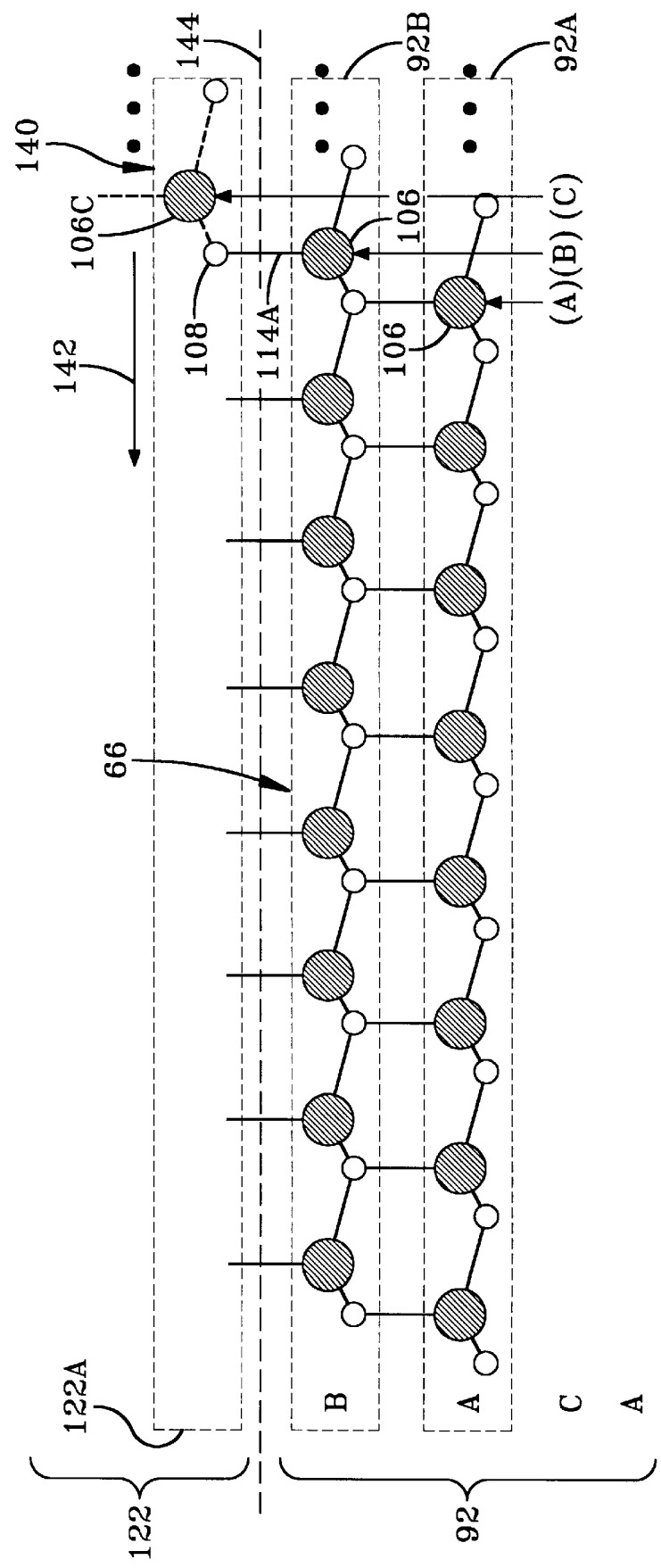
FIG. 18 illustrates the bonding between the first layer in the 3C-SiC bilayer and the upper layer of the 4H-SiC structured polytype associated with leftward expansion of a single anchored 3C-SiC bilayer island.

FIG. 18 illustrates the, topmost two bilayers 92A and 92B of the 4H-SiC stacking arrangement 92 of the step-free substrate surface 66, wherein upon bilayer 92B is growing a first bilayer 122A of the 3C-SiC structure. It should be noted that the silicon atom 106C shown in FIG. 18, and also to be discussed with reference to FIGS. 20 and 20A, carries the (C) lateral position relative to the (A) and (B) lateral positions of silicon atoms 106 in bilayers 92A and 92B. Also, bilayer 122A corresponds to the edge of the 3C-SiC island 78A previously described. It should be noted that the bilayer 92B carries the B position in the stacking order of the 4H-SiC polytype and has a (B) lateral position relative to the silicon atom 106C and, furthermore, the bilayer 92A carries the A position in the stacking order of the 4H-SiC polytype and has a (A) lateral position relative to the silicon atom 106C. Except for one tetrahedral cell which is shown, the bilayer island atoms already bonded in the growing 3C-SiC bilayer island 122A extend to the right of FIG. 18, not shown herein.

The lateral position of the 3C-SiC bilayer island relative to the substrate is fixed by a large number of vertical bonds 114 already formed between the expanding island and the substrate in a manner as already described with reference to FIG. 17(D). It should be noted that the above statement is not correct in cases where the bilayer island is very small only having a very small number of vertical bonds 114, in which case the lateral position of such a small bilayer island is not fixed because the bonds are not sufficiently strong to hold the island in the exact same place laterally in a manner as already described with reference to FIGS. 17(B) and 17(C). However, after any 3C-SiC bilayer island reaches a certain lateral size with a sufficient number of vertical bonds 114, the total bonding force between the substrate and the island becomes sufficient to prevent any lateral movement of the sufficiently large 3C-SiC bilayer island relative to the substrate.

FIG. 18 illustrates the bonding between the adjacent heteroepitaxial layer 122A and the bilayer 92 having the B position in the stacking arrangement 92 of the 4H-SiC structure. The bonding between bilayer 122A and the bilayer 92B is shown in FIG. 18 at the left edge 140 of a large 3C-SiC bilayer island that is expanding further in a leftwise direction 142. A bond 114A, in its unstressed condition, crossing a basal plane 144 is shown between the carbon atom 108 of bilayer 122A and the silicon atom 106 of the bilayer 92B. The lateral position of these atoms of the bilayer 122A is fixed by all the atoms and bonds of the sufficiently large 3C-SiC island that are not shown in FIG. 18 because they reside to the right of the figure. The lateral positions of the atoms in bilayer 92B are also fixed by the bulk crystal bonding. The continuation of the bonding between the bilayers 122A and 92B, as the large 3C-SiC bilayer island further expands via step-flow growth in leftwise direction 142, may be further described with reference to FIG. 19.

Figure 19:
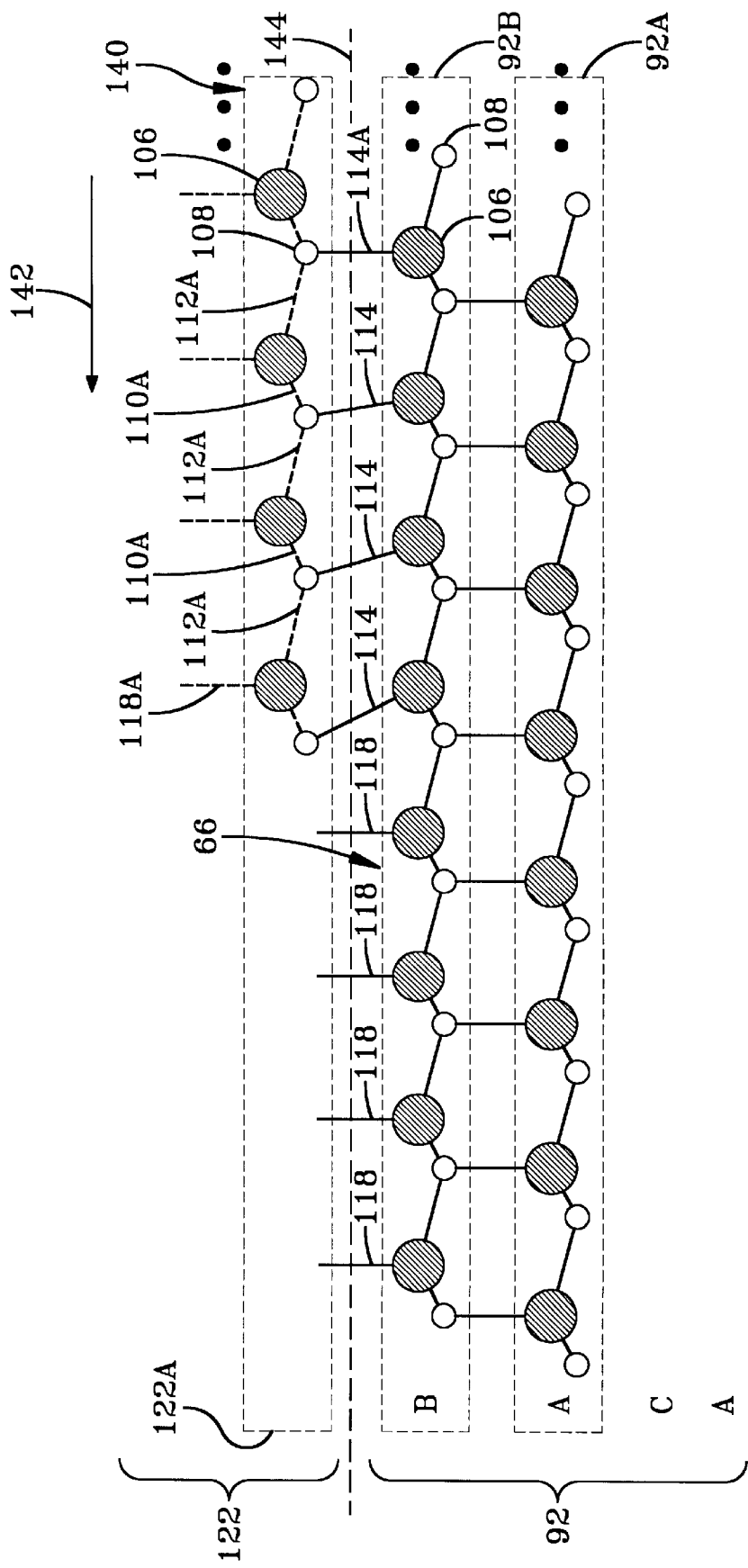
FIG. 19 illustrates the continuation of the bonding of FIG. 18 as the anchored 3C-SiC island expands via step-down growth to the left.

FIG. 19 illustrates the bonding between bilayers 122A and 92B as the island has step-flow expanded further to the left. As seen in FIG. 19, the difference in relative lateral positions of the silicon atoms 106 in the bilayers 122A and 92B begin to increase, causing the bonds 114 across the basal plane 144 to be placed into stressed positions. For this situation shown in FIG. 19, the three nearest neighbor bonds for each atom 110A (two bonds), 112A (one bond), within the bilayer 122A exert stronger force on atoms in the bilayer 122A than the respective single bond 114 that is crossing over the basal plane 144. Thus, the three bonds 110 (two bonds), 112 (one bond) within the bilayer 122A determine the lateral position of the silicon 106 and carbon 108 atoms within the bilayer 122A overcoming and stretching the bond 114 crossing the basal plane 144. Recall the lateral position of the right most atom in bilayer 122A is fixed by the rest of the island that resides to the right of FIG. 19. Thus, the bonds 114 that cross the basal plane 144 deform instead of establishing the lateral positions of atoms in the expanding bilayer island. Further important aspects of stress relief between the substrate and the expanding bilayer may be further described with reference to FIG. 20.

Figure 20:
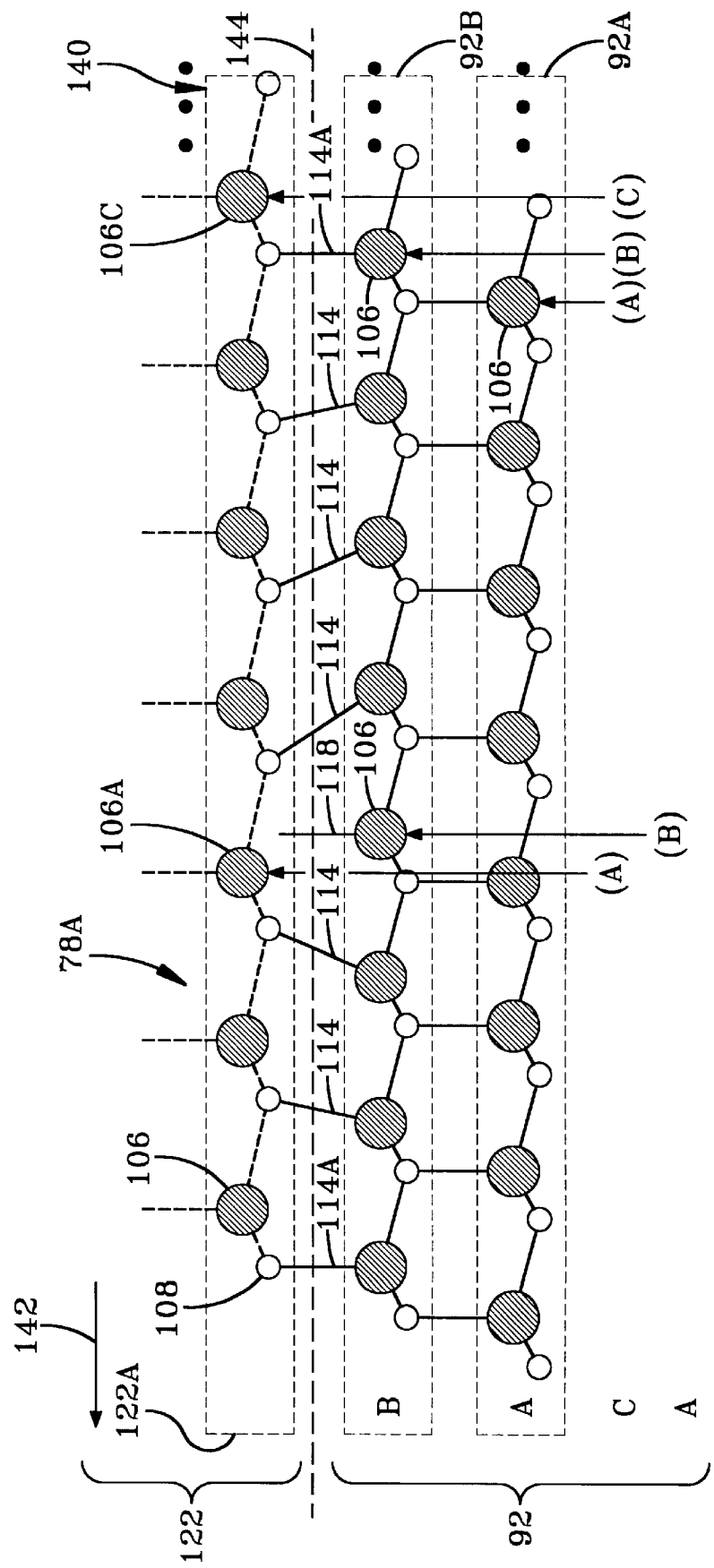
FIG. 20 illustrates the completed bonding between the first layer of the 3C-SiC film and the upper layer of the 4H-SiC substrate polytype without causing defects in the 3C-SiC film.

As seen in FIG. 20, the bilayer 122A has further step-flow expanded laterally to the left, and has established more bonds with bilayer 92B. FIG. 20 illustrates silicon atoms 106A and 106C of bilayer 122A to be further described hereinafter with reference to FIG. 20A, wherein silicon atom 106A has a (A) lateral position relative to the shown silicon atom 106 of the bilayer 92B, which by definition all have a (B) lateral position. Similarly, silicon atom 106C has a (C) lateral position relative to the silicon atoms 106 of the bilayer 92B, all of which have a (B) lateral position. The silicon atoms 106 of the bilayer 92A all have an (A) lateral position. The bonding between the silicon and carbon atoms 106 and 108, respectively remain intact, as well as the adjacent bonding 114 between the bilayers 122A and 92B. However, as seen in FIG. 20 there is one dangling bond 118 (center of FIG. 20) that occurs so as to relieve stress between these bonding bilayers 122A and 92B and does not create any stacking faults. The bonding between the bilayers 122A and 92B provides a single bilayer of the heteroepitaxial film material having the first bilayer 122A on the step-free surface provided by the bilayer 92B.

The desired bonding between the bilayers 122A and 92B, shown in FIG. 20 is the same desired bonding and desired formation between the first 3C-SiC bilayer 78A and the stacking arrangement 76 of 4H-SiC polytype, previously described with reference to FIG. 9.

Furthermore, the atomic spacing of the new surface formed by the bilayer 122A is now ideally suited for continued growth of additional 3C-SiC bilayers on its top to reach a desired heteroepitaxial film thickness. All of the mismatch in lateral atomic spacing between the substrate and the heteroepitaxial film is overcome in the first heteroepitaxial bilayer.

Figure 20A:
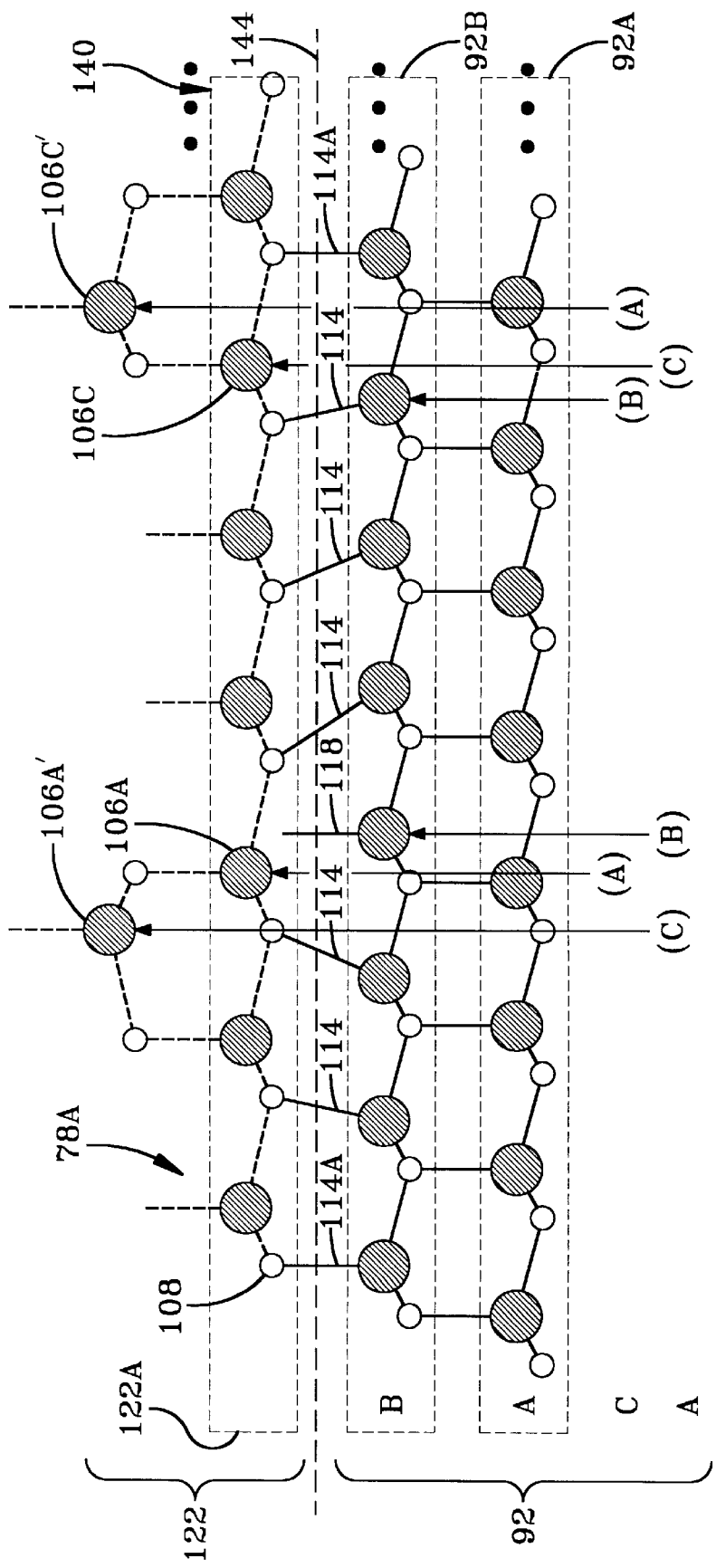
FIG. 20A illustrates the undesired possible nucleation of opposite rotations of 3C-SiC on top of the step-free completed first heteroepitaxial bilayer.

In order that additional heteroepitaxial (e.g. 3C-SiC) bilayers grow in a defect-free manner, it is essential that the second bilayer be grown from a single-island nucleus as is required for the first bilayer. FIG. 20A illustrates a possible undesired effect when more than one island nucleates on the first heteroepitaxial bilayer. The undesired effect is the growth of two variants (i.e., two crystal orientations that are rotated 180° with respect to one another) of 3C-SiC grown on 6H-SiC.

In order to appreciate the teachings of FIG. 20A, a discussion of polytype control will be included in the following paragraphs. The nature and mechanisms of polytype control during crystal growth is still a subject of current research and debate. However, based on experimental observations, there appears to be two primary mechanisms that control the polytype of a growing crystal.

Mechanism 1, often referred to as a "kinetic" growth mechanism, is described as follows: When growth takes place at steps (i.e., stepflow growth), the sides of the steps provide the template for maintaining the polytype, thus, the result is a homoepitaxial film. These steps can be provided by the tilt angle of the polished wafer surface with respect to the basal plane, and/or steps emanating from dislocations. For example, the growth of 4H-SiC and 6H-SiC boules that are subsequently cut and polished into commercial wafers is controlled by spiral steps emanating from screw dislocations. Commercial 6H and 4H-SiC substrates are cut at tilt angles of 3.5° and 8° to provide an abundance of steps to support homoepitaxial growth. Also, after initial layers of defective heteroepitaxial films have been nucleated, the film contains dislocations that provide steps for continued growth of the heteroepitaxial film. For example, threading dislocations are observed to be the stepsources for continued growth of 2H-GaN films following initial nucleation on sapphire or 6H-SiC substrates.

Mechanism 2, often referred to as a "thermodynamic" growth mechanism, is described as follows: When growth takes place by 2D nucleation on the middle of a basal plane terrace, the most thermodynamically favored crystal structure will form. For SiC, the 3C polytype is experimentally observed to be the thermodynamically preferred polytype when 2D terrace nucleation occurs on 6H- or 4H-SiC substrates, so that the resulting film is heteroepitaxial. In a uniform tetrahedrally bonded crystal structure, there are only three possible bilayer atomic stacking positions of silicon atoms (A), (B) and (C) that were previously described with respect to FIGS. 14 and 15A. Because the thermodynamically preferred polytype is 3C-SiC, the lateral position of a silicon atom in a new 2D bilayer nucleus on a terrace will not occupy the same lateral position as silicon atoms in the underlying two bilayers. For example, if the top two bilayers on a terrace have silicon atom lateral positions (B) and (C), then the lateral silicon atom position (A) is thermodynamically favored for a new 2D terrace nucleus. Likewise, if the top bilayers were (A) and (C) stacking, the new 2D nucleus on that terrace would thermodynamically take up the (B) position. Therefore when 2D nucleation occurs, the stacking of the nucleus is determined by (i.e., excluded from being) the stacking position of the previous two bilayers. After the initial 2D nucleation establishes the stacking, that stacking is maintained as stepflow growth expands the bilayer nucleus over the rest of the basal plane terrace.

The growth of a heteroepitaxial film on a step-free basal plane substrate, as described in the invention, is controlled by mechanism 2 (i.e., thermodynamic).

The first heteroepitaxial bilayer overcomes the mismatch in lateral atomic spacing between the substrate and the heteroepitaxial film. However, as will be explained with reference to FIG. 20A, the relative position (A), (B) and (C) (of silicon atoms) in the top bilayer (92B) of the substrate and the first bilayer (122A) of the film vary with lateral position. This will change the thermodynamically preferred lateral position of a silicon atom in a new 2D bilayer nucleus forming on top of the first bilayer in a manner that may result in one crystallographic orientation of a first nucleus at a first location and a different orientation of a second nucleus at a second location. The reason for this behavior is that the mismatch in lateral atomic spacing between bilayers 92B and 122A caused the relative lateral atomic positions of the silicon atoms to vary in a spatially dependent manner.

In order to overcome detrimental effects of the spatially varying relative position of silicon atoms in the bilayers 92B and 122A, the second bilayer of the heteroepitaxial film must be grown from single island nucleation and complete its lateral growth to the mesa edge before a second nucleation occurs on the first bilayer.

FIG. 20A illustrates the possible detrimental effects if two 2D nucleation events take place on the first bilayer 122A. FIG. 20A shows a completed first heteroepitaxial bilayer 78A that has been formed on a step-free 4H-SiC mesa surface as previously described with respect to FIGS. 18–20. The 2D nucleation (106 A') of a bilayer island (consisting of one tetrahedral cell with one silicon atom) is shown on the left side of the surface, along with a 2D nucleation (106C') of another bilayer island (consisting of one tetrahedral cell with one silicon atom) on the right side of the surface. As denoted in FIG. 20A, the lateral position of the silicon atom 106A (in the first 3C bilayer 122A) below the left nucleation (106 A') is (A). By definition all silicon atoms in the top 4H bilayer 92B are in B positions. Therefore, the 2D nucleation that occurs above these atoms takes the thermodynamically preferred lateral position (C). Because of the lattice mismatch between the 4H layer 92B and the first 3C bilayer 122A, the relative lateral positions of silicon atoms of the right side 2D nucleation (106 C') is different than the left side 2D nucleation (106 A'). The lateral position of the silicon atom 106C (in the first 3C bilayer 122A) below the right nucleation (106 C') is (C). From this, and since the silicon atoms of the top 4H bilayer 92B are in a (B) position, it follows that (106 C') takes the thermodynamically preferred lateral position (A). Thus, the right side 2D nucleation (106 C') undesirably nucleates the opposite rotational (i.e., twin) variant of 3C from the left side nucleation (106 A'). When these nuclei expand via stepflow, a double-positioning boundary (DPB) crystal defect will occur at the point of coalescence. Therefore, in order to preclude the possibility of nucleating more than one 3C-SiC variant, the second bilayer must also be grown under conditions that favor nucleation of first island followed by stepflow expansion to entirely cover the first bilayer prior to nucleating a second island on the first heteroepitaxial bilayer surface.

Single island nucleation is only necessary for the first two bilayers of the heteroepitaxial layer. After the atomic positions of the first two bilayers are correctly established, a 2D nucleation that starts the formation of the third heteroepitaxial bilayer will take on the thermodynamically preferred stacking position based on the stacking of the first two heteroepitaxial bilayers. Because there is no lattice mismatch between the first two bilayers, the relative lateral positions of the silicon atoms will be the same regardless of where 2D nucleation occurs on the surface of the second heteroepitaxial bilayer. Thus, after the first two heteroepitaxial bilayers completely cover the mesa surface, further growth of the heteroepitaxial layer can proceed under conditions where multiple nucleation islands are permitted for additional bilayers.

It should now be appreciated that the practice of the present invention provides for the growth of a heteroepitaxial film having first bilayer 122A that is placed on a 4H-SiC structure arrangement 90 (FIG. 14) without having any stacking faults. This is accomplished because, in a manner previously described, with reference to FIG. 9 for the first 3C-SiC bilayer island 78A, the first bilayer island 122A is allowed to grow across the complete atomically flat surface provided by the bilayer 92B without any interference that could otherwise be caused by placing another bilayer island along side of the first bilayer 122A. The interfering placement of the second bilayer island with the first bilayer island 122A is the same as the interference of the second 3C-SiC island 78B with the first 3C-SiC island 78A previously described with reference to FIG. 10.

The benefits of the present invention may be better appreciated by a description of the prior art that occurs during the practice of the process of the U.S. Pat. No. 5,915,194, which may be further described with reference to FIGS. 21–23.

Figure 21:
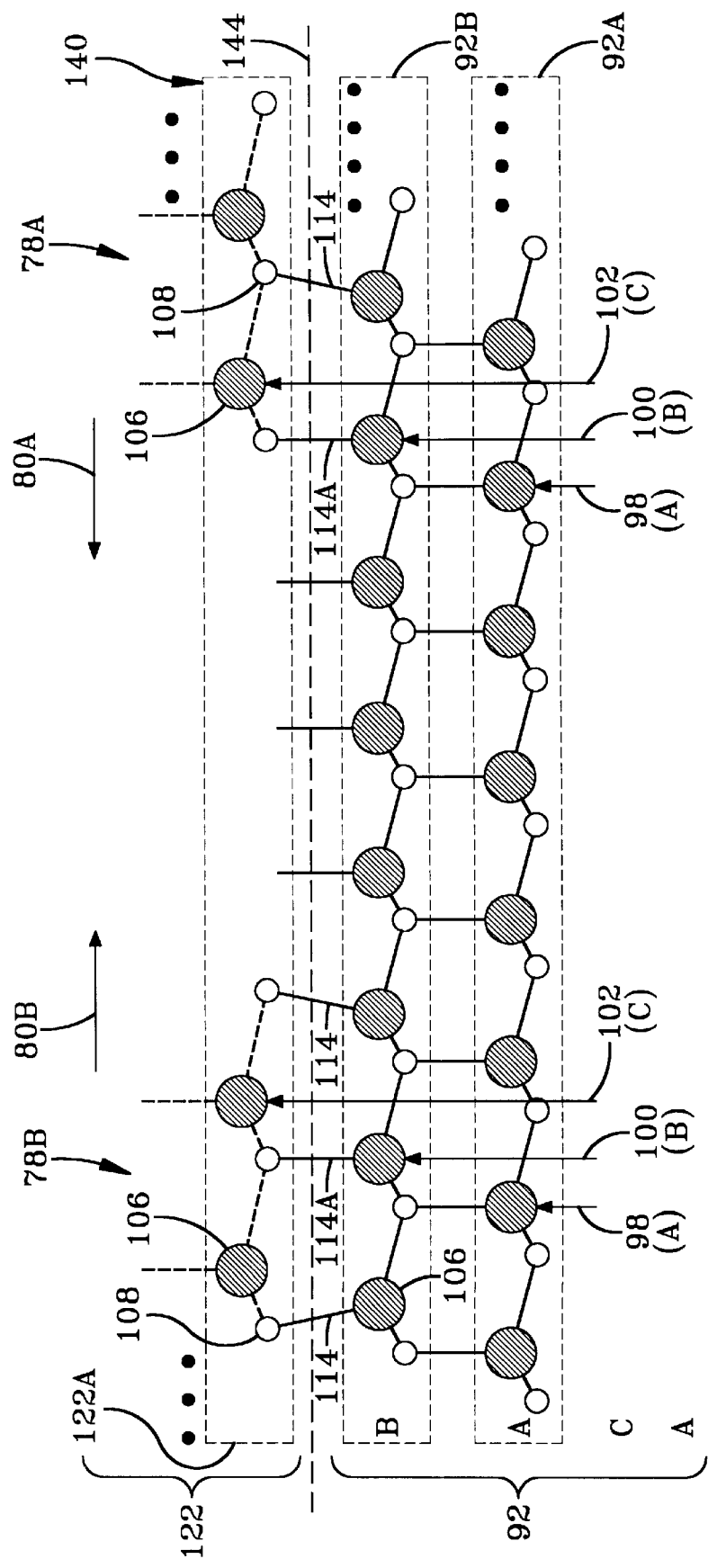
FIGS. 21, 22, and 23 illustrate the prior art formation of the defective coalescence between two anchored 3C-SiC islands, one expanding leftward and the other expanding rightward, causing a stacking fault defect.

FIG. 21 illustrates the first and second 3C-SiC islands 78A and 78B growing to form the first bilayer 122A and having bonds 114 emanating from their carbon atoms 108 that cross over the basal plane 144 to join with the silicon atoms of bilayer 92B. The lateral position of the silicon atoms 106 are identified by the dimensional lines 98(A), 100(B) and 102 (C) and growth of the 3C-SiC islands 78A and 78B is toward each other in directions 80A and 80B. The 3C bilayer island 78A on the right hand side extends to the right much further than the edge of FIG. 21, and is sufficiently large that lateral positions of all atoms in the island are fixed with respect to the substrate. Likewise, the 3C bilayer island 78B on the left hand side extends to the left much further than the edge of FIG. 21, and is sufficiently large so that the lateral positions of all atoms in the island are fixed with respect to the substrate. The lateral expansion of these islands via lateral growth of the steps proceeds in a manner previously described with respect to expansion for a single island described in FIGS. 18–20.

Figure 22:
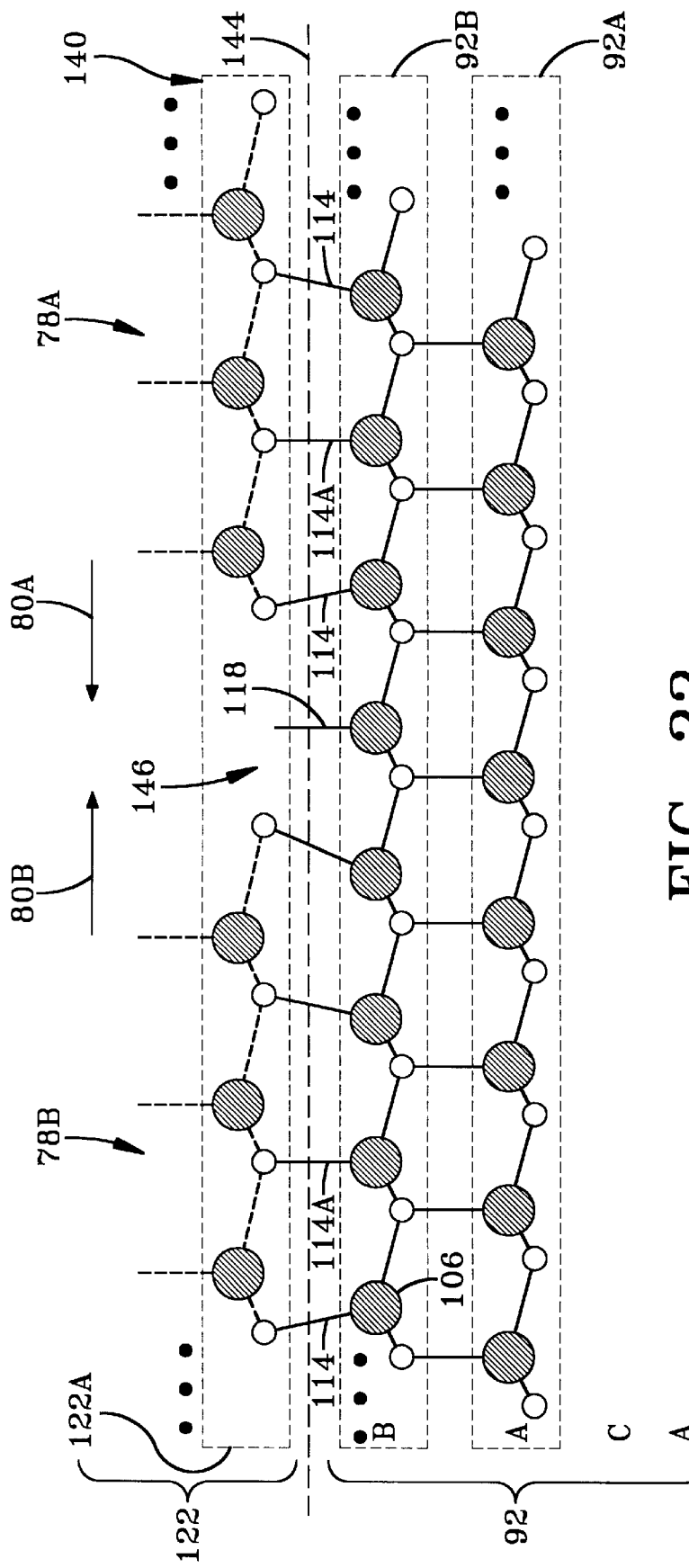

FIG. 22 illustrates the 3C-SiC islands 78A and 78B of FIG. 22 growing toward each other and creating a region 146 therebetween. Further, FIG. 22 illustrates the bonds 114 between the 3C-SiC islands 78A and 78B as deforming toward a stressed condition as the difference between the positions of the silicon atoms 106 in the 3C-SiC islands and the 4H-SiC bilayer 92B increases.

Figure 23:
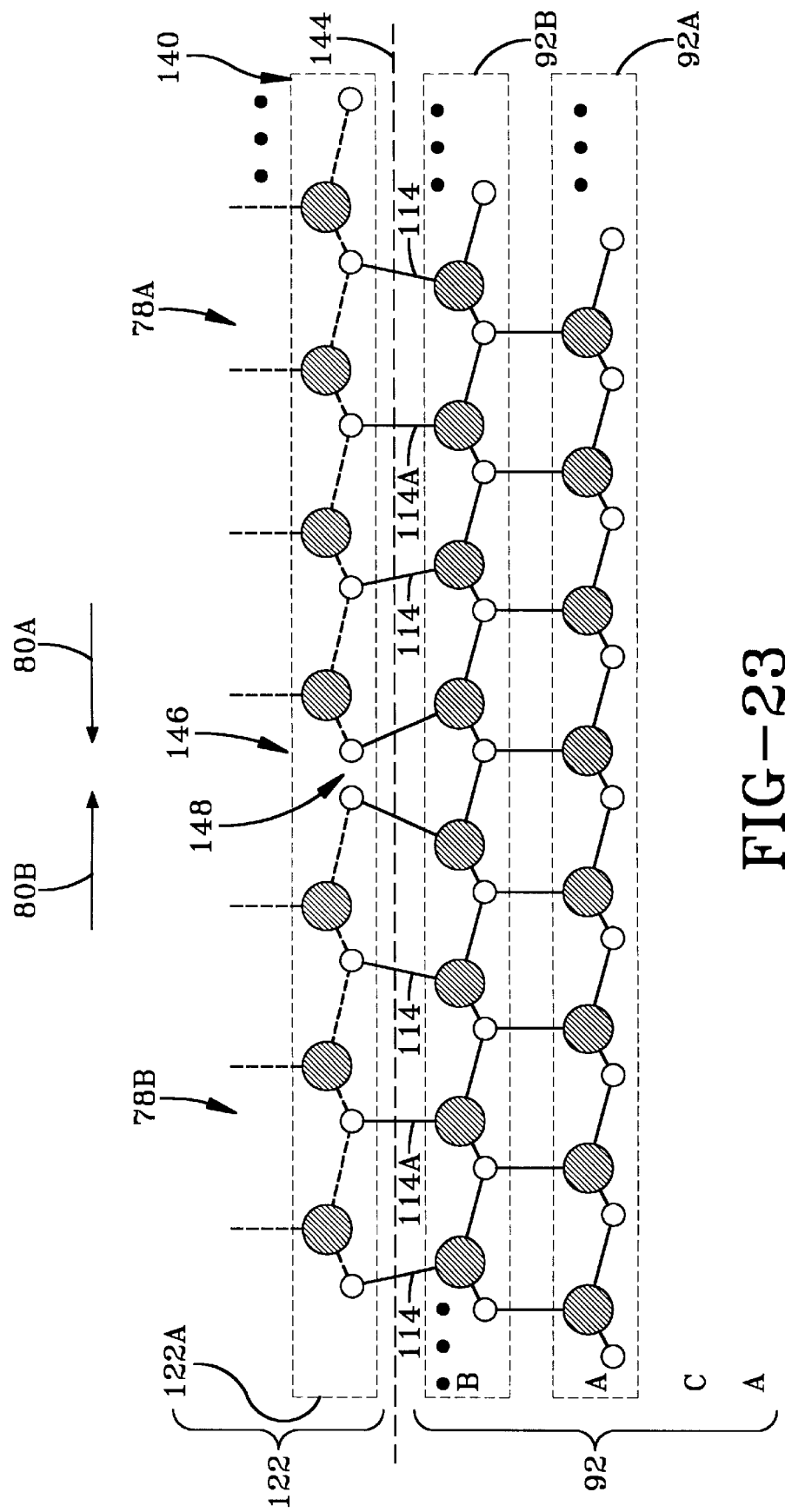

FIG. 23 illustrates the completed state of growth of 3C-SiC islands 78A and 78B, wherein a defective coalescence 148, contained within region 146 and between the 3C-SiC islands 78A and 78B now exists. The defective coalescence 148 creates stacking errors in the same manner as described for the defective coalescence 84 of FIG. 12.

It should now be appreciated that the practice of the present invention does not suffer the incoherent coalescence faults of the prior art process illustrated in FIGS. 21, 22, and 23.

Although the practice of the present invention prefers that the growth of multiple 3C-SiC islands 78A and 78B not be allowed to grow side-by-side to form one individual layer of the 3C-SiC structure, it is possible on rare random occasions that non-defective coalescence of multiple islands 78A and 78B can be achieved thereby, eliminating any stacking faults, but the probability of non-defective coalescence for such conditions is much less than 50% for two 3C-SiC islands 78A and 78B on an atomically flat 4H-SiC surface. The successful probability rapidly vanishes as the number of 3C-SiC islands are grown on a given mesa increases. However, for the sake of completion of the discussion of the principles of the present invention, the remote possibility of two 3C-SiC islands 78A and 78B being grown without creating stacking faults may be described with reference to FIGS. 24, 25, and 26.

Figure 24:
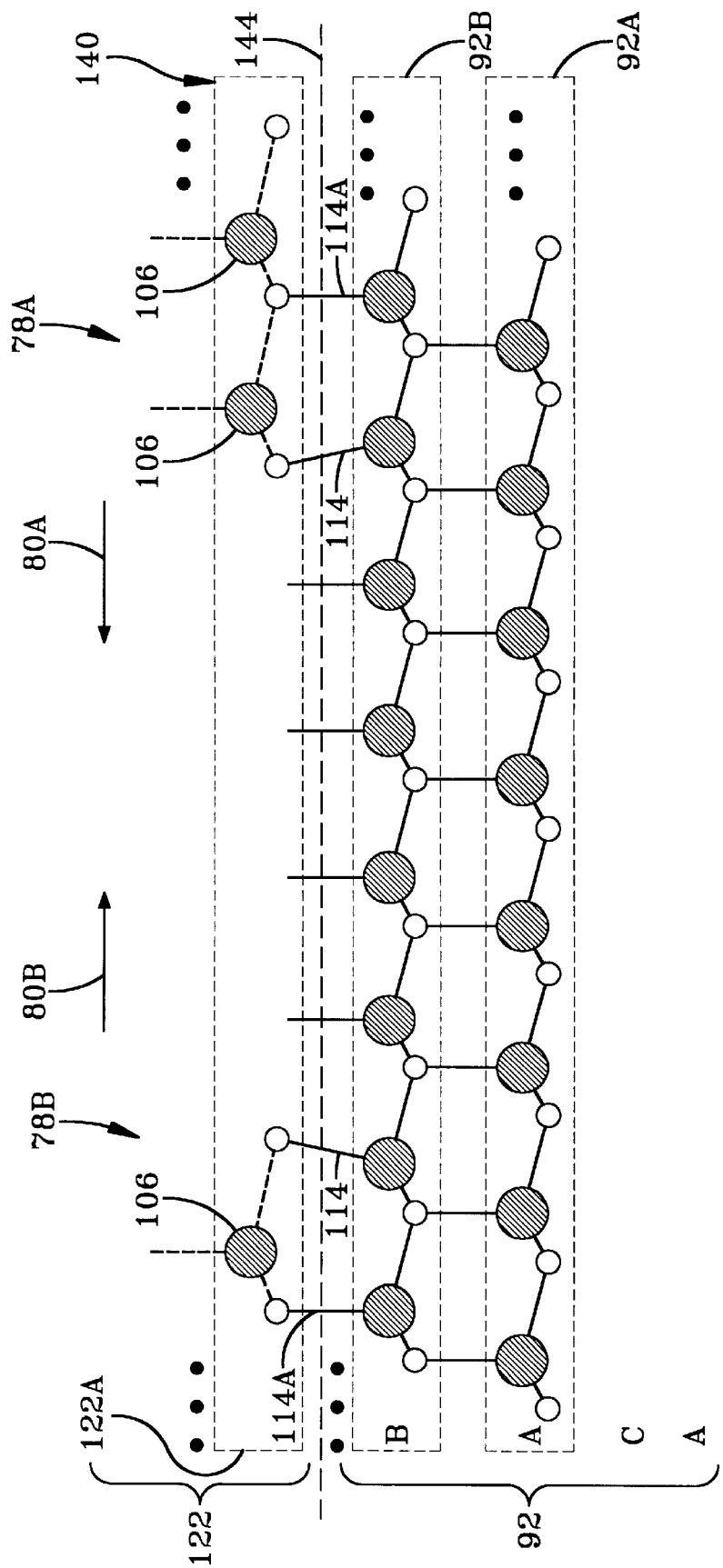
FIGS. 24, 25, and 26 illustrates the slight (uncontrollable) possibility of providing for a simultaneous growth between two anchored 3C-SiC islands without the creation of any defective coalescence that creates a defect.

FIG. 24 illustrates the right hand edge of a large 3C-SiC island 78A that extends well past the edge of the figure and whose lateral atomic positions are all anchored with respect to the substrate by numerous bonds to the substrate in a manner as already described with reference to FIG. 17(D), but not shown in FIG. 24. Likewise, the 3C-SiC island 78B is on the right hand edge of a large 3C-SiC bilayer island of which only the right-most silicon atom 106 is shown whose lateral position is fixed by numerous bonds to the substrate not shown in FIG. 24 because most of the island is off the left side of the figure. Both 3C-SiC islands 78A and 78B growing laterally toward each other in a direction indicated by directional arrows 80A and 80B. Both islands continue to grow as shown in FIG. 25.

Figure 25:
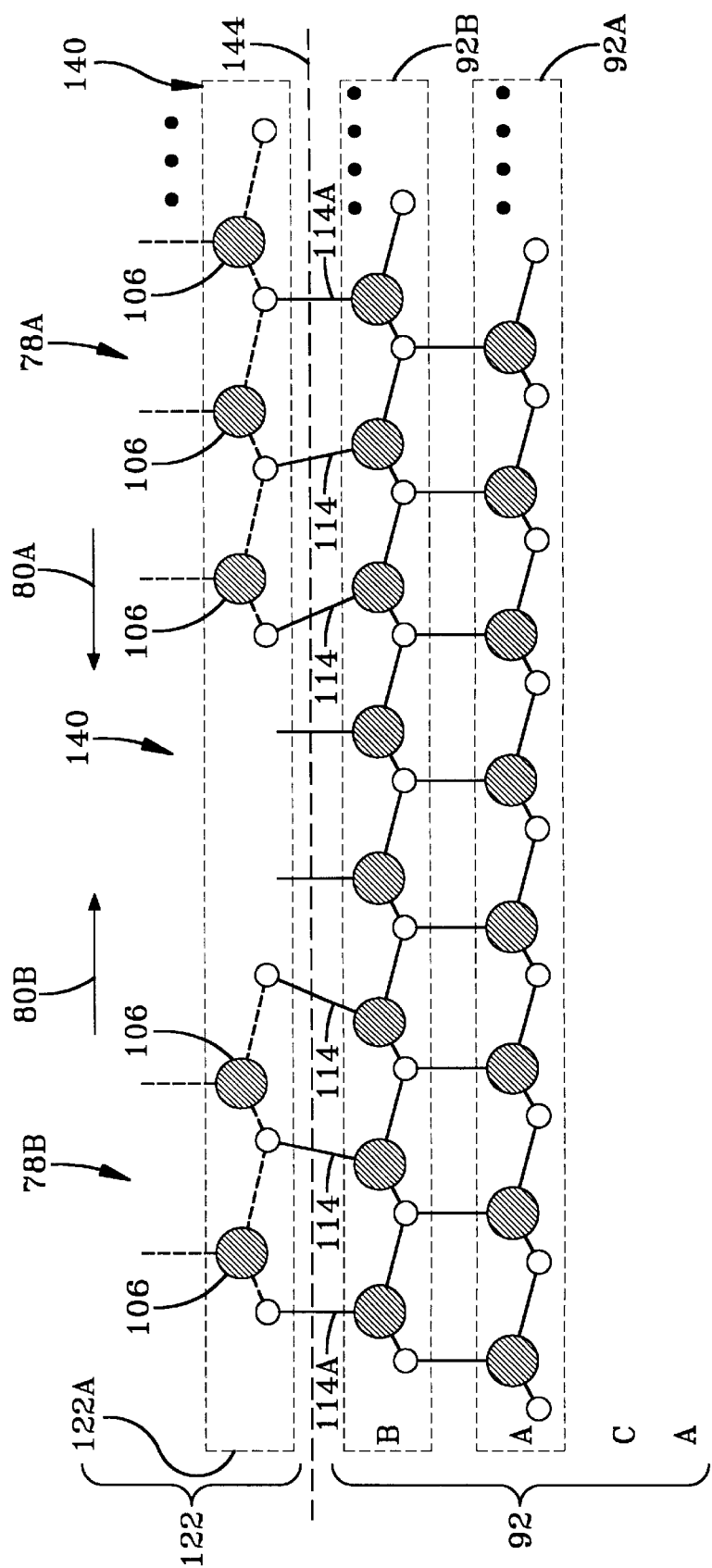

FIG. 25 indicates that the first 3C-SiC island 78A and second 3C-SiC island 78B have bonded with the bilayer 92B and are converging toward each other. The growth of both 3C-SiC islands 78A and 78B is continued under controlled conditions and the 3C-SiC islands 78A and 78B successfully merge with each other to form the defective-free bilayer 122A as shown in FIG. 26.

Figure 26:
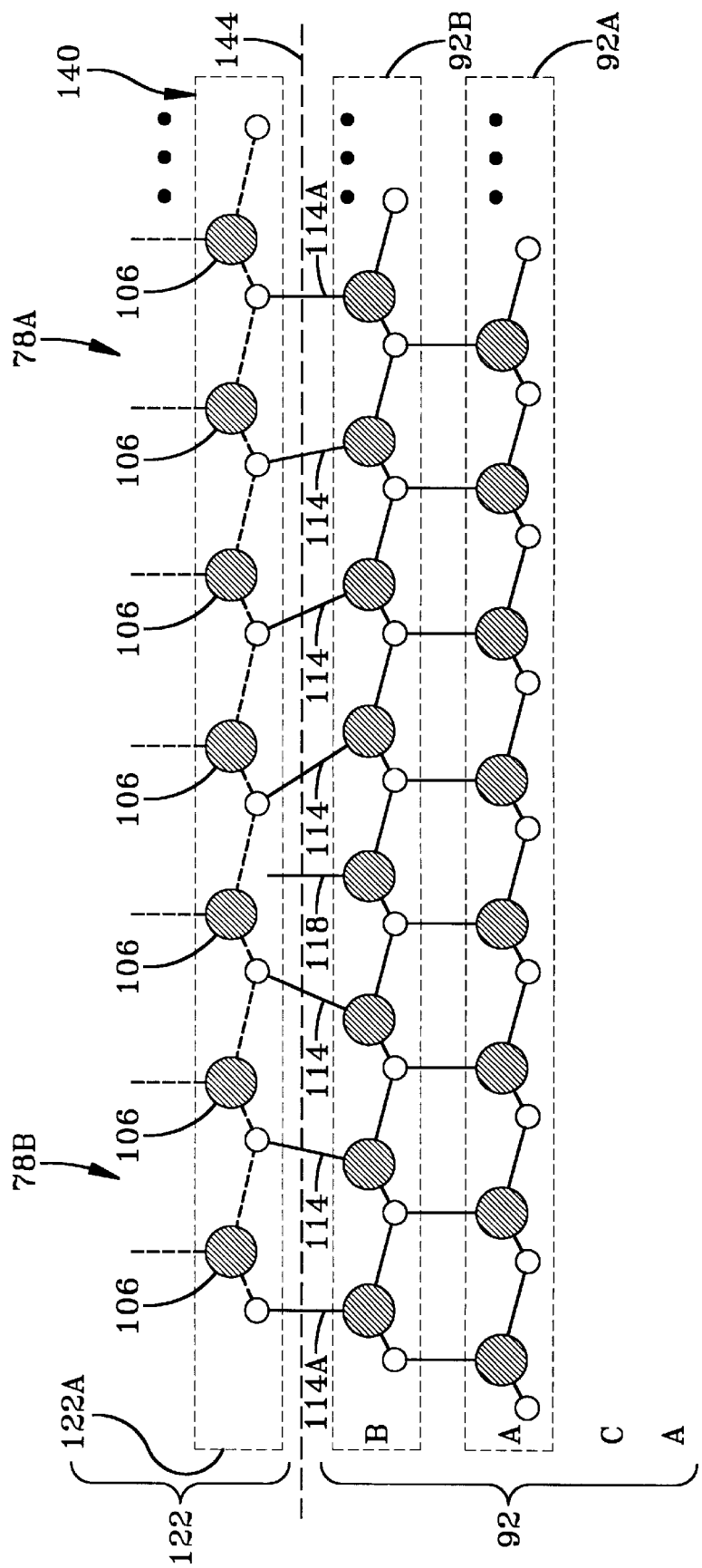

FIG. 26 illustrates that all of the silicon and carbon atoms 106 and 108 of bilayer 122A are bonded to each other and the carbon atoms 108 of the bilayer 122A are successfully bonded to the bilayer 92B. Further, FIG. 26 shows one dangling bond 118 which does not create a defective coalescence which would otherwise create stacking errors.

It is important to understand the reason why non-defective coalescence was achieved in FIGS. 24–26 as opposed to the defective coalescence achieved in FIGS. 21–23. The lateral distance between unstressed bonds 114A, those bonds that are depicted as exactly vertical in the figures fixed at the edge of islands 78B and 78A is different in FIG. 21 than in FIG. 24. This distance is random, because the distance between the starting locations of any two islands nucleated on the step-free surface will be random. In FIG. 21 unstressed bonds 114A are separated by a distance of six (6) 4H-SiC substrate lateral Si-atom spacings (recalling that lateral Si-atom spacing is equal to the lateral C-atom spacing), while in FIG. 24 these unstressed bonds 114A are separated by seven (7) lateral 4H-SiC substrate lateral C-atom spacings. Recall the discussion of FIG. 16, wherein seven (7) C-atom lateral spacings in the depicted representation of a 4H-SiC bilayer matches up with six (6) C-atom lateral spacings in the depicted representation of an unstressed 3C-SiC bilayer. Thus, the lateral atomic distance of seven (7) lateral 4H-SiC C-atoms chosen for the FIG. 24 illustration leads to non-defective coalescence because this lateral distance exactly matches six (6) lateral C-atom spacings in the depicted unstressed 3C-SiC bilayer. When the distance between unstressed bonds 114A of adjacent large islands is not a multiple of seven (7) 4H-SiC lateral atomic spacings, such as is the case in FIG. 21, coherent coalescence will not take place.

When multiple 3C-SiC bilayer islands 2D nucleate on an atomically-flat mesa surface, the distance between the islands is random. There is no driving force to make multiple islands nucleate the proper distance apart to enable non-defective coalescence as illustrated in FIGS. 24–26. On the contrary, the probability that two islands will nucleate an improper lateral distance apart as illustrated in FIGS. 21–23 causing defective coalescence is more than twice as large as the probability that they will nucleate and coalesce non-defectively. Thus, in order to reproducably obtain a good yield of heteroepitaxial films free of coalescence defects, the nucleation of the first heteroepitaxial bilayer on each particular atomically-flat mesa should be limited to a single 3C-SiC island as described in the present invention. Any process that permits nucleation of multiple 3C-SiC bilayer islands on the atomically-flat surface will be inferior in that it will favor incoherent lateral coalescence illustrated in FIG. 23.

Although it is preferred that the first 3C-SiC bilayer island, such as 78A, complete its growth across the complete island before additional bilayers are added to the heteroepitaxial film. Additional bilayers can nucleate and grow on top of the first heteroepitaxial bilayer island without suffering detrimental effects and may be further described with reference to FIG. 27 which is composed of FIGS. 27(A) and 27(B).

Figure 27A:
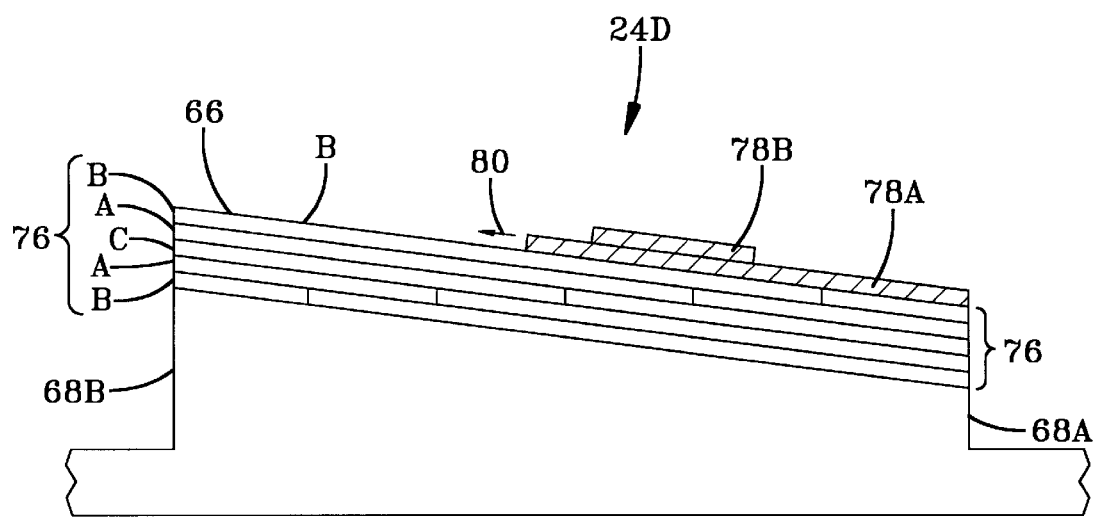
FIG. 27 is composed of FIGS. 27(A) and 27(B) that illustrate the growth of a second 3C-SiC bilayer on top of the first 3C-SiC bilayer island in accordance with the practice of the present invention.

As seen in FIG. 27(A), that before the growth of the first 3C-SiC bilayer island 78A across the entire atomically-flat surface 66 of the SiC wafer 24D is accomplished, a second 3C-SiC bilayer island 78B is initiated on top of the first 3C-SiC bilayer island 78A, which may be further described with reference to FIG. 27(B). It is important to note that because the 3C-SiC bilayer island 78B is on top of the 3C-SiC bilayer island 78A, the second 3C-SiC island 78B is not impeding the lateral growth of the first 3C-SiC bilayer island 78A. Furthermore, because bilayers 78A and 78B have the same lateral lattice spacing and because they are the same polytype, there is no stress and no defects generated by having both layers expanding laterally at the same time.

Figure 27B:
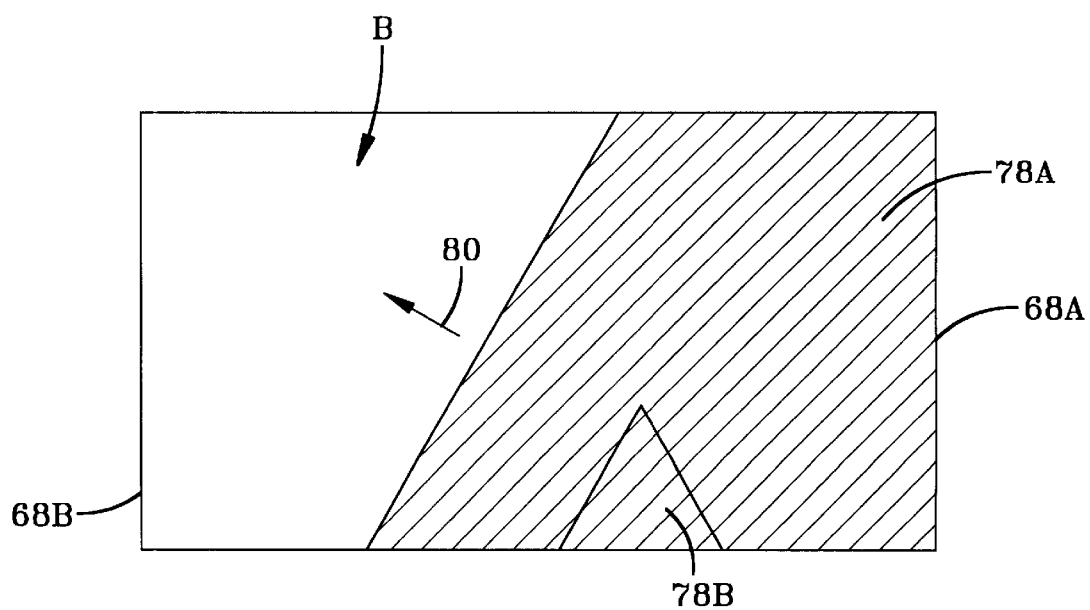

As seen in FIG. 27(B), the first 3C-SiC bilayer island 78A will grow and cover the complete atomically flat surface 66 without any interference from the second 3C-SiC bilayer island 78B on its top. The second 3C-SiC bilayer island 78B is now provided with a proper surface bilayer so that the second 3C-SiC bilayer island 78B will grow free of crystal defects on top of 78A without creating any stacking faults. It is important to note that the rate of 2D island nucleation on the step-free substrate surface 66 (NR1) is not necessarily equal to the rate of 2D island nucleation on the first heteroepitaxial bilayer surface 78A (NR2), because the two surfaces are made up of different polytypes. If the 2D nucleation rate on the heteroepitaxial surface 78A were significantly larger than on the substrate surface 66 (i.e., NR2 significantly larger than NR1), growth would be likely to proceed in the manner depicted in FIG. 27, as well as the manner to be further described with reference to FIG. 28.

Figure 28A:
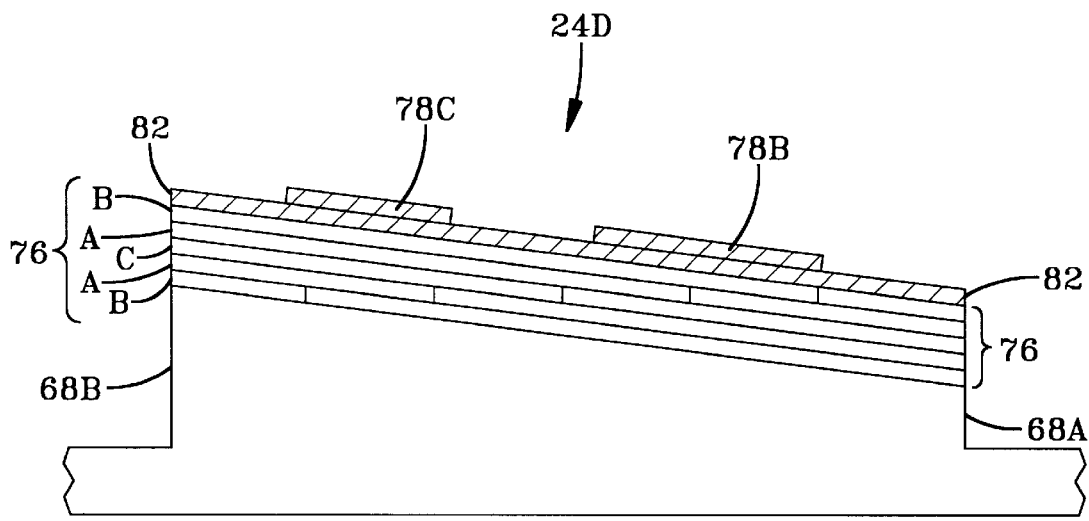
FIG. 28 is composed of FIGS. 28(A) and 28(B) that illustrate the nucleation and growth of two 3C-SiC second bilayer islands on top of a completed growth of the first bilayer that could result in crystal defect formation.
Figure 28B:
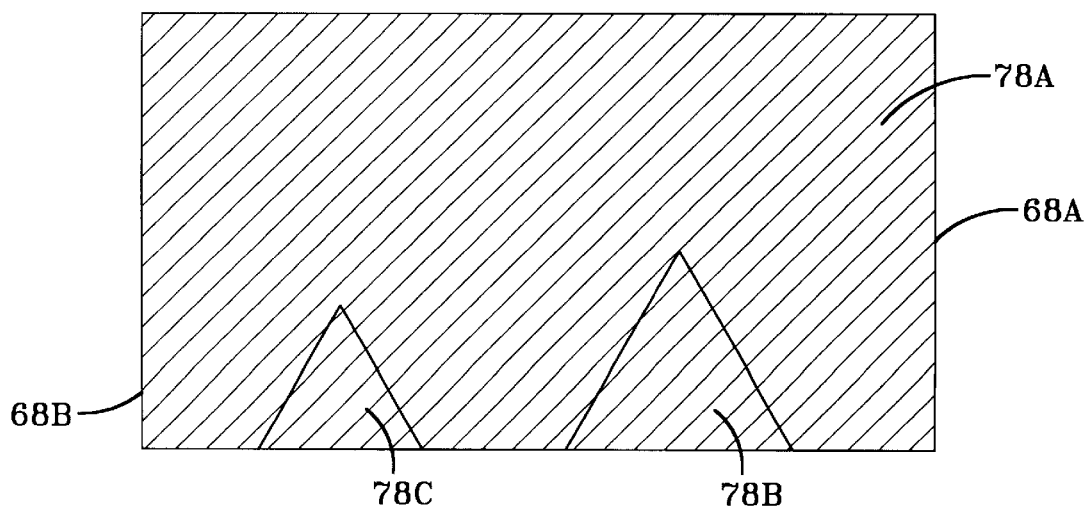
Figure 29A:
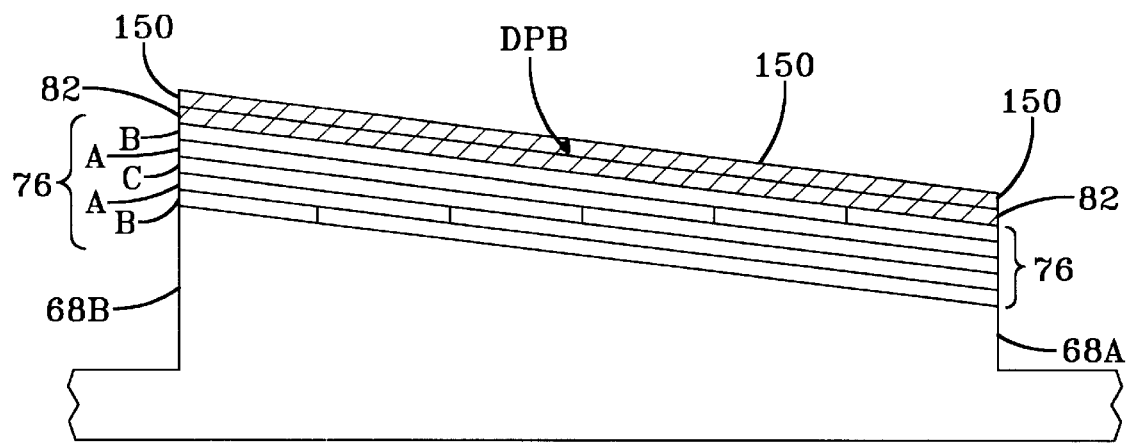
FIG. 29 is composed of FIGS. 29(A) and 29(B) that illustrate the incoherent coalescence of two bilayer islands that nucleated on the first heteroepitaxial bilayer; the result is a double-positioning boundary (DPB).
Figure 29B:
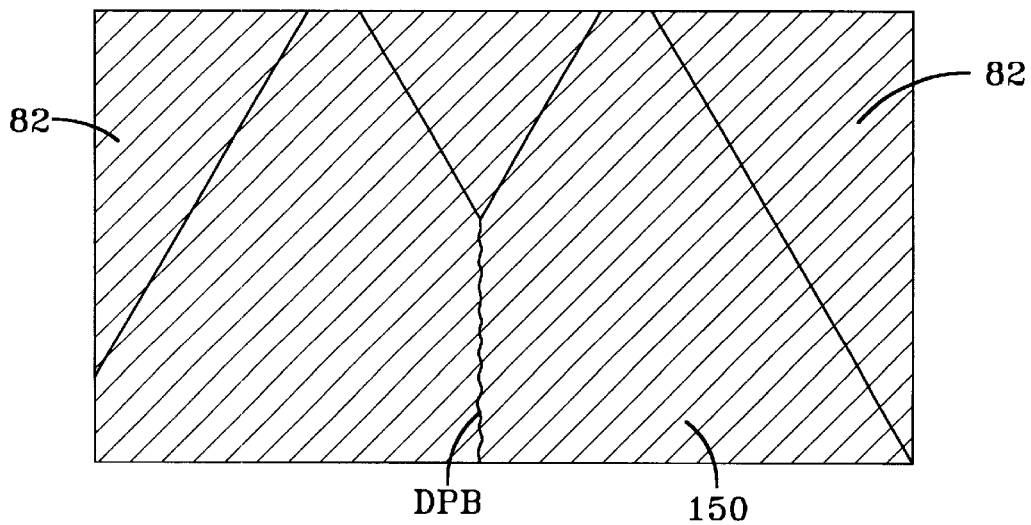

As described with respect to FIG. 20A, crystal defects can occur if more than one bilayer island forms by 2D nucleation on the first bilayer 82. As seen in FIG. 28A, two bilayers 78B and 78C have nucleated on top of the first heteroepitaxial bilayer 82. Assume, as previously described with respect to FIG. 20A, that the crystal orientation of these two bilayers is different (e.g., rotated 180° with respect to each other). The continued growth of the bilayer islands 78B and 78C may be described with reference to FIG. 29 which is composed of FIGS. 29(A) and 29(B). FIGS. 29(A) and 29(B) show that a double position boundary (DPB) forms where the islands coalesce to form bilayer 150. All subsequent bilayers will contain the vertical extension of the DPB.

It should now be appreciated that the condition of single-island nucleation and growth is only required for the first and second bilayers of the heteroepitaxial film grown on a step-free surface. After the first and second heteroepitaxial bilayers are successfully established, to the limits of the step-free surface boundary, the remaining bilayers of the heteroepitaxial layer can be grown at nucleation rates that permit multiple nucleation islands.

All descriptions of the preferred embodiments so far have only described the growth of 3C-SiC films on 4H or 6H-SiC substrates. Another important application of the invention is the growth of low-defect single-crystal films of AlN, GaN, and other III-N compounds. These are important optoelectronic and high temperature and high frequency electronic materials. In fact, research on these nitrides has expanded dramatically over the last several years because of their potential use in the fabrication of short-wavelength diode lasers and high frequency microwave power applications.

The invention can be readily applied to the growth of AlN and/or GaN on SiC substrates because these nitrides have the necessary tetrahedral bonding and bilayer growth properties. The process of the present invention can be modified for nitride growth in the following manner. The substrate can be 6H-SiC, and can be processed as was described for the growth of 3C-SiC. All process procedures up through the growth of atomically-flat 6H-SiC epilayers would be carried out. Then, the procedures that are known to those skilled in the art of nitride growth could be applied to the specially prepared 6H-SiC substrate with atomically flat regions. The advantage of the single bilayer island growth on the atomically flat growth surfaces provided by the practice of the present invention is that the nitride that nucleates and grows in bilayers and will have the same orientation and will be free of defects arising from incoherent lateral coalescence. There are various combinations of growth procedures that can be used. For example, AlN, GaN, or AlGaN could be grown directly on the atomically flat 6H-SiC mesas, or AlN could be used as a buffer layer between a GaN epilayer and the 6H-SiC substrate. In either use, the defect density in the nitride epilayers should be significantly lower than obtainable in epilayers grown by prior processes on commercially available SiC or sapphire substrates.

Figure 30:
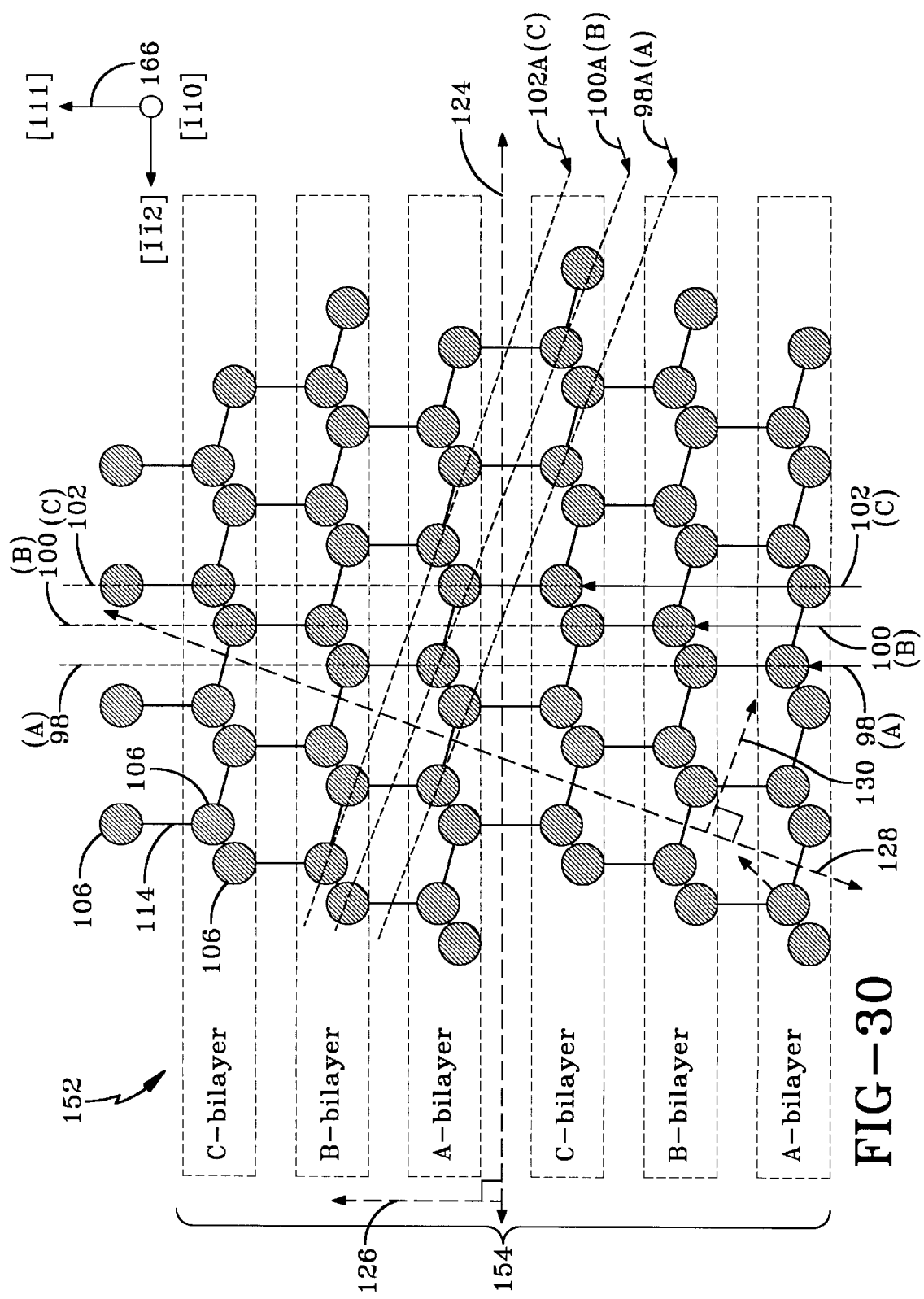
FIG. 30 illustrates a silicon crystal structure having many similar structural features of the 3C-SiC structure of FIG. 15(A), including stacking of tightly bonded bilayers and tetrahedral bonding structure of nearest-neighbor atoms.

The principles of the present invention previously described with reference to a SiC substrate with hexagonal crystal structure with reference to FIGS. 1–29, is equally applicable to a silicon substrate with cubic crystal structure 152 shown in FIG. 30. It is well known to those skilled in the art that single crystal silicon exists in only one crystal structure, namely, the cubic (face centered) structure. Thus, it does not exhibit polytypism. FIG. 30 illustrates the cubic stacking arrangement 154 of silicon, which is quite similar to the stacking arrangement for 3C-SiC of FIG. 15(A). The silicon crystal structure 152 of FIG. 30 is quite similar to FIG. 15A, with the exception that FIG. 30 replaces all carbon atoms 108 in FIG. 15(A) with silicon atoms 106.

The principles of the present invention are equally applicable to heteroepitaxial layer with a hexagonal crystal structure, such as, a 2H-AlN structure 156 shown in FIG. 31. As seen in FIG. 31, the AlN structure 156 has bilayer stacking sequence 158 similar to that of 92 for 4H-SiC of FIG. 14. There are only two essential differences between the AlN structure 156 of FIG. 31 and the 4H-SiC structure 92 of FIG. 14. The first difference is that the AlN structure 156 has Al atoms 160 and N atoms 162 as shown in FIG. 31 instead of silicon 106 and carbon 108 atoms. The second difference is that the stacking sequence repeats every two bilayers in 2H-AlN for FIG. 31 instead of every four (4) bilayers as in FIG. 14 for 4H-SiC.

With regard to the two materials, such as the 2H-AlN layer 156 and the silicon bilayer 154, the mating therebetween needs to take into account the unstressed condition of these layers 156 and 154 which may be further described with reference to FIG. 32.

Figure 32:
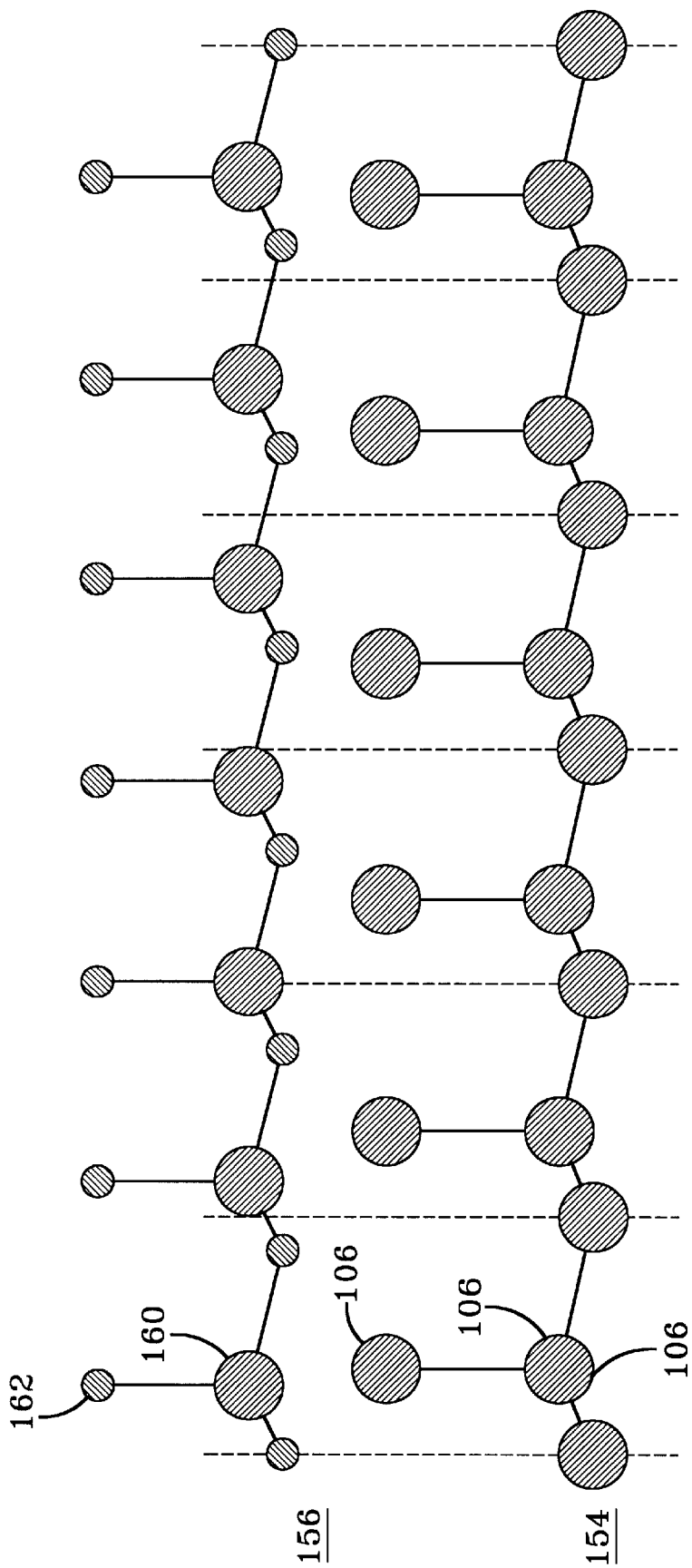
FIG. 32 illustrates the different lateral atomic spacing of bilayers of two materials, 2H-AlN and silicon, in their natural unstressed state.

FIG. 32 illustrates that different lateral lattice spacing along the basal plane of bilayers of the two materials (silicon 154 and AlN 156) in the natural unstressed state, which means that the atoms do not line up laterally when vertically joined across a basal plane in heteroepitaxy. For such an illustration, the 2H-AlN bilayer 154 has smaller atomic spacing than a silicon bilayer 158.

Figure 33:
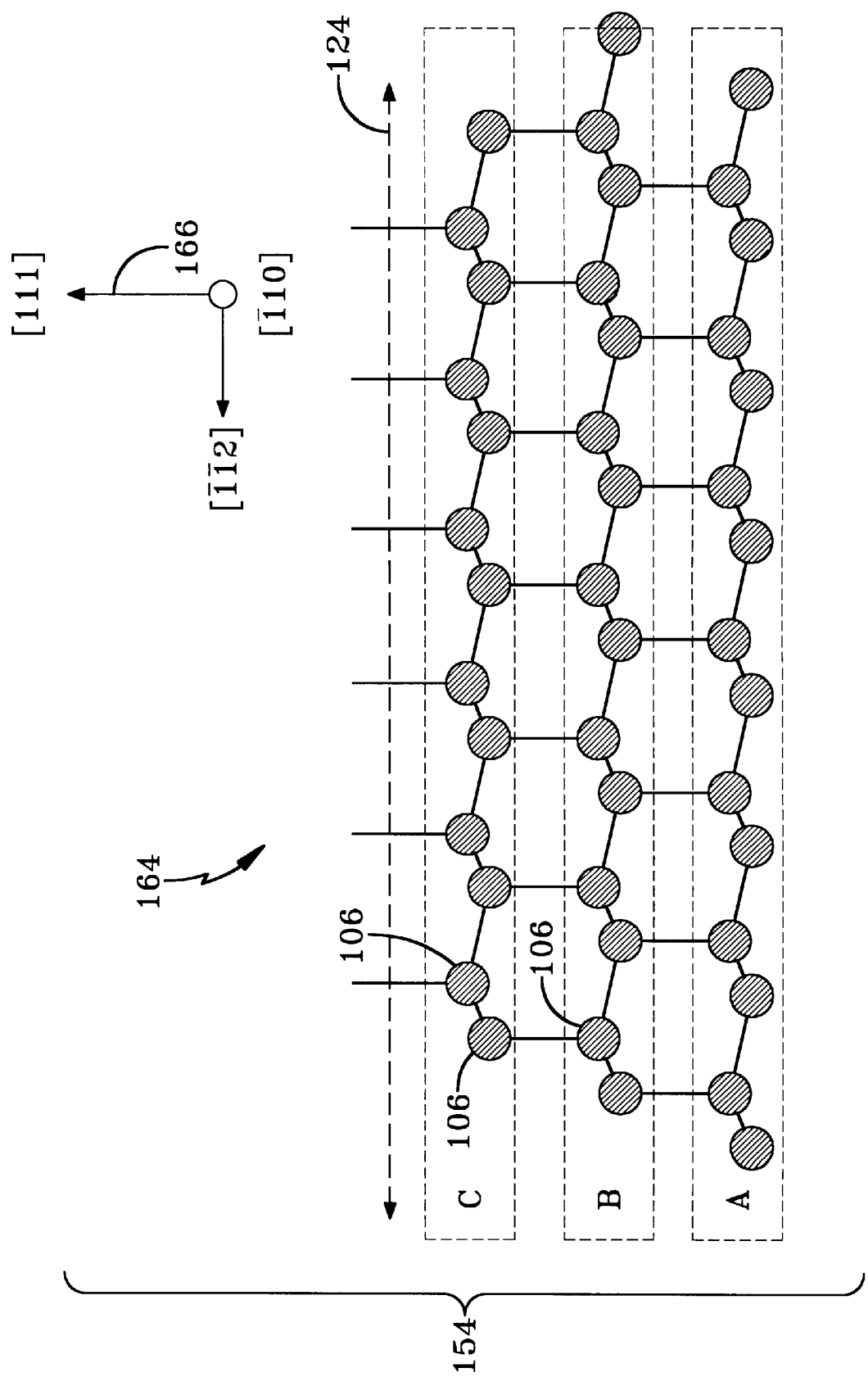
FIG. 33 illustrates an atomically flat basal plane silicon substrate surface prior to growth.

The principles of the present invention account for the atomically-flat basal plane silicon substrate surface 164 prior to growth which is shown in FIG. 33. A process for obtaining atomically-flat basal plane silicon surface is disclosed in U.S. Pat. No. 6,165,874. FIG. 33 has many of the features shown in FIG. 17A except that the substrate 164 is silicon which is an elementary semiconductor with a cubic crystal structure having the Miller diagram 166 as shown in FIG. 33.

Figure 34:
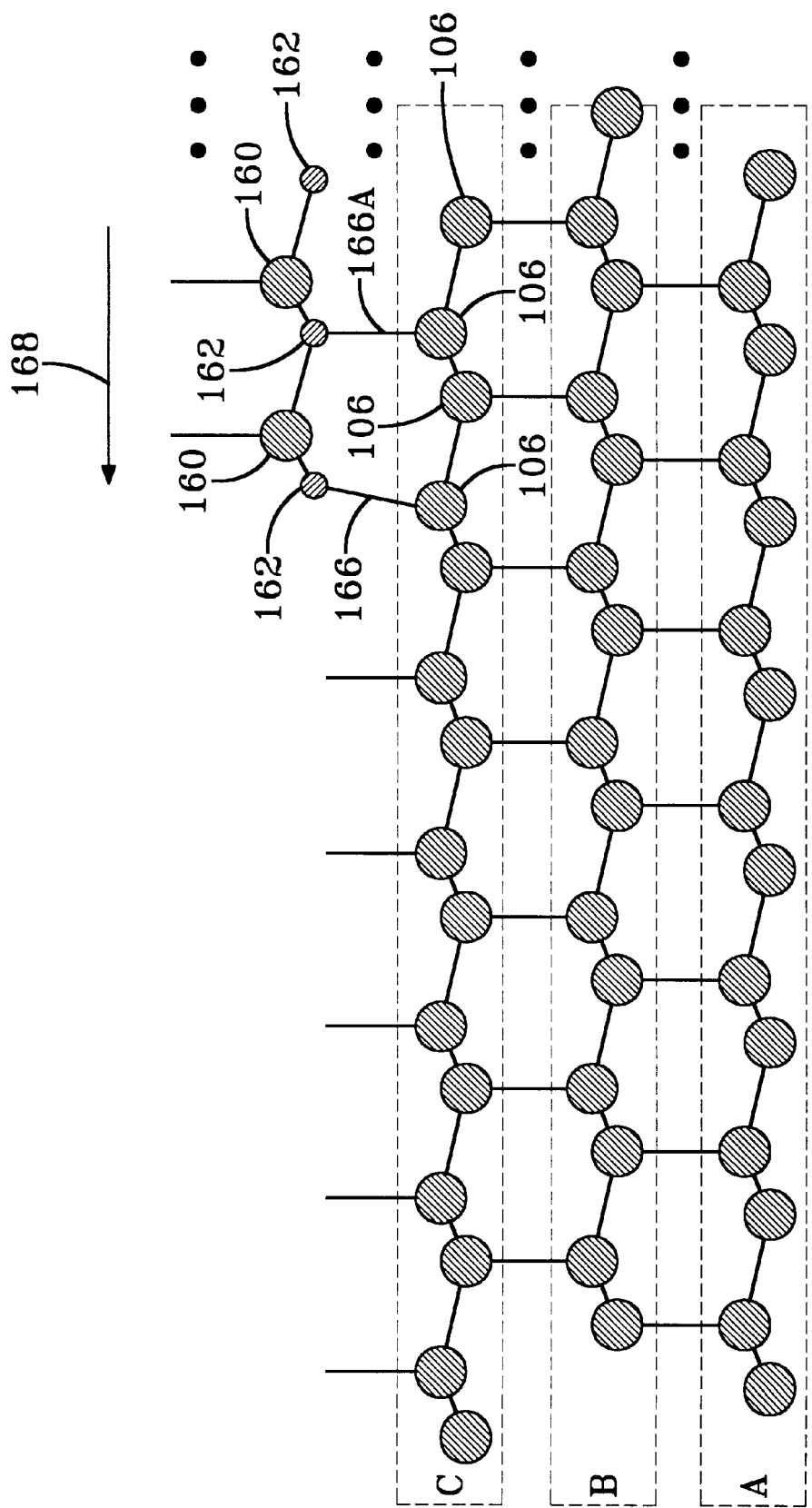
FIG. 34 illustrates leftward lateral step-flow expansion of an AlN anchored bilayer having many of the salient features of FIG. 18, with the exception that the substrate is silicon (cubic) and the heteroepitaxial layer is AlN (hexagonal).

The present invention should account for the handling of a substrate that is silicon having a cubic configuration and a heteroepitaxy layer is AlN with a hexagonal configuration, which is shown in FIG. 34. FIG. 34 is quite similar to that of FIG. 18, with the exception that the substrate is comprised of silicon and the heteroepitaxial layer is comprised of AlN. As a consequence, the lateral lattice spacing of the heterolayer material in FIG. 34 is smaller than that of the substrate. This contrasts to the case illustrated in FIG. 18, wherein the heteroepilayer had a larger lattice spacing than the substrate. Also, the substrate is cubic and the heteroepitaxial layer is hexagonal in FIGS. 34–35, whereas in FIGS. 18–20 the substrate was hexagonal and the heteroepitaxial layer was cubic. Also, the substrate and heteroepitaxial materials in FIGS. 34–35 do not contain any common chemical elements, whereas, the substrates and heteroepitaxial layer in FIGS. 18–20 were both comprised of Si and C chemical elements.

Figure 35:
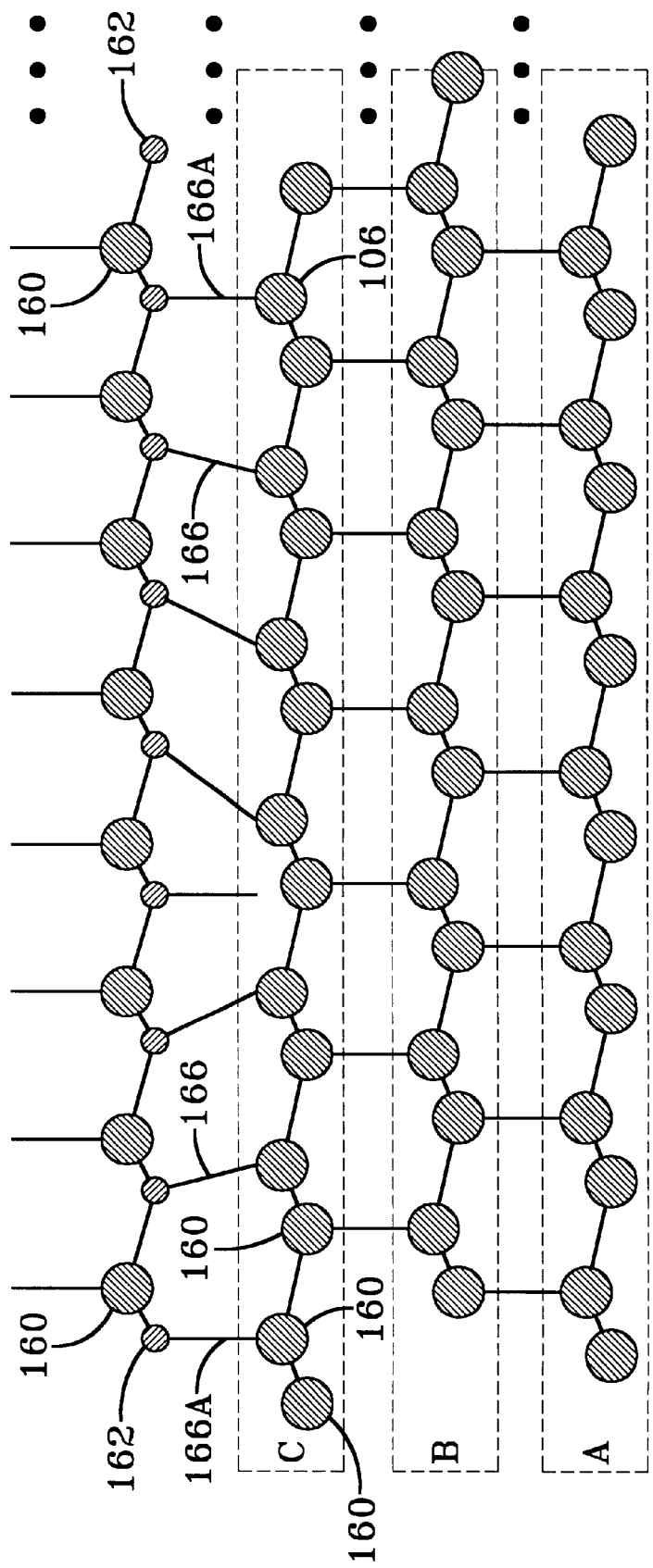
FIG. 35 is a continuation of the bonding of the film of FIG. 34, wherein the lattice mismatch stress is relieved along the basal plane, with the illustration of FIG. 35 having many of the features of FIG. 20, but with the exception that the dangling bond is from a heteroepilayer instead of from the substrate.

The practice of the present invention allows the lattice mismatch stress relief of the basal plane, which is shown in FIG. 35. FIG. 35 is similar to FIG. 22 with the exception that the dangling bond hangs off of the first heteroepitaxial bilayer instead of hanging off the last substrate bilayer as in FIG. 20.

The example of the growth of 2H-AlN on Si shown in FIG. 35 is also subject to the same considerations as the example of the growth of 3C-SiC on 6H-SiC described in reference to FIG. 20A. That is, the first and second bilayers each must be grown laterally from a single island nucleus.

For the example of 2H-AlN on Si, if the second bilayer is grown from two island nuclei on the first bilayer, it is possible for these two islands to have a different stacking sequence (e.g., ABAB . . . and ACAC . . . ) The reason for the two stacking sequences is the same as given in the discussion of FIG. 20A. The coalescence of two islands with different stacking sequences would lead to a planar defect in the heteroepitaxial 2H-AlN film. Hence, for optimum results for all combinations of films and substrate materials, the first and second bilayers each should be grown from a single island nucleus.

As is known in the art, it is common practice to insert additional heteroepitaxial layers that serve as buffer layers to reduce stress and defects between heteroepitaxial films. AlN and AlGaN are examples of buffer layers used for growth of GaN on SiC and sapphire. However, because this invention relieves the lattice mismatch stress at the interface, the need for stress-relief during growth layers may be eliminated by this invention. The silicon and AlN materials have the essential property that they exhibit tetrahedral bonding that enables much tighter bonding of atoms within bilayers because of bonding to three (3) nearest-neighbor atoms within a bilayer as opposed to the single bond to the fourth ($4^{th}$) neighbor atom in the adjacent bilayer across the basal plane. These materials also have the essential property that they grow in bilayers on basal plane surfaces. This invention can be practiced for any two materials exhibiting these essential properties, provided that growth conditions can be produced that enable single island nucleation and lateral growth of the single islands to form the first two heteroepitaxial bilayers.

An advantage of epilayers grown with this invention is that the heteroepitaxial layers grown have fewer defects because defects due to atomic steps on the substrate and coalescence of multiple nucleation islands of the first and second bilayers are eliminated. More particularly, the invention enables the growth of low defect heteroepitaxial single crystal films on atomically-flat single crystal surfaces.

The invention has been described with reference to preferred embodiments and alternates thereof. It is believed that many modifications and alterations to the embodiments as discussed herein will readily suggest themselves to those skilled in the art upon reading and understanding the detailed description of the invention. It is intended to include all such modifications and alterations insofar as they come within the scope of the present invention.

What we claim is:

1. A method of depositing a heteroepitaxial single-crystal film on a plurality of step-free surfaces of a basal plane surface orientation of a selected single-crystal substrate material serving as a wafer, said method comprising the steps of:

(a) preparing more than one step-free planar surface on the selected substrate, wherein each of said plurality of step-free surfaces has a boundary of selected size and shape;

(b) selecting a heteroepitaxial film material whose chemical bonding structure is tetrahedral and exhibits a property that under predetermined growth conditions that growth of said heteroepitaxial film material grows in bilayers on said selected step-free planar surface;

(c) carrying out a selected deposition process under selected growth conditions that produce (1) a single nucleus of said heteroepitaxial film material at least one bilayer thick on said step-free surface with said selected boundary, followed by (2) lateral expansion of said single nucleus over entire surface defined by said selected boundary of said plurality of step-free basal plane surfaces before a second nucleus can form elsewhere on the said selected step-free planar surface, and (3) a single nucleus of the second bilayer of heteroepitaxial film material on top of the said first bilayer of heteroepitaxial film followed by (4) lateral expansion of the single nucleus over the entire surface defined by the selected boundary of the step-free basal plane surface before a second nucleus can form elsewhere on the first bilayer of heteroepitaxial film on the selected step-free planar surface; and (d) providing growth of subsequent additional bilayers of the said heteroepitaxial film by providing a suitable set of growth conditions until a desired thickness of said heteroepitaxial film is achieved.

2. The method according to claim 1, wherein the said selected deposition process of step (c) comprises carrying out deposition under selected growth conditions over a selected period of time to produce an average rate of nucleation (NR1) and an average velocity of lateral island expansion (VLE1) for the growth of the first heteroepitaxial bilayer and an average rate of nucleation (NR2) and an average velocity of lateral expansion (VLE2) for the growth of the second heteroepitaxial bilayer, wherein:

(a) said growth conditions and said step-free planar surface size and shape are selected such that said average velocity of lateral island expansion (VLE1) divided by the said average rate of nucleation (NR1) for the first bilayer and said average velocity of lateral island expansion (VLE2) divided by the said average rate of nucleation (NR2) for the second bilayer are both less than the product of a planar area (A) of the said step-free planar surface multiplied by the longest planar accumulated length dimension $L_A$) of the said selected step-free planar surface; and (b) said selected period of time is greater than the sum of the following:

(i) the mathematical inverse of the product of the planar area (A) of said selected step-free planar surface multiplied by said average rate of nucleation (NR1) with the result thereof being termed T2D1;

(ii) the quotient of the said longest planar accumulated length dimension $L_A$) of the said selected step-free planar surface divided by said average velocity of lateral island expansion (VLE1) with the result thereof being termed TC1;

(iii) the mathematical inverse of the product of the planar area (A) of said selected step-free planar surface multiplied by said average rate of nucleation (NR2) with the result thereof being termed T2D2; and (iv) the quotient of the said longest planar accumulated length dimension $L_A$) of the said selected step-free planar surface divided by said average velocity of lateral island expansion (VLE2) with the result thereof being termed TC2.

3. The method according to claim 2, wherein said growth conditions comprise a set of growth parameters comprising at least substrate temperature, reactor pressure used for said deposition, concentration of reactor precursors for material being deposited, composition of carrier gas used within said reactor, and flow rate of carrier gas within said reactor.

4. The method according to claim 3, wherein the said selected deposition process is chemical vapor deposition (CVD).

5. The method according to claim 2, wherein said selected substrate material is hexagonal-SiC and said heteroepitaxial film material is 3C-SiC.

6. The method according to claim 2, wherein a surfactant is used in said selected deposition process of step c) to reduce said produced average rate of nucleation of the said heteroepitaxial film on the said step-free surfaces.

7. The method according to claim 1, wherein step (c) comprises multiple selected growth conditions carried out in a sequential manner.

8. The method according to claim 7, wherein said plurality of step-free surfaces on the selected substrate comprise at least two different planar areas defined by said boundary selections.

9. The method according to claim 8, wherein said selected growth conditions are selected so as to sequentially increase the average nucleation rate of each said growth condition carried out in said sequential manner.

10. The method according to claim 9, wherein said sequential increases of said average nucleation rate is accomplished in a staircase manner.

11. The method according to claim 9, wherein said sequential increase of said average nucleation rate is accomplished in a ramp manner.

12. The method according to claim 7, wherein said multiple selected growth conditions are selected so as to sequentially increase the average nucleation rate of each said growth condition carried out in said sequential manner.

13. The method according to claim 12, wherein said sequential increases of said average nucleation rate is accomplished in a staircase manner.

14. The method according to claim 12, wherein said sequential increase of said average nucleation rate is accomplished in a ramp manner.

15. The method according to claim 14, wherein the said selected substrate material is hexagonal SiC, said selected heteroepitaxial film material is 3C-SiC, said selected deposition process is chemical vapor deposition having precursor gases of silane and propane and having a growth temperature of said selected deposition process being decreased in a ramp manner from a value of approximately 1600° C. to a value of approximately 1500° C. over a time period of approximately one (1) hour.

16. The method according to claim 15, wherein the said selected boundary shapes are rectangular with areas that range between $1 \times 10^{-4} cm^2$ and $1 \times 10^{-2} cm^2$.

17. The method according to claim 12, wherein said selected substrate material is hexagonal-SiC and said heteroepitaxial film material is 3C-SiC.

18. The method according to claim 12, wherein said multiple growth conditions have an initial growth temperature for an initial selected growth condition and said initial growth temperature is reduced during said sequence until a final growth temperature is reached corresponding to a final selected growth condition.

19. The method according to claim 7, wherein the said selected deposition process is molecular beam epitaxy (MBE).

20. The method according to claim 1, wherein said single-crystal substrate material has a hexagonal crystal structure and is selected from the group consisting of 6H-SiC and 4H-SiC.

21. The method according to claim 20, wherein said heteroepitaxial single-crystal film has a hexagonal crystal structure and is selected of a material different from the substrate and said different material is selected from the group consisting of 2H-SiC; 2H-GaN; 2H-AlN; 2H-AlGaN; and 2H-InGaN.

22. The method according to claim 20, wherein said heteroepitaxial single-crystal film has a cubic crystal structure and is selected of a material different from the substrate material and is further selected from the group consisting of silicon, germanium, SiGe, diamond, 3C-SiC, GaAs, AlAs, AlGaAs, InAs, InP, InGaAs, InP, InGaAsP, cubic-GaN, cubic-AlN, cubic-AlGaN, cubic-InGaN.

23. The method according to claim 22, wherein said selected substrate material is hexagonal-SiC and said heteroepitaxial film material is 3C-SiC.

24. The method according to claim 23, wherein said multiple growth conditions have an initial growth temperature for an initial selected growth condition and said initial growth temperature is reduced during said sequence until a final growth temperature is reached corresponding to a final selected growth condition.

25. The method according to claim 20, wherein said selected deposition process is carried out using precursor gases that are silane and a hydrocarbon for the growth silicon carbide.

26. The method according to claim 25, wherein said single-crystal substrate material is hexagonal SiC and said selected heteroepitaxial film material is 3C-SiC.

27. The method according to claim 26, wherein the growth temperature is in the range 1300° C. to 2000° C.

28. The method according to claim 1, wherein said single-crystal substrate material has a rhombohedral crystal structure and is 15R-SiC.

29. The method according to claim 28, wherein said heteroepitaxial single-crystal film has a hexagonal crystal structure and is selected of a material different from the substrate material and said[]different material is selected from the group consisting of 2H-SiC; 2H-GaN; 2HJ-AlN; 2Hl-AlGaN; and 2H-InGaN.

30. The method according to claim 28, wherein said heteroepitaxial single-crystal film has a cubic crystal structure and is selected of a material different from the substrate material and is further selected from the group consisting of silicon, germanium, SiGe, diamond, 3C-SiC, GaAs, AlAs, AlGaAs, InAs, InP, InGaAs, InP, InGaAsP, cubic-GaN, cubic-AlN, cubic-AlGaN, cubic-InGaN.

31. The method according to claim 1, wherein said single-crystal substrate material has a cubic crystal structure and is selected from the group consisting of silicon, germanium, SiGe, GaAs, and GaP.

32. The method according to claim 31, wherein said heteroepitaxial single-crystal film has a hexagonal crystal structure and is selected of a material different from the substrate material and said different material is selected from the group consisting of 2H-SiC; 2H-GaN; 2H-AlN; 2H-AlGaN; and 2H-InGaN.

33. The method according to claim 31, wherein said heteroepitaxial single-crystal film has a cubic crystal structure and is selected of a material different from the substrate material and is further selected from the group consisting of silicon, germanium, SiGe, diamond, 3C-SiC, GaAs, AlAs, AlGaAs, InAs, InP, InGaAs, InP, InGaAsP, cubic-GaN, cubic-AlN, cubic-AlGaN, cubic-InGaN.

34. The method according to claim 1, wherein said selected substrate material is hexagonal-SiC and said heteroepitaxial film material is 3C-SiC.

35. The method according to claim 1, wherein selected deposition process is selected from the group consisting of chemical vapor deposition (CVD), physical vapor phase epitaxy, sublimation processes, and molecular beam epitaxy (MBE) processes.

36. The method according to claim 1, wherein said single-crystal substrate material is hexagonal SiC and said heteroepitaxial film material is diamond.

37. The method according to claim 36, wherein said single-crystal substrate material is 4H-SiC.

38. The method according to claim 1, wherein said single-crystal substrate material is hexagonal SiC and said heteroepitaxial film material is a III-N alloy.

39. The method according to claim 38, wherein said heteroepitaxial film material is a cubic III-N alloy.

40. The method according to claim 38, wherein said heteroepitaxial film material is a hexagonal III-N alloy.

41. The method according to claim 38, wherein said heteroepitaxial film material is GaN.

42. The method according to claim 38, wherein said heteroepitaxial film material is AlN.

43. The method according to claim 38, wherein said heteroepitaxial film material is AlGaN.

44. The method according to claim 38, wherein said heteroepitaxial film material is InGaN.

45. The method according to claim 1 wherein said single-crystal substrate material is silicon and said heteroepitaxial film material is 3C-SiC.

46. The method according to claim 1, wherein said single-crystal substrate material is SiC and said heteroepitaxial film material is silicon.

47. The method according to claim 1, wherein said single-crystal substrate material is silicon and said heteroepitaxial film material is GaN.

48. The method according to claim 1, wherein said single-crystal substrate material is silicon and said heteroepitaxial film material is AlN.

49. The method according to claim 1, wherein said single crystal substrate material is silicon and said heteroepitaxial film material is diamond.

50. The method according to claim 1, wherein said single-crystal substrate material is silicon and said heteroepitaxial film material is a silicon germanium alloy.

51. The method according to claim 1, wherein said single-crystal substrate material is silicon and said heteroepitaxial film material is a III-V alloy.

52. The method according to claim 51, wherein said single-crystal heteroepitaxial film material is GaAs.

* * * * *